United States Patent [19]
Wada et al.

[11] Patent Number: 6,016,560
[45] Date of Patent: Jan. 18, 2000

[54] SEMICONDUCTOR MEMORY, MEMORY DEVICE, AND MEMORY CARD

[75] Inventors: Masashi Wada, Kodaira; Takao Okuba, Ome; Takeshi Furuno, Yokohama, all of Japan

[73] Assignee: Hitachi, Ltd., Tokyo, Japan

[21] Appl. No.: 08/981,094

[22] PCT Filed: May 29, 1996

[86] PCT No.: PCT/JP96/01447

§ 371 Date: Mar. 17, 1998

§ 102(e) Date: Mar. 17, 1998

[87] PCT Pub. No.: WO97/00518

PCT Pub. Date: Jan. 3, 1997

[30] Foreign Application Priority Data

Jun. 14, 1995 [JP] Japan .................................. 7-171518

[51] Int. Cl.$^7$ .............................. G01R 31/28; G11C 7/00
[52] U.S. Cl. ........................................... 714/718; 365/195
[58] Field of Search .................................. 714/718, 710, 714/711; 365/195, 189.07, 189.01, 200, 201; 395/735

[56] References Cited

U.S. PATENT DOCUMENTS

| | | | |
|---|---|---|---|
| 5,097,445 | 3/1992 | Yamauchi | 365/195 |
| 5,787,043 | 7/1998 | Akioka et al. | 365/200 |
| 5,881,002 | 3/1999 | Hamakawa | 365/195 |

FOREIGN PATENT DOCUMENTS

| | | |
|---|---|---|
| 2-148499 | 6/1990 | Japan . |
| 4-313898 | 11/1992 | Japan . |
| 4-369750 | 12/1992 | Japan . |

*Primary Examiner*—Hoa T. Nguyen
*Attorney, Agent, or Firm*—Antonelli, Terry, Stout & Kraus, LLP

[57] ABSTRACT

A semiconductor memory (1), having a plurality of memory blocks (2 and 3) provided with a plurality of memory cells, a data input/output buffer (7), and first control means (11) for controlling the rewriting and reading of data for the memory cells is provided with first storage means (30) for designating defective memory blocks and detection means (32) for detecting an access to a defective memory block designated by the first storage means in accordance with an address signal. When the detection means detects an access to a defective memory, the first control means inhibits the data rewrite operation for an instruction for a data rewrite operation and inhibits the output of data from the input/output buffer for the data read operation. The inhibiting function makes it possible to provide a memory device having compatibility with a non-defective semiconductor memory only by combining semiconductor memories having irremediable defects without fixing the levels of specific address input terminals so as to keep the defective memory blocks non-selective.

11 Claims, 36 Drawing Sheets

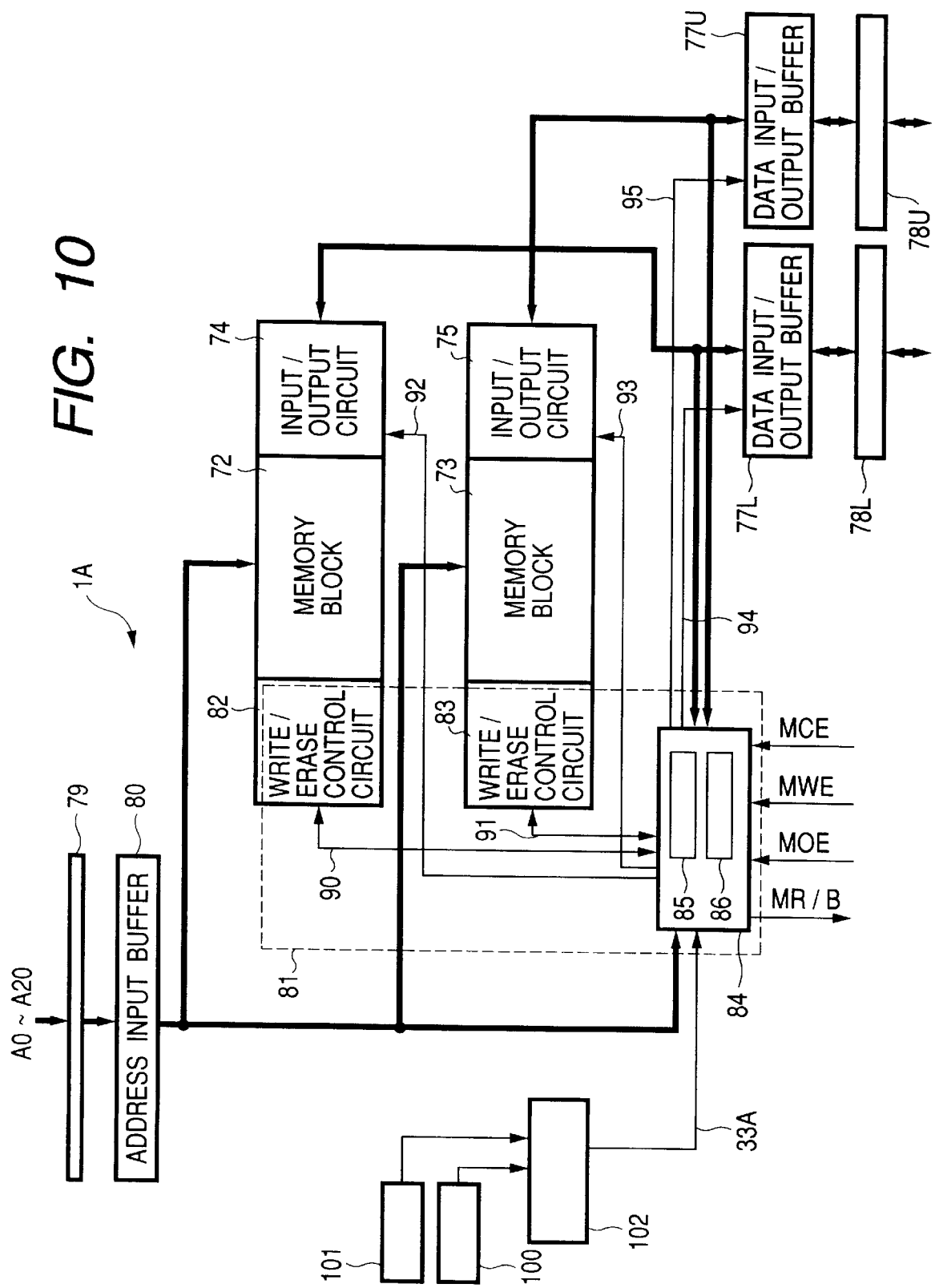

FIG. 13

WRITE

| MEMORY CELL | SELECTIVE / NON-SELECTIVE | SOURCE | DRAIN | GATE |
|---|---|---|---|---|
| Q1 | SELECTIVE | 0V | 6V | 12V |
| Q2 | NON-SELECTIVE | 0V | 0V | 12V |
| Q3 | NON-SELECTIVE | 0V | 6V | 0V |
| Q4 | NON-SELECTIVE | 0V | 0V | 0V |

ERASE (POSITIVE VOLTAGE SYSTEM)

| MEMORY CELL | SELECTIVE / NON-SELECTIVE | SOURCE | DRAIN | GATE |
|---|---|---|---|---|
| Q1, Q3 | SELECTIVE | 12V | 0V | 0V |
| Q2, Q4 | NON-SELECTIVE | 0V | 0V | 0V |

ERASE (NEGATIVE VOLTAGE SYSTEM)

| MEMORY CELL | SELECTIVE / NON-SELECTIVE | SOURCE | DRAIN | GATE |
|---|---|---|---|---|
| Q1, Q2 | SELECTIVE | 5V | 0V | -10V |
| Q3, Q4 | NON-SELECTIVE | 5V | 0V | 0V |

(OUTPUT BUFFER INHIBIT)

(ERASE INHIBIT)

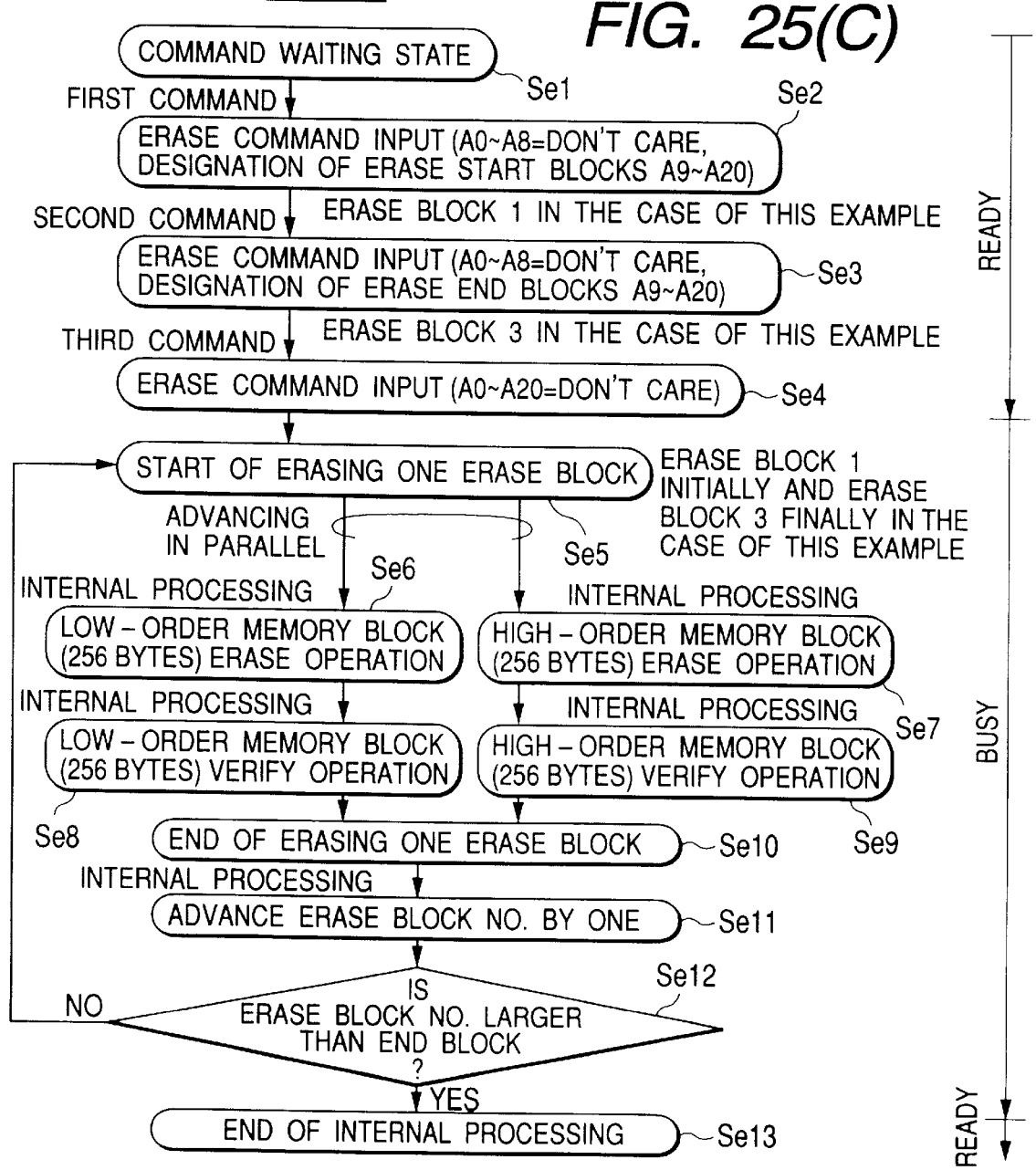
FIG. 25(A) COMPLETE COMPOSITE CONFORMING CIRCUIT ERASE OPERATION (CONTINUOUS BLOCK ERASING)
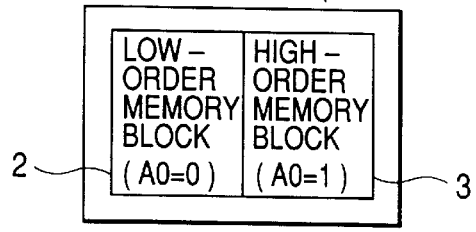
FIG. 25(B) ERASE BLOCK UNIT : 512 BYTES COMPLETE COMPOSITE CONFORMING CIRCUIT (CHIP IMAGE)

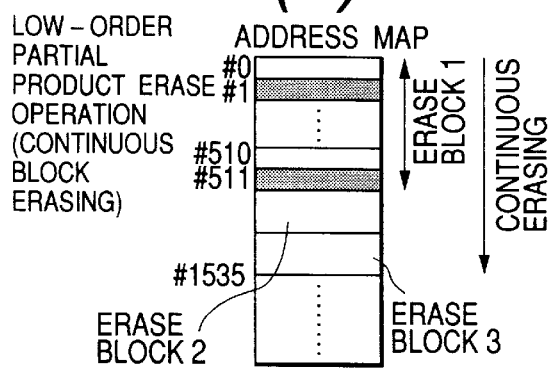
FIG. 26(A) LOW-ORDER PARTIAL PRODUCT ERASE OPERATION (CONTINUOUS BLOCK ERASING)
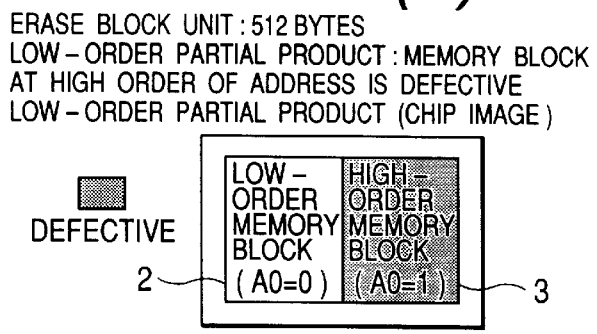
FIG. 26(B) ERASE BLOCK UNIT: 512 BYTES
LOW-ORDER PARTIAL PRODUCT: MEMORY BLOCK AT HIGH ORDER OF ADDRESS IS DEFECTIVE
LOW-ORDER PARTIAL PRODUCT (CHIP IMAGE)
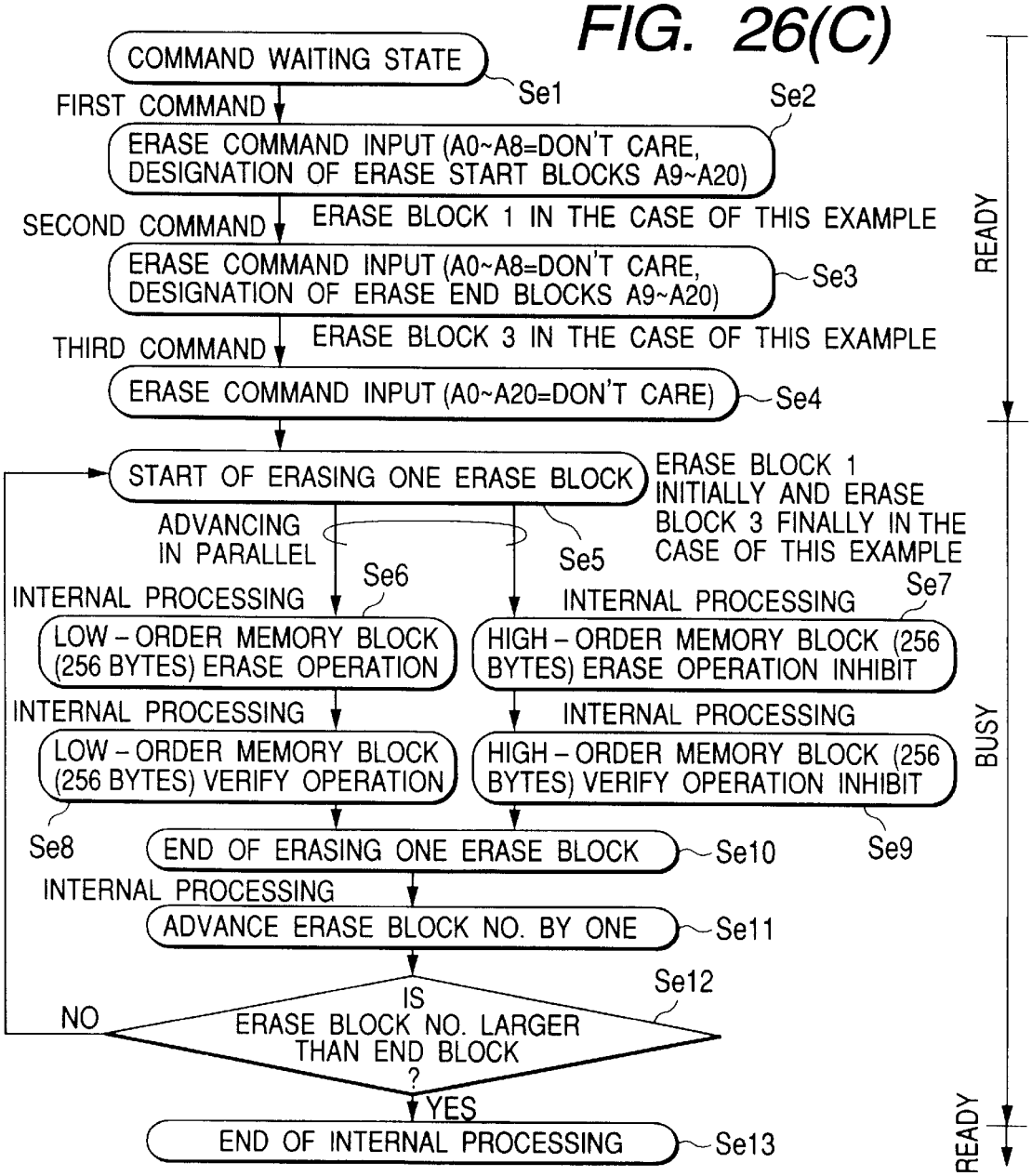
FIG. 26(C)

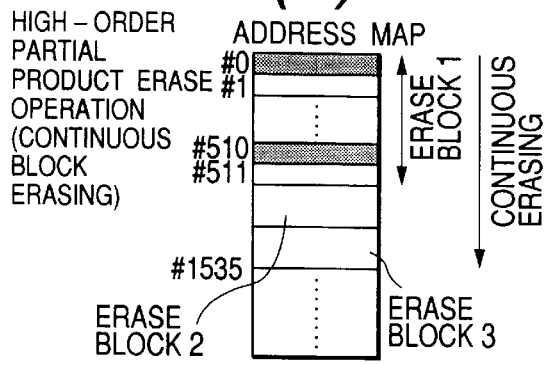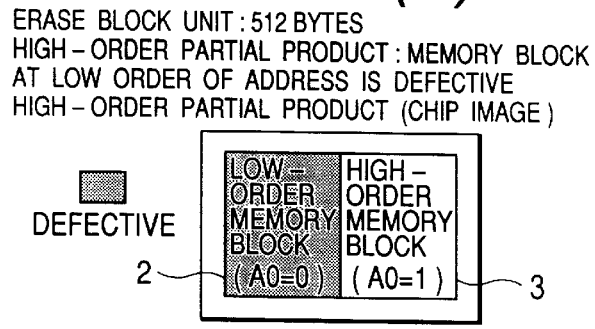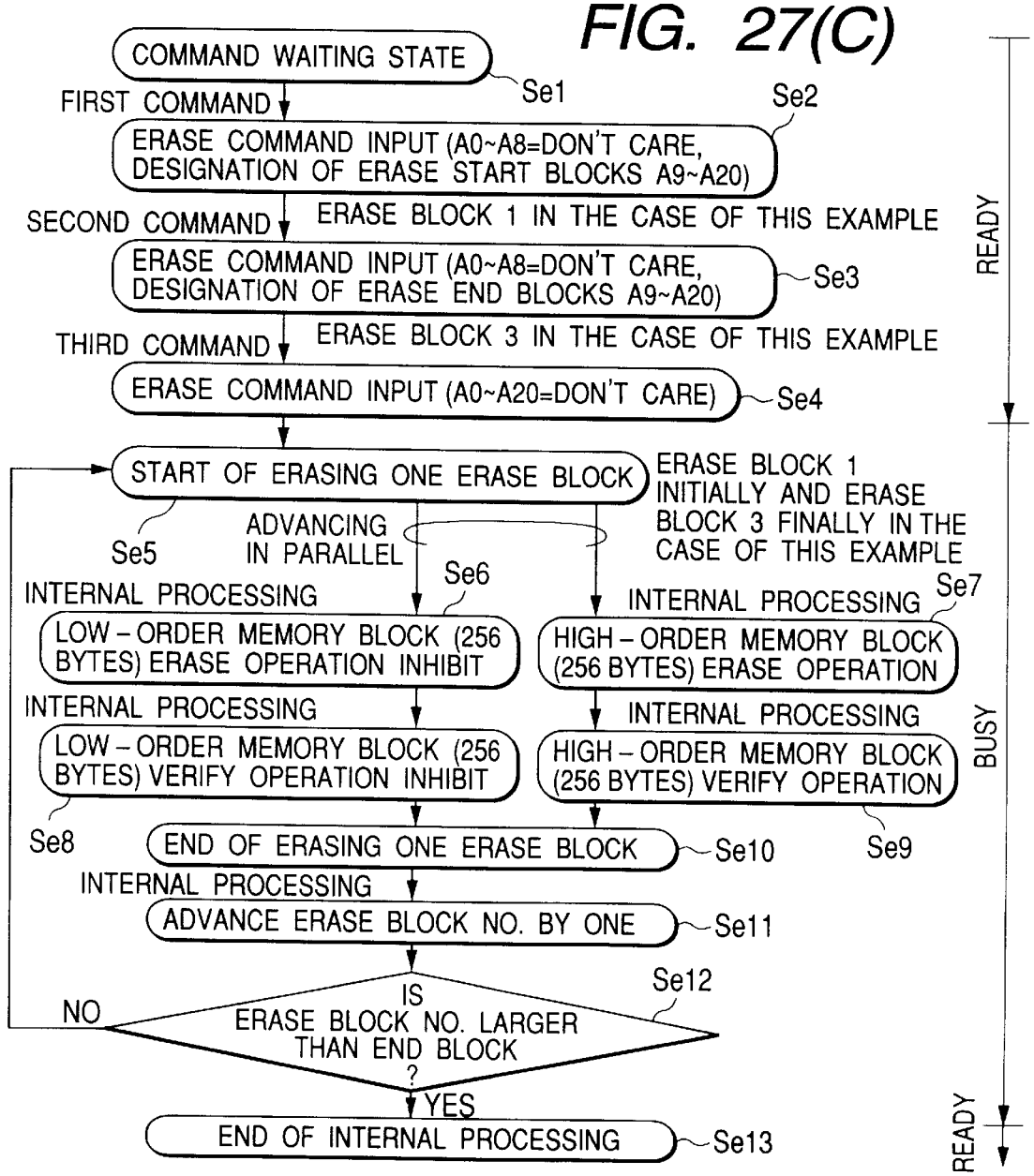

COMPLETE COMPOSITE CONFORMING CIRCUIT WRITE OPERATION FLOW

ADDRESS MAP

COMPLETE COMPOSITE CONFORMING CIRCUIT (CHIP IMAGE)

LOW-ORDER PARTIAL PRODUCT
WRITE OPERATION FLOW

ADDRESS MAP

LOW-ORDER PARTIAL PRODUCT: MEMORY BLOCK
AT HIGH ORDER OF ADDRESS IS DEFECTIVE
LOW-ORDER PARTIAL PRODUCT (CHIP IMAGE)

HIGH-ORDER PARTIAL PRODUCT WRITE OPERATION FLOW

HIGH-ORDER PARTIAL PRODUCT: MEMORY BLOCK AT LOW ORDER OF ADDRESS IS DEFECTIVE
HIGH-ORDER PARTIAL PRODUCT (CHIP IMAGE)

(OUTPUT BUFFER INHIBIT)

(ERASE VERIFY INHIBIT)

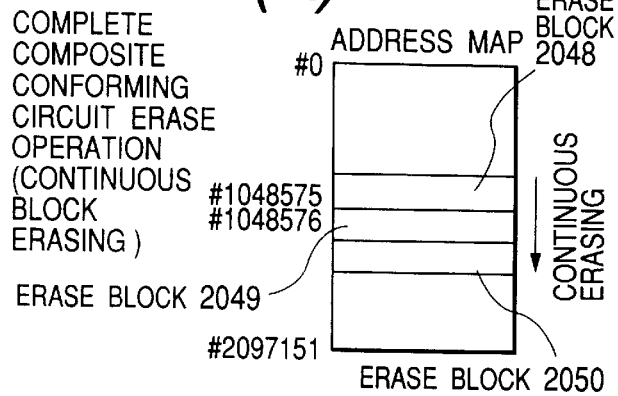
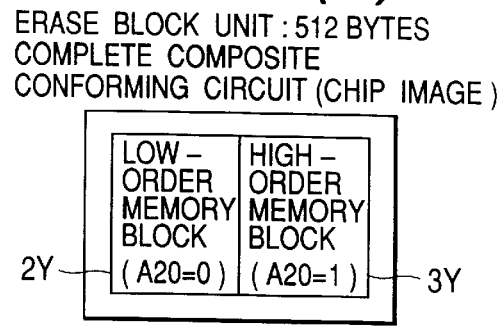
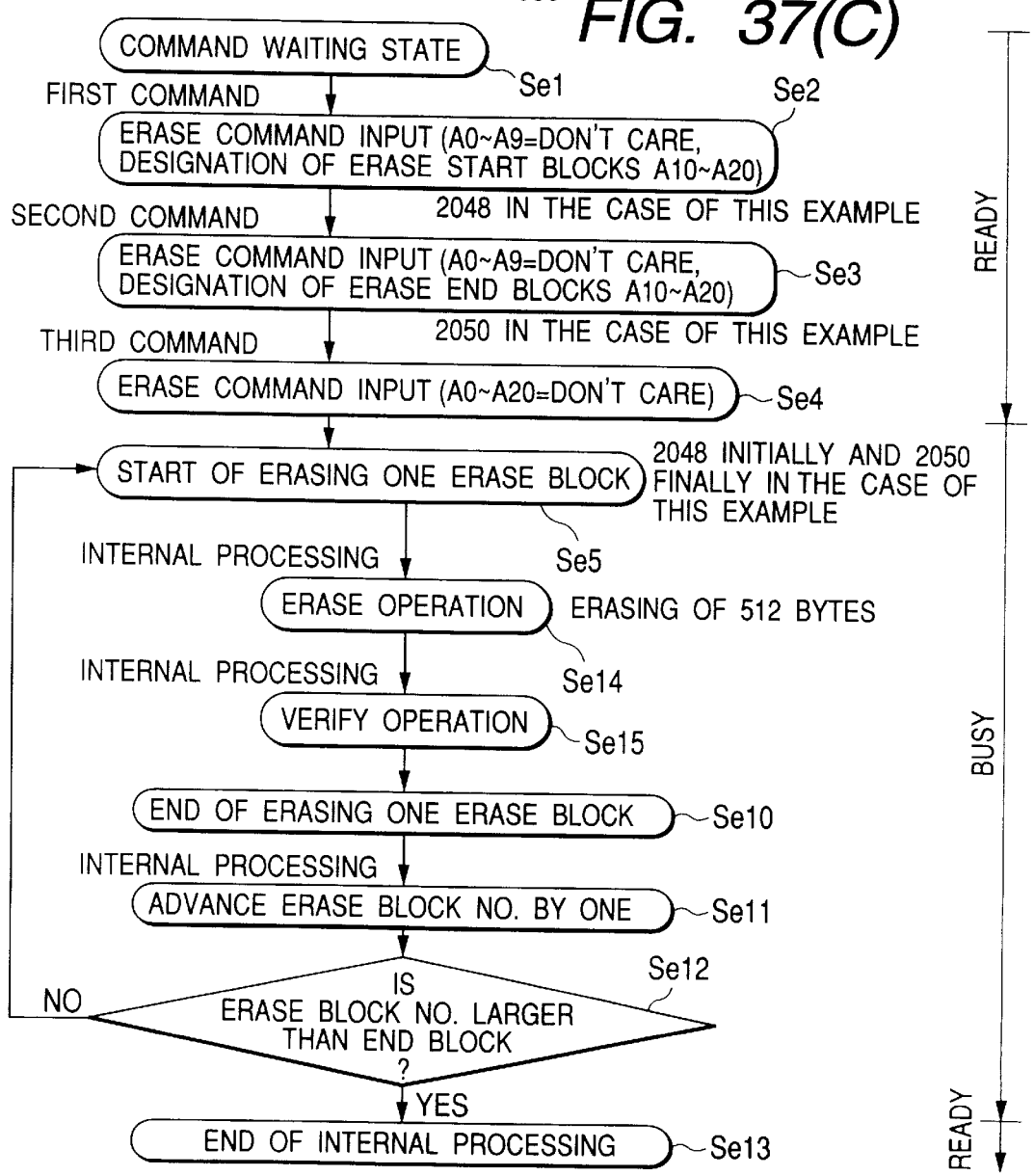

LOW-ORDER PARTIAL PRODUCT ERASE OPERATION (CONTINUOUS BLOCK ERASING)

ERASE BLOCK UNIT: 512 BYTES
LOW-ORDER PARTIAL PRODUCT: MEMORY BLOCK AT HIGH ORDER OF ADDRESS IS DEFECTIVE
LOW-ORDER PARTIAL PRODUCT (CHIP IMAGE)

FIG. 39(A) HIGH-ORDER PARTIAL PRODUCT ERASE OPERATION (CONTINUOUS BLOCK ERASING)

FIG. 39(B) ERASE BLOCK UNIT: 512 BYTES
HIGH-ORDER PARTIAL PRODUCT: MEMORY BLOCK AT LOW ORDER OF ADDRESS IS DEFECTIVE
HIGH-ORDER PARTIAL PRODUCT (CHIP IMAGE)

COMPLETE COMPOSITE CONFORMING CIRCUIT WRITE OPERATION

COMPLETE COMPOSITE CONFORMING CIRCUIT (CHIP IMAGE)

LOW-ORDER PARTIAL PRODUCT WRITE OPERATION

LOW-ORDER PARTIAL PRODUCT: MEMORY BLOCK AT HIGH ORDER OF ADDRESS IS DEFECTIVE
LOW-ORDER PARTIAL PRODUCT (CHIP IMAGE)

HIGH-ORDER PARTIAL PRODUCT WRITE OPERATION

ADDRESS MAP

HIGH-ORDER PARTIAL PRODUCT: MEMORY BLOCK AT HIGH ORDER OF ADDRESS IS DEFECTIVE
HIGH-ORDER PARTIAL PRODUCT (CHIP IMAGE)

SEMICONDUCTOR MEMORY, MEMORY DEVICE, AND MEMORY CARD

BACKGROUND OF THE INVENTION

1. Technical Field to which the Invention Belongs

The present invention relates to an art making it possible to achieve complete compatibility with a non-defective semiconductor memory by combining semiconductor memories having irremediable local defects, particularly to an art for constituting a memory device or a memory card by combining a plurality of flash memories having irremediable defects which can be apparently ignored.

2. Technical Background of the Invention

When some of the memory cells in a semiconductor memory are defective, it is possible to repair the semiconductor memory by replacing the defective memory cells with redundant memory cells. However, when a malfunctioning portion of a semiconductor memory exceeds a remediable range, the semiconductor memory is regarded as defective. A semiconductor memory having no malfunctioning portion or whose malfunctioning portion is in a remediable range is referred to as a complete composite conforming circuit. The defective product can be used as an operable product by removing defective portions from the memory and decreasing the entire memory capacity of the memory to ½ or ¼. This locally operable product is a partial product. Partial products can be used by mutually combining partial products in which the operable portion of one partial product compensates the inoperable portion of the other product. For example, in the case of a low-order partial product, in which the high-order half of the memory area is defective, and a high-order partial product, in which the low-order half of the memory area is defective, it is possible to use these partial products in combination by fixing the address input terminal of an address bit provided to select the high order or low order portion of the memory area to the selection level of a low-order side memory area at the outside, in the case of the low-order partial product, and fixing the address input terminal of an address bit provided to select the high order or low order portion of the memory area at the outside in the case of a high-order partial product.

When the data input/output terminals of the high-order partial product and low-order partial product are connected to each other in common at the outside to use the partial products instead of a non-defective product, chip selection must be performed for each partial product by using different chip selection signals. Therefore, to use a partial product for a semiconductor memory in a memory card, it is necessary to increase the number of chip selection signals compared to the case where a non-defective product is used, and moreover, it is necessary to use a decoder having different logic for chip selection when using a partial product in comparison to that a non-defective product.

Moreover, each defective portion of a plurality of partial products may have a difference depending on -the fabrication process. When combining a plurality of partial products in which defective-portion tail address regions are complementary instead of using a non-defective product, if the partial products having different defective portions are biased in quantity, a larger portion of the partial products are left unused.

Furthermore, in the case of a nonvolatile semiconductor memory, such as a flash memory, rewriting of information is performed by bringing the memory cells into an erasing state and then data write is performed. Also, a verify operation is necessary for the erase and write operations. In the case of a semiconductor memory, such as a flash memory, erase, erase verify, write, and write verify operations are controlled inside the memory so that data can be written even on the system (on-board state). The state in which a rewrite operation is performed inside is reported to an access body, such as a microprocessor, in accordance with, for example, a ready/busy signal. When a failure occurs in the erase operation or write operation due to deterioration of the characteristics of a memory cell, an erase state or write state necessary for the memory cell cannot be obtained even if the erase and erase verify operations and write and write verify operations are repeated many times and the internal rewrite control operation is abnormally ended.

It is an object of the present invention to provide a semiconductor memory which directly applicable to a memory device and a memory card by using a plurality of partial products instead of a non-defective product or complete composite conforming circuit.

It is another object of the present invention to provide a semiconductor memory which is capable of preventing a contradiction of the internal states from occurring between a partial product in which the operation of its defective portion is designated by an access from an external unit and another partial product substituted for the former partial product, and, moreover, to provide a memory device using the memory.

It is still another object of the present invention to provide a semiconductor memory which is capable of changing the address arrangement of an operable portion separated from a defective portion irrespective of built-in address decoding logic, and, moreover, to provide a memory device using the memory.

It is still another object of the present invention to provide a memory card which is capable of using an address decoding logic for chip selection for a semiconductor memory in common with a case where a complete composite conforming circuit is used even when a partial product is used.

The above and other objects and novel features of the present invention will become more apparent from the description provided in this specification and the accompanying drawings.

SUMMARY OF THE INVENTION

Semiconductor memories (1, 1C) of the present invention include a plurality of memory blocks (2, 3 or 2Y, 3Y) constituted by a plurality of memory cells, a data input/output buffer (7) to which data to be written in the memory blocks is supplied and which outputs the data read out of the memory blocks to an external unit, and first control means for controlling the rewriting of data into and the reading of data from the memory cells. The first control means is denoted by symbol 11 in FIG. 1 and by symbols 43Y, 45, and 46Y in FIG. 31. The semiconductor memories are provided with first storage means (30, 47) for designating defective memory blocks included in the above memory blocks and detection means (32, 48Y) for detecting the access to the defective memory blocks designated by the first storage means in accordance with an address signal. In this case, when the detection means detects an access to the defective memory blocks, the control means inhibits a data rewrite operation in the case of a data rewrite operation and inhibits a data output operation of the data input/output buffer in the case of a data read operation.

Moreover, semiconductor memories (1, 1B, or 1C) according to another aspect of the present invention include a plurality of memory blocks (2, 3 or 2Y, 3Y) constituted by a plurality of electrically erasable memory cells, a data input/output buffer (7) to which data to be written in the memory blocks is supplied from an external unit and which outputs data read out of the memory blocks to an external unit, and first control means for controlling the writing of data into and the reading of data from the memory cells. The first control means is denoted by symbol 11 in FIG. 1, and by symbols 43, 44, 45, and 46 in FIG. 15 and by symbols 43Y, 45, and 46 in FIG. 31. The semiconductor memories are provided with first storage means (30, 47) for designating defective memory blocks included in the above memory blocks and detection means (32, 48, 48Y) for detecting an access to the defective memory blocks designated by the first storage means in accordance with an address signal. The control means is set to a status (MR/B) representing the completion of the data rewrite operation in the case of a data rewrite operation when the detection means detects an access to the defective memory blocks so that the status can be output to an external unit irrespective of the completion of the data rewrite operation, and the control means is set to inhibit a data output operation of the data input/output buffer in the case of a data read operation.

A semiconductor memory according to still another aspect of the present invention includes a plurality of memory blocks (72, 73) constituted by a plurality of memory cells, data input/output buffers (77L, 77U) to which data to be written in the memory blocks is supplied from an external unit and which outputs data read out of the memory blocks to an external unit, and first control means for controlling the writing of data into and the reading of data from the memory cells, the first control means having first storage means (100) for designating defective memory blocks included in the above memory blocks. In this case, the control means inhibits a data rewrite operation for the defective memory blocks designated by the first storage means in the case of a data rewrite operation and inhibits the data output operation of the data input/output buffer in the case of a data read operation.

It is possible to use the least significant bit (A0) or the most significant bit (A20) of an address signal for the address information for designating a defective memory block.

To realize an arrangement of the addresses of defective memory blocks on a semiconductor memory, it is possible to provide logic means (104) for selectively inverting the inputs so that the inputs can be output and second storage means (34) for storing control information for determining the propriety of the input inverting operation by the logic means for a path for supplying address information to the detection means in order to detect an access to the defective memory blocks designated by the first storage means.

By using the above semiconductor memories as partial products, it is possible to realize a compatible product having the same memory capacity as that of a semiconductor memory of a complete composite conforming circuit using a memory device (40) which includes the semiconductor memories (1-L, 1-U) having the relation that one semiconductor memory is substituted for the defective memory block of the other semiconductor memory and vice versa, and in which an external terminal having the same function is connected between the semiconductor memories in common.

A memory card (50) using the memory devices is constituted by mounting a plurality of memory devices on a card substrate. Each memory device is provided with an external-data input/output terminal, a chip selection terminal and an address input terminal, all serving as the above external terminals, in which the chip selection terminal is connected to chip-selection signal wirings different from each other on the card substrate and external address input terminals of the memory devices are connected to address signal wirings of the card substrate in common, for every memory device in which the external-data input/output terminal is connected to the data wiring on the card substrate in common.

The memory card is provided with a card controller (52), having one end which is interfaced with the outside of the card substrate and another end which is connected to the data wiring, chip selection signal wirings and address signal wirings, and the card controller can be constituted by including decoding means (54) for decoding part of the address information supplied from an external unit to generate the chip selection signal.

According to the above-described means, when a memory block selected in accordance with the address information supplied from an external unit coincides with a memory block (defective memory block in a partial product) designated by the first storage means, a data rewrite operation is inhibited by the first control means in the case of a data rewrite operation, and a data output operation of the data input/output buffer is inhibited by the first control means in the case of a data read operation. By means of another aspect, when access to a defective memory block is detected, a status representing the completion of the data rewrite operation is set up so that it can be output to an external unit by the first control means irrespective of the completion of the operation in the case of a data rewrite operation, and a data output operation of the data input/output buffer is inhibited by the first control means in the case of a data read operation.

The inhibiting of a semiconductor memory used as a partial product makes it possible to use a partial product without requiring the processing of fixing a specific address for designating a memory block outside the semiconductor memory on a system. For example, when the above semiconductor memory is provided with two memory blocks, by combining a semiconductor memory (1-U) used as a high-order partial product and a semiconductor memory (1-L) used as a low-order partial product to form a memory device (40) by connecting its external terminals in common, the memory device (40) achieves the compatibility of a semiconductor memory having a complete composite conforming circuit from the viewpoint of external terminal specification or utilization mode.

In the case of a semiconductor memory, such as a flash memory, which independently performs the processing of responding to a command supplied from an external unit, even if an instruction to execute the information rewrite operation is given from an external unit to a defective memory block in a partial product, the information rewrite operation of the memory block is inhibited or a status representing the completion of the data rewrite operation is set up so that it can be output to the external unit irrespective of the completion of the operation as described above. Therefore, when an instruction to execute the operation of a defective portion of a partial product is given by an access from an external unit, it is possible to prevent contradiction from occurring in the internal state between the partial product and another partial product substituted for the defective portion of the former partial product.

It is considered that defective portions of a plurality of partial products are biased depending on the fabrication process. By using the logic means for selectively logic-inverting address information provided to select a memory block in accordance with a value preset in the second storage means, it is possible to optionally change the arrangement of memory blocks apparently operable with respect to an address signal supplied from an external unit depending on the type of setting information provided by the second storage means even if partial products whose defective portions are different from each other are biased in quantity. Thereby, when substituting partial products whose operational regions are complementary for a non-defective product by combining them, it is possible to prevent defective partial products of one defect type more than the other defect type in quantity to be left unused.

For example, when a flash memory is used as a semiconductor memory and the semiconductor memory is provided with two memory blocks, it is possible to mount a semiconductor memory used as a high-order partial product and a semiconductor memory used as a low-order partial product on a memory card using the partial product of the semiconductor memory provided with two memory blocks by substituting the high-order and low-order partial products for a complete composite conforming circuit and connecting the external terminals thereof in common on a wiring board. Because the processing for the defective portion of a semiconductor memory used as a partial product is realized in the semiconductor memory, the processing for fixing a specific address terminal of t;he semiconductor memory is not required at all. Even if a semiconductor memory used in a memory card is a partial product, it is possible to use in common the wiring of a mounting board and the logic of a card controller, particularly the logic of a chip selecting decoder of a semiconductor memory.

Thus, the present invention makes it possible to realize a good compatibility between a memory device or memory card using a partial product and a device or memory card using a complete composite conforming circuit. It is possible to directly employ a partial product of a semiconductor memory for a memory device or memory card in place of a complete composite conforming circuit.

BRIEF DESCRIPTION OF THE DRAWINGS

FIG. 10 is a block diagram of a flash memory representing a second embodiment of the present invention;

FIG. 13 is a chart showing the voltage condition of the erase operation and write operation of a memory cell;

FIG. 25(A) is a diagram of an address map,

FIG. 25(B) is a diagram of is a flash memory, and

FIG. 25(C) is a flowchart showing the erase operation of a complete composite conforming circuit of the flash memory shown in FIG. 15;

FIG. 26(A) is a diagram of an address map,

FIG. 26(B) is a diagram of a flash memory, and

FIG. 26(C) is a flowchart showing the erase operation of a low-order partial product of the flash memory shown in FIG. 15;

FIG. 27(A) is a diagram of an address map,

FIG. 27(B) is a diagram of a flash memory, and

FIG. 27(C) is a flowchart showing the erase operation of a high-order partial product of the flash memory shown in FIG. 15;

FIG. 37(A) is a diagram of an address map,

FIG. 37(B) is a diagram of a flash memory, and

FIG. 37(C) is a flowchart showing the erase operation of a complete composite conforming circuit of the flash memory shown in FIG. 31;

FIG. 39(A) is a diagram of an address map,

FIG. 39(B) is a diagram of a flash memory, and

FIG. 41(B) is a diagram of a flash memory, and

DETAILED DESCRIPTION OF THE PREFERRED EMBODIMENTS

Figure 1:
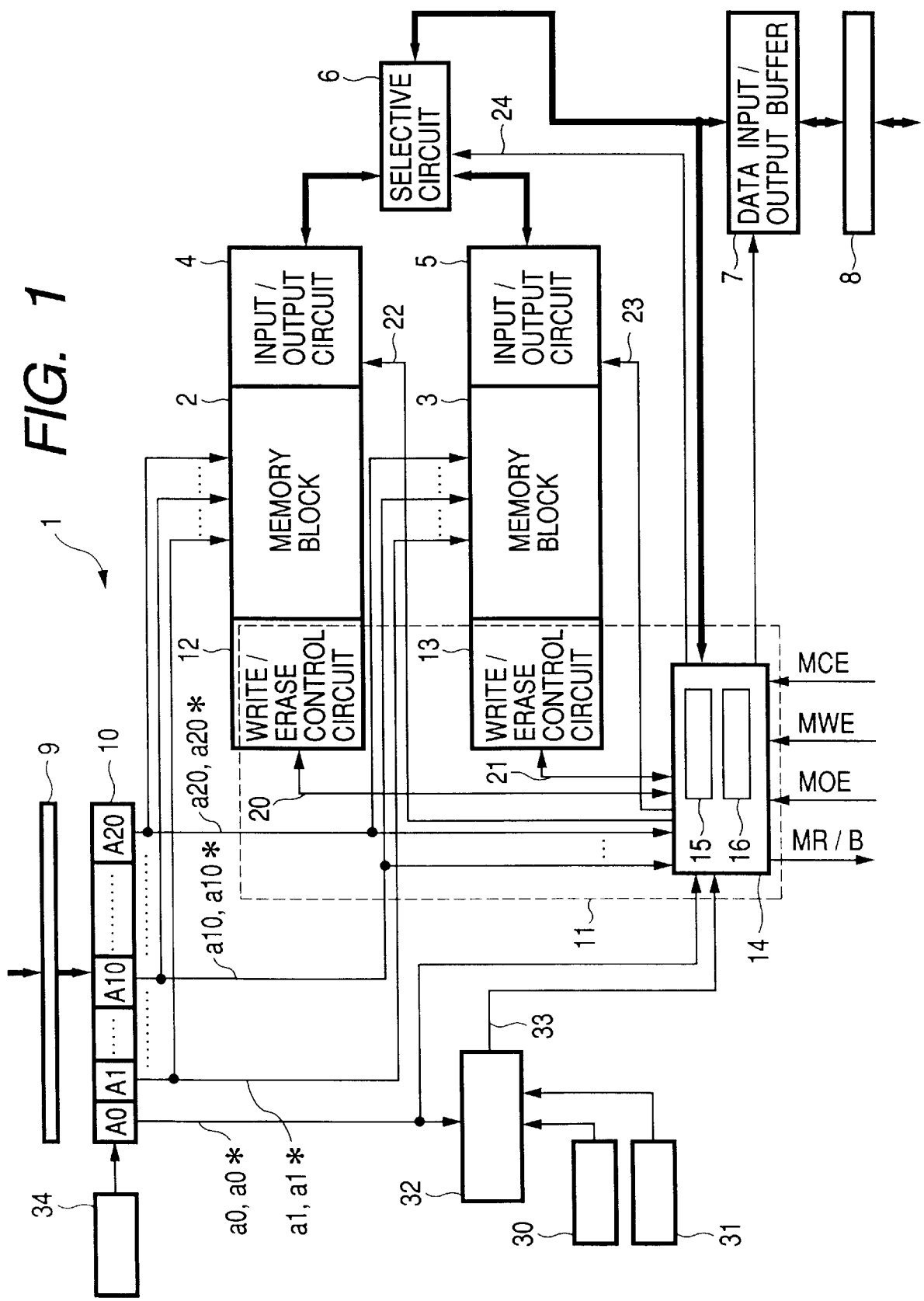
FIG. 1 is a block diagram of a flash memory representing a first embodiment of the present invention.

FIG. 1 is a block diagram showing the flash memory 1 representing an embodiment of the present invention. The flash memory shown in FIG. 1 is formed on a semiconductor substrate made of, for example, single-crystal silicon using a semiconductor integrated circuit fabrication technique. The flash memory 1 of this embodiment is provided with two memory blocks 2 and 3 in each of which electrically erasable nonvolatile memory cells are arranged in the form of a matrix.

In the case of this embodiment, 8 bits (1 byte) are used as a data write unit and a data read unit for each of the memory blocks 2 and 3. Transfer of data to and from the memory blocks 2 and 3 is performed in units of a byte by input/output circuits 4 and 5. Either of the input/output circuits 4 and 5 is connected to a data input/output buffer 7 through a selector 6. The data input/output buffer 7 is connected to 8-bit external-data input/output terminals 8 through which data is transferred to and from an external unit. Address signals A0 to A20 for selecting memory cells are supplied to the memory blocks 2 and 3 through an address input buffer 10. The address input buffer 10 has a function of serving as an address latch circuit and, for example, directly holds a write address so that the address can be used as a write verify address. In this case, the address signals A0 to A20 are regarded as address signals for designating word addresses, that is, word-size data. The address signal A0 is regarded as an address signal representing which byte-size data is designated in word-size data. Though the invention is not so restricted, the address signal A0 is regarded as an address signal for designating which memory block is selected out of the memory blocks 2 and 3. In the case of this embodiment, each of the memory blocks 2 and 3 has a memory capacity of 1M bytes.

In FIG. 1, symbol 11 denotes first control means for controlling the writing of information into and the reading of information from the memory blocks 2 and 3 in accordance with an instruction sent from an external unit and for outputting a ready/busy signal MR/B representing the completion of a write operation in response to an instruction for a write operation. The first control means 11, though not so restricted, comprises a write erase control circuit 12 exclusively used for a memory block 2, a write erase control circuit 13 exclusively used for a memory block 3, and a timing controller 14 for controlling the entire flash memory. Each of the write erase control circuits 12 and 13 is provided with a control circuit and a decision circuit for erase verify and write verify. The timing controller 14 receives a typically-shown output enable signal MOE, a write enable signal MWE, and a chip enable signal MCE as external access control signals. The timing controller 14 has a command register 15 in which a command supplied from an external unit through the data input/output buffer 7 is set and operation modes such as erase verify, write, and write verify are set by decoding the command. Though the invention is not so restricted, the control signal MWE represents an instruction to write a command into the command register. The control signal MOE represents an instruction to execute a read operation. The control signal MCE represents an instruction to select a chip.

The erase operation can be performed for every block or every 512 bytes. Though the invention is not so restricted, designation of a block to be erased is performed by the 11-bit address signals A10 to A20 and the 1-bit address signal A0. That is, when writing an erase command into the command register 15, the address signals A0 and A10 to A20 are captured by an erase block designation register 16. The timing controller 14 generates an internal control signal for simultaneously erasing 512-byte-blocks designated by A10 to A20 for one memory block designated by the address signal A0 captured by the erase block designation register 16.

In the case of this embodiment, the least-significant address signal A0 is regarded as a signal for selecting a memory block 2 or 3 in accordance with the logical value of the signal A0. Symbols a0, a0* (symbol "*" denotes inversion), a1, a1* to a20, and a20* are internal complementary address signals corresponding to A0 to A20. The timing controller 14 controls whether to execute a read operation or a write operation of either of the memory blocks 2 and 3 and moreover, controls to which circuit the input/output circuit 4 or 5 a selection circuit 6 should be connected to, referring to the internal complementary address signals a0 and a0*. The reference numeral 20 generally denotes information including control signals transferred between the write erase control circuit 12 and the timing controller 14, the reference numeral 21 generally denotes information including control signals transferred between the write erase control circuit 13 and the timing controller 14, the reference numeral 22 denotes a control signal for the input/output circuit 4, the reference numeral 23 denotes a control signal for the input/output circuit 5, and the reference numeral 24 denotes a control signal for the selection circuit 6.

The flash memory 1, according to the present invention, is used as a partial product when either of the memory blocks 2 and 3 has an irremediable defect. A flash memory in which neither memory block 2 nor memory block 3 have an irremediable defect is referred to as a complete composite conforming circuit. This embodiment is provided with a fuse program circuit 30 in which information for designating a defective memory block out of the memory blocks 2 and 3 is set, a fuse program circuit 31 in which information representing that the memory is a partial product is set, and an inhibition controller 32 which operates to allow two partial products to be completely compatible with a complete composite conforming circuit. The inhibition controller 32 receives the complementary internal address signal a0 (a0*) and outputs of the fuse program circuits 30 and 31.

The inhibition controller 32 controls an inhibit control signal 33 to an activation level when a memory block regarded as selected by the complementary internal address signal a0 (a0*) coincides with a memory block designated by the fuse program circuit 30 if the output of the fuse program circuit 31 indicates that the memory is a partial product. That is, the inhibition controller 32 serves as detection means for detecting an access to a defective memory block designated by the fuse program circuit 30 in accordance with an address signal.

The timing controller 14, in response to receipt of the inhibit control signal 33, inhibits an information rewrite operation of the memory block concerned in response to an instruction for an information rewrite operation of a memory cell when the signal 33 is activated, and, moreover, inhibits the data output operation of the data input/output buffer 7 in response to an instruction for an information read operation of a memory cell or the like. The timing controller 14 brings a ready/busy signal MR/B to a ready state and outputs the signal to an external unit when inhibiting the information rewrite operation of the memory block. The ready-state ready/busy signal MR/B is regarded as a status signal representing the completion of the rewrite operation. Moreover, the timing controller 14 is finally brought to a ready state even if the ready/busy signal MR/B is instantaneously brought to a busy state in a very short period until the logical operation according to the activation-level inhibit control signal 33 is determined.

Figure 2:
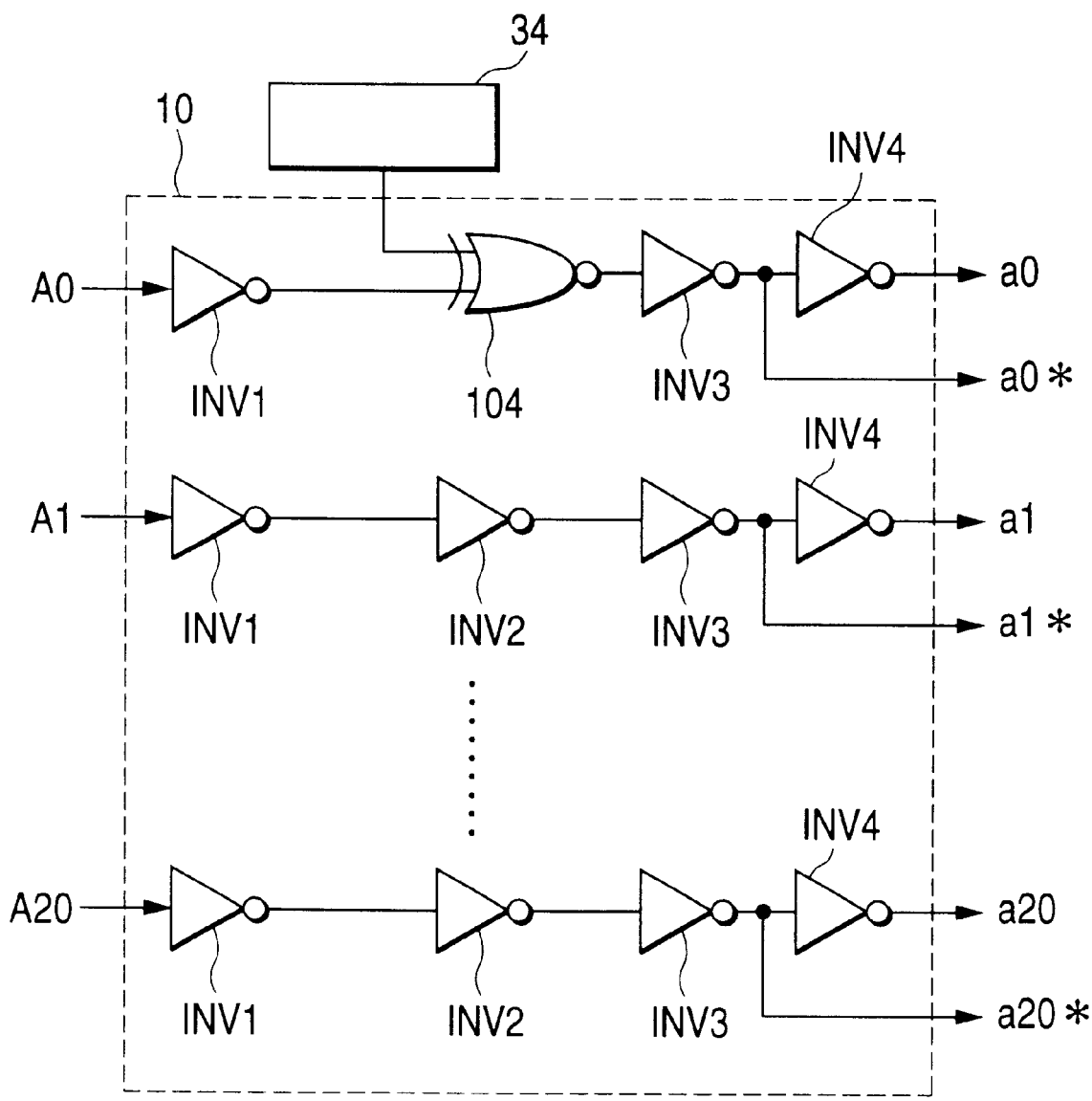
FIG. 2 is a logic circuit diagram of the address input buffer of FIG. 1.

FIG. 2 shows an example of the address input buffer 10. The bits of the address signals A1 to A20 are converted into non-inverted internal complementary address signals a1 to a20 through four-stage inverters INV1, INV2, INV3, and INV4, and, moreover, they are also converted into inverted internal complementary address signals a1* to a20* through three-stage inverters INV1, INV2, and INV3. In this case, a two-input-type exclusive NOR gate 104 is provided at the second stage for receiving the address signal A0 instead of the inverter INV2, and the output of the fuse program circuit 34 is supplied to the input terminal of the exclusive NOR gate 104 so that the logical values of the internal complementary address signals a0 and a0* can be selectively inverted for the logical value of the address signal A0 in accordance with the output logical value of the fuse program circuit 34. That is, the logical value of the internal complementary address signal a0 is made to coincide with the logical value of the address signal A0 when the set value of the fuse program circuit 34 is "1" and the logical value of the internal complementary address signal a0 is made to be opposite to the logical value of the address signal A0 when the set value of the fuse program circuit 34 is "0".

The timing controller 14 shown in FIG. 1 selects the operation of the memory block 2 when the logical value of the internal complementary address signal a0 is "0" and connects the input/output circuit 4 to the data input/output buffer 7 to allow the circuit 4 to be controlled by the selection circuit 6. When the logical value of the internal complementary address signal a0 is "1", the operation of the memory block 3 is selected and the input/output circuit 5 is connected to the data input/output buffer 7 and controlled by the selection circuit 6. For example, when the memory block 2 has an irremediable defect, the logical value "0" is set in the fuse program circuit 30. When the logical value of the internal complementary address signal a0 is set at "0" in the above state, the inhibit control signal 33 is set at an activation level. In this case, if an instruction to execute the information rewrite operation of a memory cell is given, the information rewrite operation of the memory block 2 responding to the instruction is inhibited. Moreover, if an instruction to execute the information read operation for a memory cell is given, the data output operation of the data input/output buffer 7 responding to the instruction is inhibited. In this case, if the set value of the fuse program circuit 34 is "1", the inhibit operation of the memory block 2 is performed for an access such that the logical value of the address signal A0 is set at "0". However, if the set value of the fuse program circuit 34 is "0", the inhibit operation of the memory block 2 is performed for an access such that the logical value of the address signal A0 is set at "1".

As understood from the foregoing description of the embodiment, when the memory block selected in accordance with the address signals A0 to A20 supplied from an external unit coincide with the memory block (defective memory block in a partial product) designated by the fuse program circuit 30, and, moreover, an instruction to execute an information rewrite operation of a memory cell is given, the information rewrite operation of the memory block concerned responding to the instruction is inhibited by the inhibition controller 32. Moreover, when an instruction to execute the information read operation for a memory cell or the like is given, the data output operation of the data input/output buffer 7 responding to the instruction is inhibited by the inhibition controller 32. Thus, the inhibiting function of the flash memory 1 used as a partial product makes it possible to use a partial product of the flash memory chip as it is on a system on which the flash memory 1 is mounted without externally requiring a terminal of the flash memory 1 for inputting the specific address signal A0 to a certain level in accordance with the address arrangement of a defective memory block.

Figure 3A:
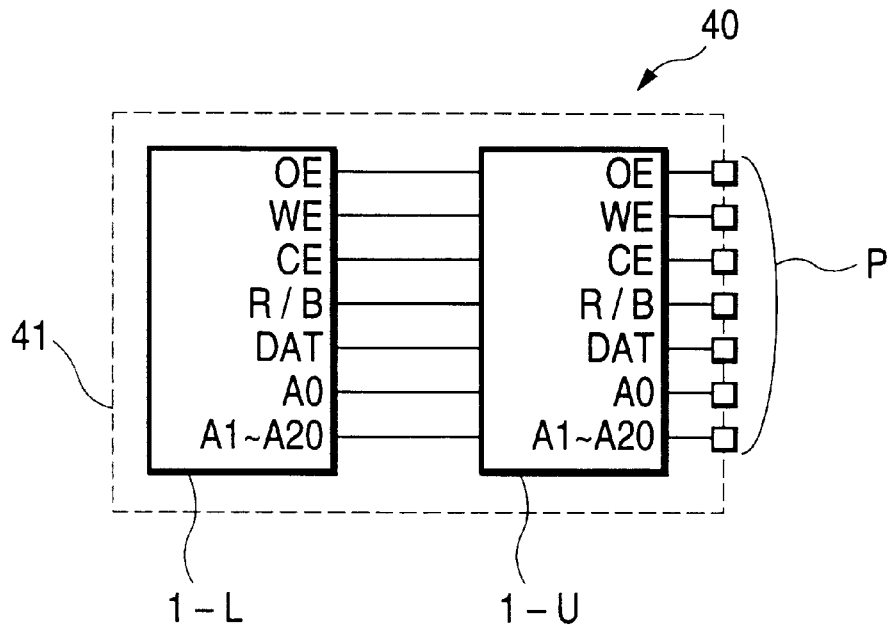
FIGS. 3(A) and 3(B) are diagrams of an embodiment of a memory device using the partial product of the flash memory described with reference to FIG. 1.

FIG. 3(A) shows an embodiment of a memory device using a flash memory as a partial product as described with reference to FIG. 1. The memory device 40 shown in FIG. 3(A) uses two flash memories 1 as partial products, in which external terminals corresponding to each of the memories 1 are connected in common and connected to a respective lead terminal P of a package 41. One flash memory is denoted by 1-L and the other flash memory is denoted by 1-U. For example, the flash memory 1-L is a flash memory fuse-programmed so that one normal memory block is accessed when the address signal A0 having a logical value "0", and the access to the other defective memory block is inhibited when the signal A0 has a logical value "1". The flash memory 1-L is also merely referred to as a low-order partial product. However, the flash memory 1-U is a flash memory fuse-programmed so that one normal memory block is accessed when the address signal A0 has a logical value "1" and the access to the other defective memory block is inhibited when the signal A0 has a logical value "0". The flash memory 1-U is also merely referred to as a high-order partial product. As understood from the description of the fuse program circuit 34, it is unnecessary for the normal memory block of the low-order partial product 1-L to be physically different from that of the high order partial product 1-U, and the address arrangement of a normal memory block for the address signal A0 is determined by the set value of the fuse program circuit 34. Therefore, even if a bias occurs in defective portions of a plurality of partial products clue to the fabrication process, it is possible to apparently optionally change the arrangement of an operable memory block for the address signal A0 supplied from an external unit by determining the set value of the fuse program circuit 34 of each partial product corresponding to the degree of the bias. Thereby, even when a memory device 40 substituted for a non-defective product is fabricated by combining partial products whose operational regions are complementary, it is possible to prevent the possibility that defective partial products of one defect type more than the other defect type are left unused.

In the case of the embodiment of FIG. 3(A), OE (input terminal of MOE), WE (input terminal of MWE), CE (input terminal of MCE), R/B (output terminal of MR/B), DAT (data input/output terminal 8), and address input terminals A0 to A20 are typically shown as external terminals connected between partial products in common. Though no power supply terminal is illustrated, corresponding power supply terminals of the partial products are connected in common. In this case, a ready/busy signal MR/B of a flash memory is generated by an open drain circuit and output terminals are wired-OR-connected to each other.

Figure 3B:
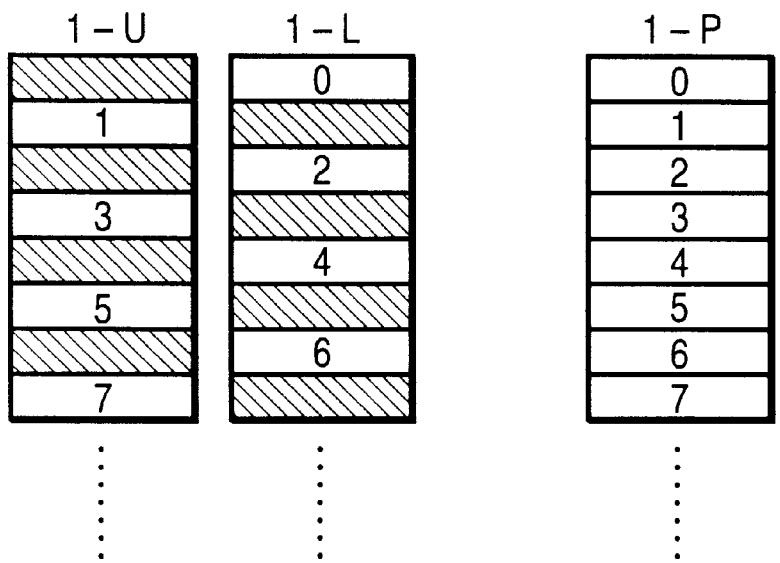

The memory device using the high-order partial product 1-U and the low-order partial product 1-L shown in FIG. 3(A) are complementarily operated in accordance with the logical value of the address signal A0 supplied to the memory device, as understood from the description with reference to FIG. 1. Therefore, as shown in FIG. 3(B), addresses 0, 2, 4, . . . are practically mapped in the low-order partial product 1-L and addresses 1, 3, 5, . . . are practically mapped in the high-order partial product 1-U. The entire memory capacity of the memory device and the external terminal structure of the package are the same as those of the flash memory 1-P used as a complete composite conforming circuit in which both memory blocks do not have any irremediable defect and the handling of the memory device for the address signal A0 is the same as that of the complete composite conforming circuit 1-P. Therefore, in these points, the memory device of FIG. 3(B) has complete compatibility with the complete composite conforming circuit 1-P.

Figure 4:
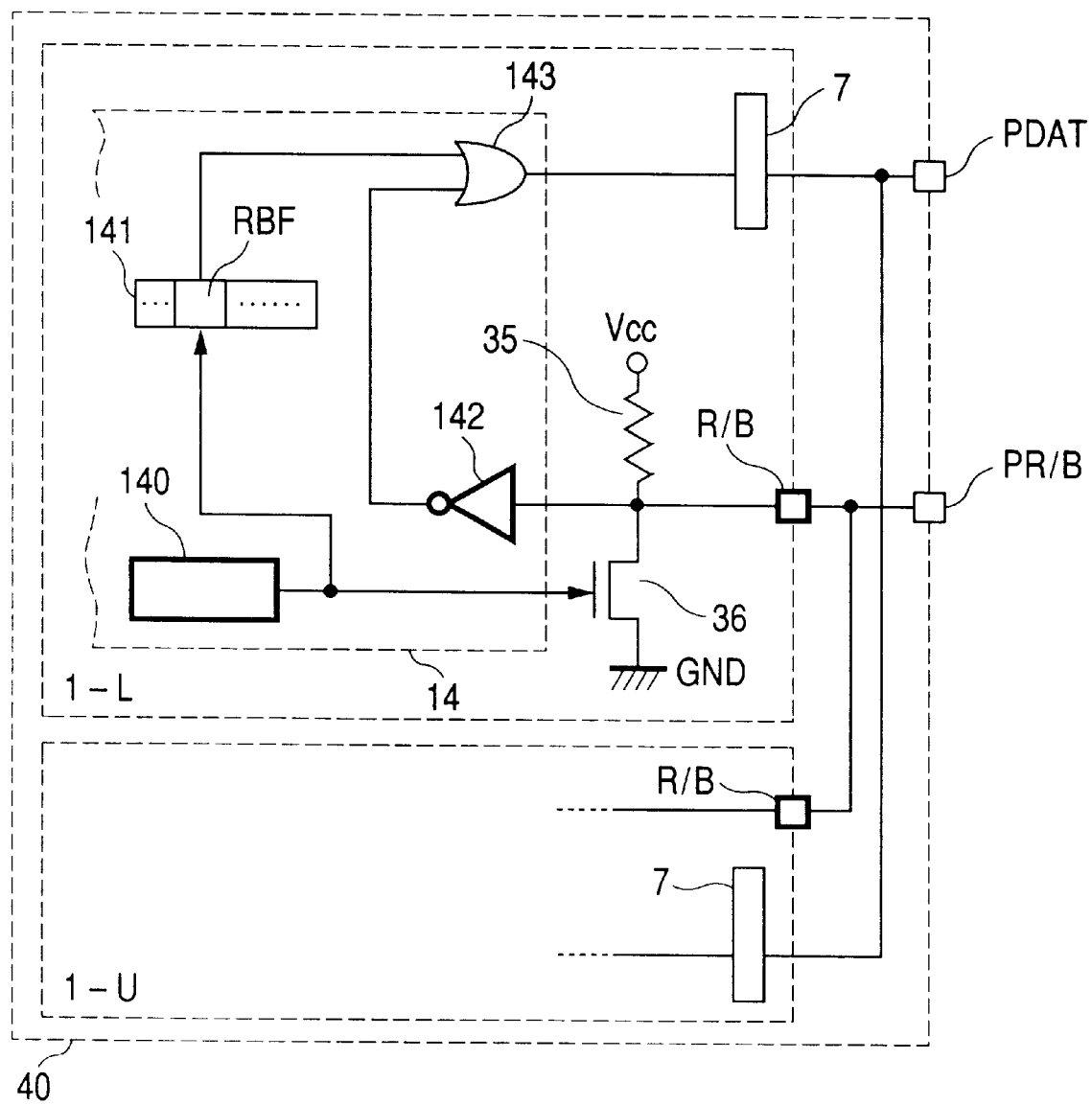
FIG. 4 is a logic circuit diagram of a circuit for generating a ready/busy signal and a read/busy status af a partial product constituting the memory device of FIG. 3(A)

FIG. 4 shows an example of a logic circuit for generating a ready/busy signal and a ready/busy status of the partial products 1-L and 1-U constituting the memory device 40. The ready/busy terminals R/B of the partial products 1-L and 1-U are connected to an open drain circuit in each flash memory chip. That is, an N-channel MOS transistor 36 switch-controlled by the output of a busy status generator 140 is included, and the source of the transistor 36 is connected to a ground terminal GND and the drain is connected to a power supply terminal Vcc through a resistor 35.

The busy status generator 140 is included in the timing controller 14 of FIG. 1 to keep the MOS transistor 36 on until a designated operation is completed when the erase mode or write mode is designated. When the rewrite operation is inhibited by the inhibit signal 33, the busy status generator 140 sets the output at a low level interlockingly with the inhibition of the erase or write operation. That is, when the access to a defective memory block is detected, the busy status generator 140 operates as means for making it possible to output a status representing the completion of a data rewrite operation for an instruction for a data rewrite operation irrespective of the completion of the operation.

The gate control signal of the MOS transistor 36 is supplied to a status register 141 to generate a ready/busy flag RBF. The ready/busy flag RBF represents a busy state when the logical value is "1" and a ready state when the logical value is "0". The value of the status register 141 is made readable by an external unit through the data input/output buffer 7. FIG. 4 typically shows only the read path of the ready/busy flag RBF. A two-input-type OR gate 143 is provided in the read path of the ready/busy flag RBF, the ready/busy flag RBF is supplied to one input of the gate and the drain of the MOS transistor 36 is connected to the other input through an inverter 142. The ready/busy terminal R/B of the high-order partial product 1-U and that of the low-order partial product 1-L are wired-OR-connected to each other and connected to an external ready/busy terminal PR/B of the package.

During an erase or write of data, the busy status generator 140 keeps the MOS transistor 36 on. Thereby, the ready/busy flag RBF is set at a logical value "1". The ready/busy state of the flash memory 1-L or 1-u can be recognized by externally referring to the ready/busy terminal R/B. Moreover, unless the data input/output buffer 7 is operated, it is possible to externally recognize the ready/busy state by externally reading the value of the status register L4. In the case of the memory device 40, the operation of the memory blocks, i.e. the high-order partial product 1-U and the low-order partial product 1-L, are selectively inhibited in accordance with the value of A0. An external read of the status register 140 can be made possible by activating the control signal MOE. In this case, however, the status register 141, a read object, is made possible for both the partial products 1-L and 1-U depending on the value of A0. As a result of comparison of the internal state of a partial product whose operation is inhibited by A0 with that of a partial product whose operation is not inhibited by A0, the partial product whose operation is inhibited is brought to a ready state when the partial product whose operation is not inhibited is in a busy state. In this case, the terminal PR/B is in a busy state because the terminals R/B of both partial products are wired-OR-connected. However, the ready/busy flags RBF represent the actual internal states of the partial products. That is, the flag RBF of the partial product whose operation is inhibited is brought to a ready state and the flag RBF of the partial product whose operation is not inhibited is brought to a busy state. In this case, because the OR gate 143 is provided in the output path of the ready/busy flag RBF, the output of the OR gate 143 is forcedly brought to a busy state (logical value "1") when the other partial product is in a busy state even if the ready/busy flag RBF represents a ready state (logical value "0"). Therefore, when the terminal PR/B of the memory device 40 is in a busy state (logical value "0"), it is possible to set up a busy state (logical value "1") even if the ready/busy flag RBF of the partial product whose operation is inhibited is read by an external unit. If the OR gate 143 is not provided in the output path of the ready/busy flag RBF, a ready state is set up by reading the ready/busy flag RBF of the partial product whose operation is inhibited to an external unit and a busy state is set up by reading the ready/busy flag RBF of the partial product whose operation is not inhibited to an external unit, and, thus, both flags RBF do not coincide with each other. Therefore, by using the structure in FIG. 4, the state of a ready/busy flag read out to an external unit becomes the same as the case of a complete composite conforming circuit, and, also in this point, complete compatibility with the complete composite conforming circuit is realized.

Figure 5:
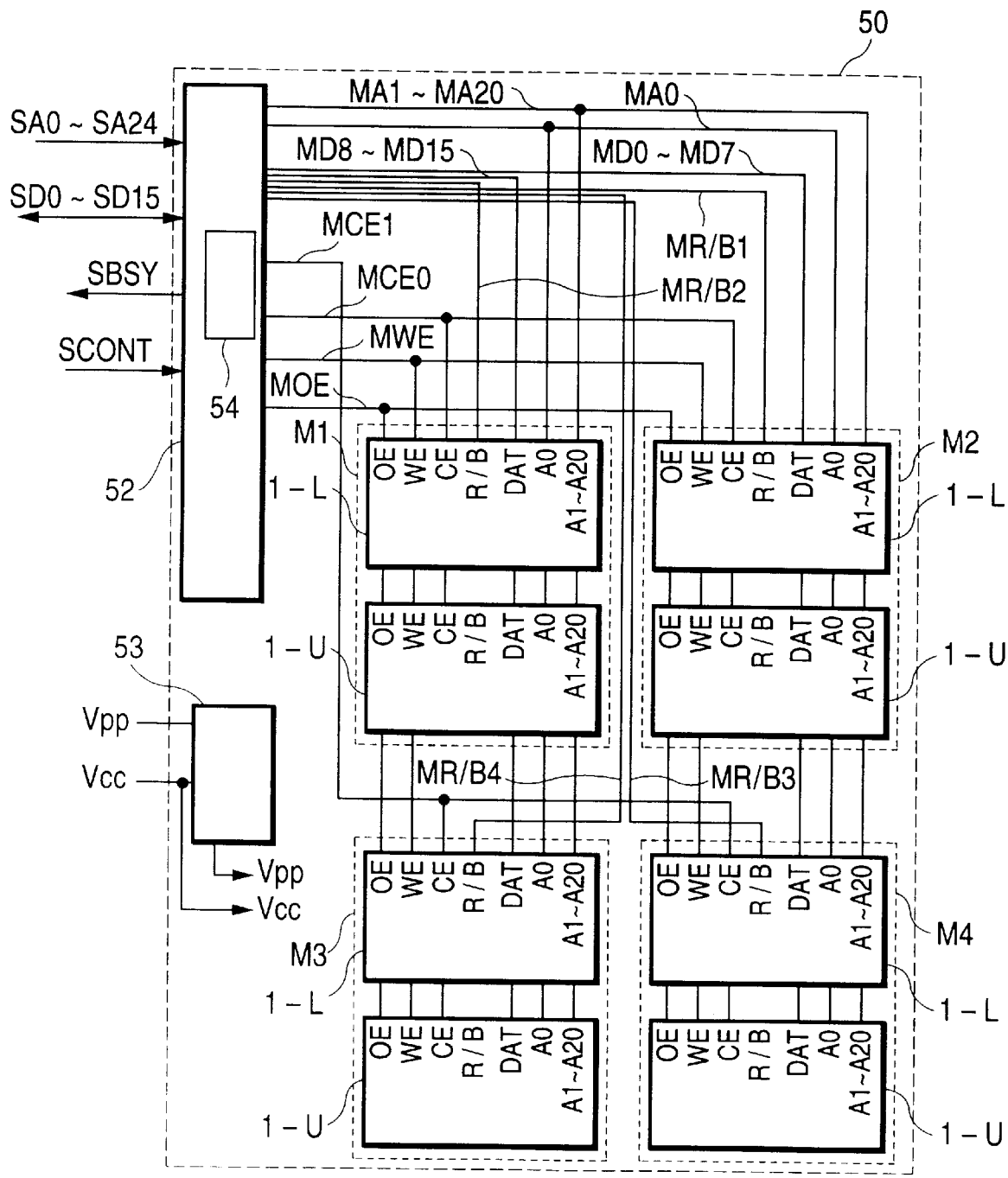
FIG. 5 is a block diagram of a memory card using a partial product of the flash memory of FIG. 1.
Figure 6:
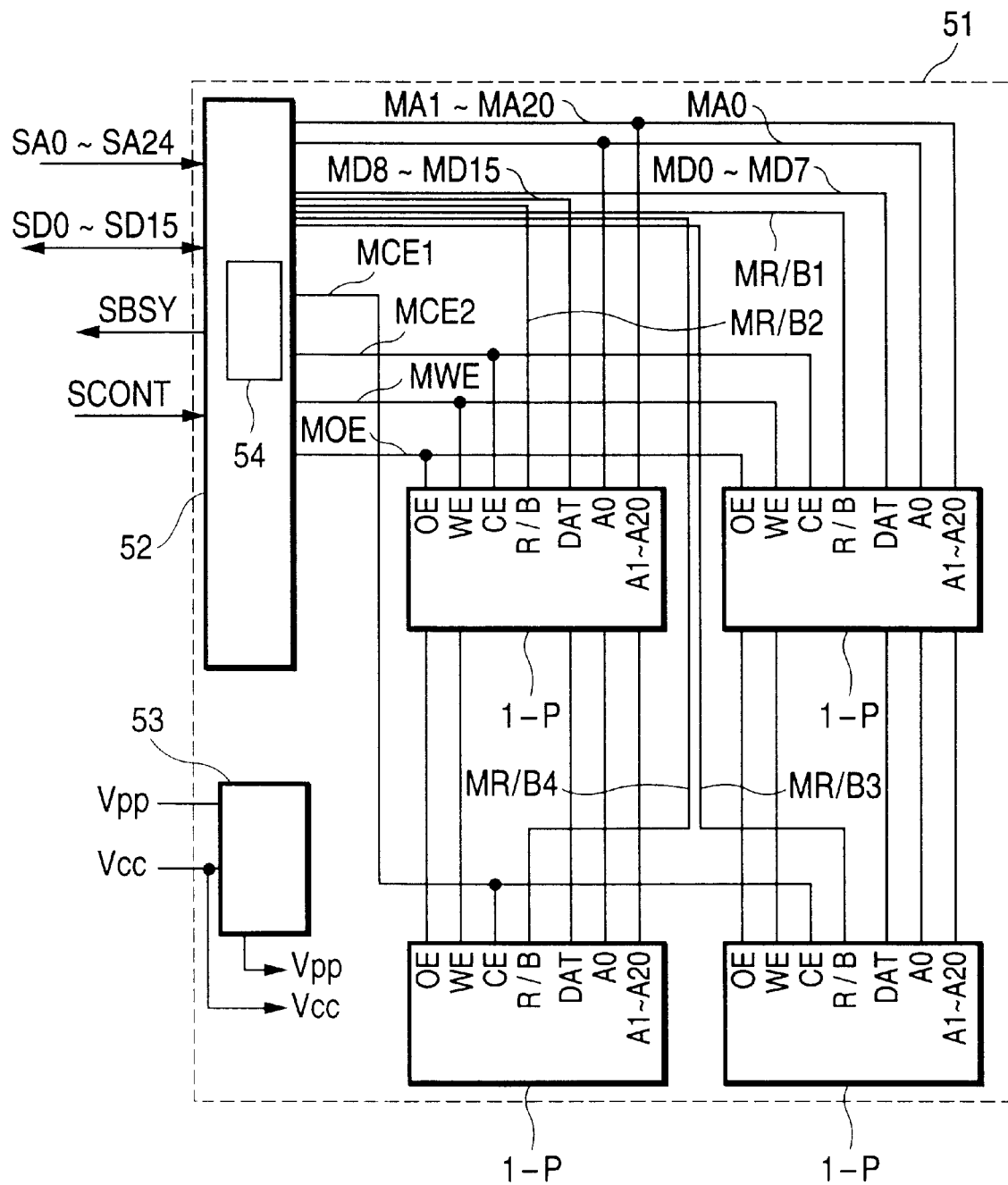
FIG. 6 is a block diagram of a memory card using four complete composite conforming circuits of the flash memory of FIG. 1.

FIG. 5 shows an embodiment of a memory card. The memory card 50 of this embodiment is provided with four low-order partial products 1-L and four high-order partial products 1-U. Though the invention is not so restricted, the partial products 1-L and 1-U each have an effective memory capacity of 1M bytes. FIG. 6 shows a memory card 51 using four complete composite conforming circuits 1-P each having a memory capacity of 2M bytes. In the description of the memory card, lhe low-order partial product 1-L, the high-order partial product 1-U, and the complete composite conforming circuit 1-P are each provided with an 8-bit data input/output terminal.

In FIG. 5, symbol 52 denotes a card controller and symbol 53 denotes a power supply circuit. The card controller 52 receives address signals SA0 to SA24 and various control signals SCONT, outputs a busy signal SBSY, and receives/outputs data values SD0 to SD15. The power supply circuit 53 has an input terminal for a power supply voltage Vcc, such as 5 V, and a rewriting high voltage Vpp, such as 12 V, and moreover has a circuit like a DC—DC converter for generating a writing high voltage by boosting the Vcc, unless Vpp is supplied from an external unit. When Vpp is supplied from an external unit, the voltage boosting function is not used.

The memory card 50 of this embodiment has four memory pairs M1 to M4 each of which is constituted by pairing a low-order partial product 1-L and a high-order partial product 1-U. Though each memory pair is practically the same as the memory device 40 in FIG. 3(A), it is unnecessary to package the memory pairs. The memory card 50 transfers data to and from an external unit word by word. The memory pairs M2 and M4 are made to correspond to low-order byte data SD0 to SD7 through low-order data buses MD0 to MD7. The memory pairs M1 and M3 are made to correspond to high-order byte data SD8 to SD15 through high-order data buses MD8 to MD15. Address buses MA0 to MA20 are connected to address input terminals (A0 to A20) of partial memories of the memory pairs M1 to M4 in common. An output enable signal MOE and a write enable signal MWE are supplied to respective terminals OE and WE of partial memories of the memory pairs M1 to M4 in common. A chip enable signal MCE0 is supplied to the partial memories of the memory pairs M1 and M2 in common and a chip enable signal MCE1 is supplied to the partial memories of the memory pairs M3 and M4 in common. Ready/busy terminals R/B of partial memories are connected in common for every memory pair and are connected to the card controller 52. Moreover, for the signal wiring for the above data values, addresses and various control signals, the wiring formed on a not-illustrated card substrate is used.

The card controller 52 performs access control of the memory pairs M1 to M4 in accordance with the instruction from a host processor or the like through a not-illustrated card interface connected with the controller 52. For example, the instruction from the host processor is a command and is fetched by a not-illustrated command register. The contents of the instruction include read, erase, and write for a memory pair. An access object is specified by an address signal. Though the invention is not so restricted, SA0 to SA20 among the above address signals SA0 to SA24 are fed to A0 to A20. SA21 is supplied to a decoder 54 and the chip enable signals MCE0 and MCE1 are generated in accordance with the logical value of SA21.

The memory card 50 of FIG. 5 is different from the memory card 51 using the complete composite conforming circuit 1-P shown in FIG. 6 only in that a high-order partial product 1-U and a low-order partial product 1-L are used. This is because the memory pairs M1 to M4 are completely compatible with a complete composite conforming circuit 1-P as understood from the description with reference to FIG. 3(A).

Figure 7:
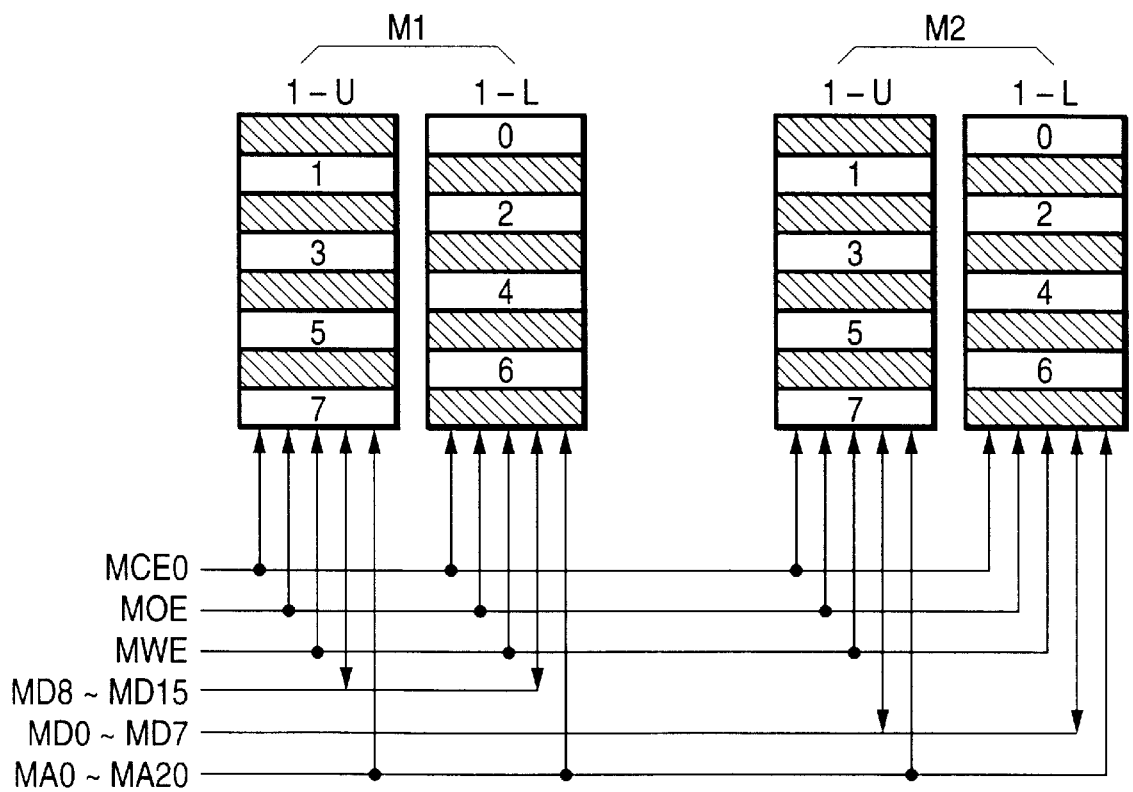
FIG. 7 is a diagram showing the operation of a memory card.

FIG. 7 shows the operation of the memory card 50. FIG. 7 typically shows the memory pairs M1 and M2. For example, in the case of the low-order partial product 1-L, the inhibit control signal 33 is activated when the address signal A0 has a logical value "1", and the rewrite operation of the memory block 3 and the external output of read data included in the signal 33 are inhibited. Moreover, in the case of the high-order partial product 1-U, the inhibit control signal 33 is activated when the address signal A0 has a logical value "0", and the rewrite operation of the memory block 2 and the external output of read data included in the signal 33 are inhibited. When the chip enable signal MCE0 is set at the selection level, the partial products 1-U and 1-L of each of the memory pairs M1 and M2 are brought into an operable state. In this case, when word addresses A1 to A20 specify the address 0 of each partial product, and when A0 serving as a byte specifying address is set at a logical value "0", the rewrite operation of the memory block 2 and the external output of read data are inhibited and the substantial access operation is performed only by the low-order partial product 1-L. Thereby, the address 1 of the high-order partial product 1-U of each of the memory pairs M1 and M2 is accessed.

For the case of the high-order partial product 1-U and low-order partial product 1-L thus chip-selected in parallel, a substantial access operation is alternately performed in accordance with a change of logical values of A0. Therefore, the memory card 51 comprising only a complete composite conforming circuit and the memory card 50 using the partial products 1-L and 1-U can mutually perform the same operation apparently (in terms of external specifications) even if the same card controller 52 is used. That is, the control of the memory card 50 and that of the memory card 51 by an external unit can be completely identical.

Figure 8:
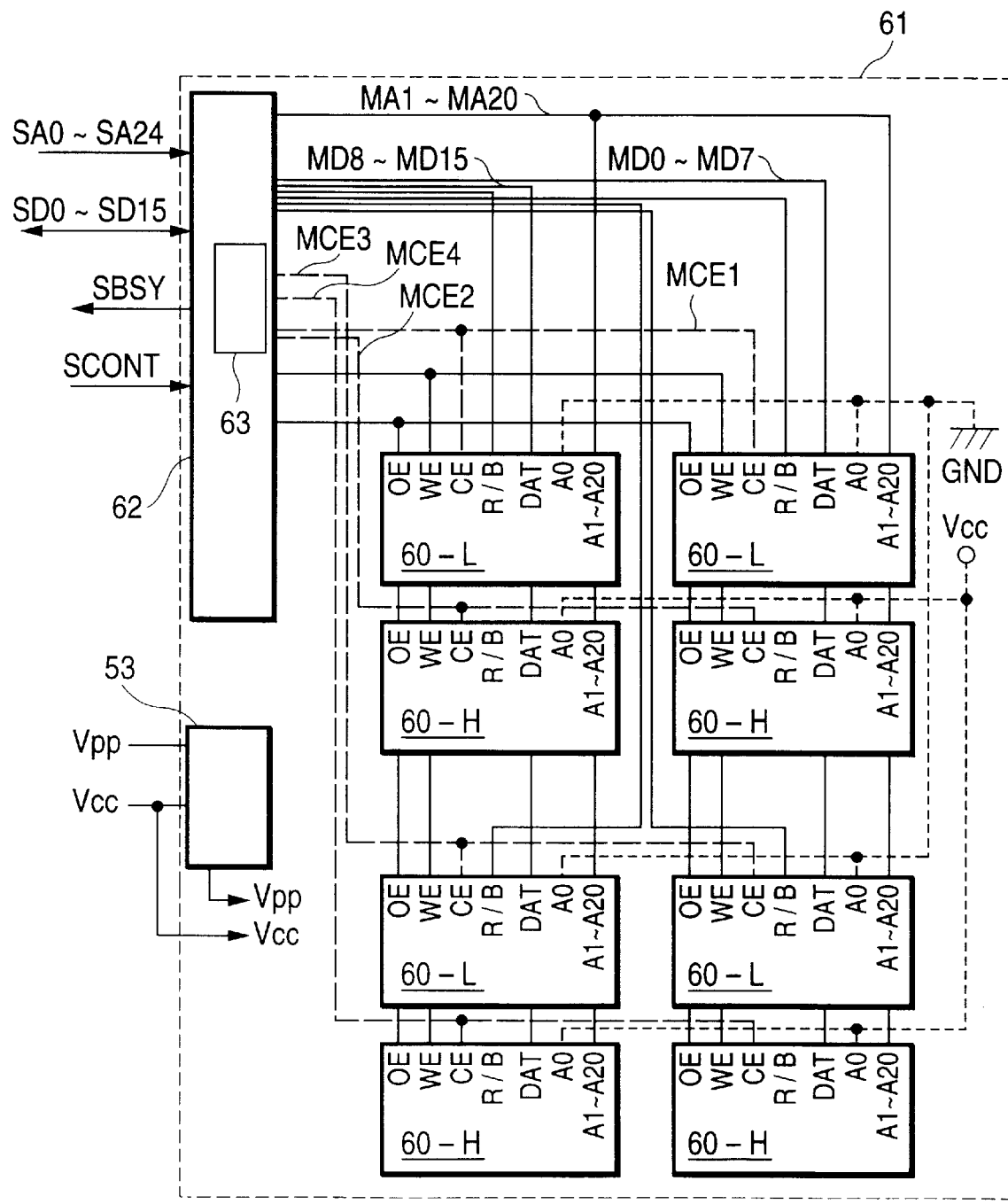
FIG. 8 is a block diagram of a memory card constituted by using a partial product of a flash memory not provided with a circuit structure for selectively inhibiting access to the memory block of FIG. 1.

To constitute such a memory card 61 by using fuse program circuits 30 and 31 for selectively inhibiting the access to the memory blocks 2 and 3 and a partial product of a flash memory not provided with a controller 32, it is necessary to use the circuit structure shown in FIG. 8. That is, it is necessary to fixedly inhibit the selection of the memory block 3 by connecting the address A0 to the ground terminal GND in the case of a low-order partial product 60-L and fixedly inhibit the selection of the memory block 2 by connecting the address A0 to the power supply terminal Vcc in the case of a high-order partial product 60-H. In this case, it is necessary to separately chip-selection-control the high-order partial product 60-H and low-order partial product 60-L constituting a memory pair, otherwise data collision occurs between the partial products 60-H and 60-L. Therefore, in the memory card in FIG. 8, four lines MCE1 to MCE4 are needed for a chip enable signal, and, in a card controller 62, a decoder 63 having logic different from that of the memory cards in FIGS. 5 and 6 is needed. For example, in the decoder 63, an address SA0 for chip selection is needed.

Figure 9:
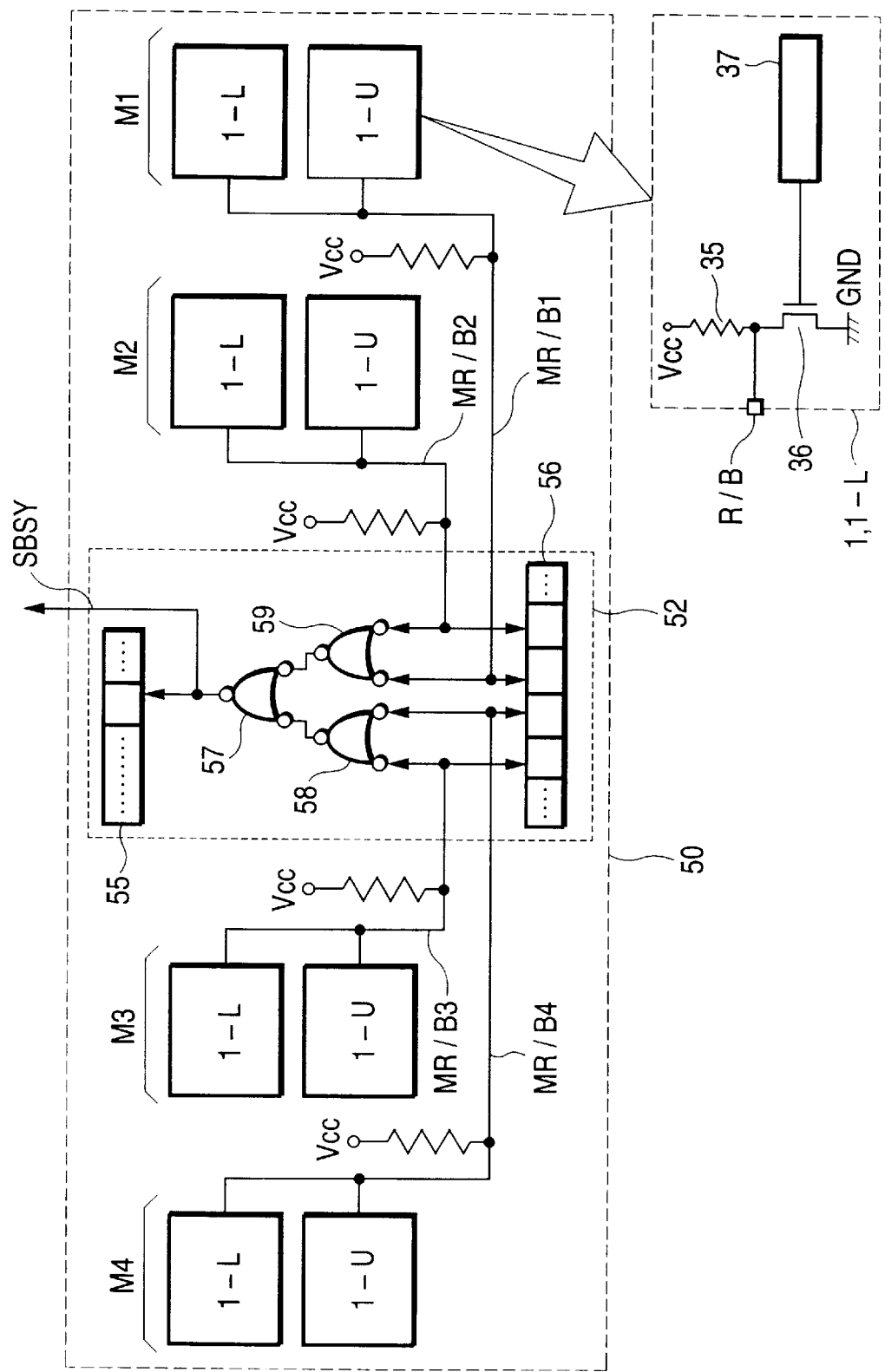
FIG. 9 is schematic circuit diagram showing a system for processing a ready/busy signal of the memory card of FIG. 5.

FIG. 9 shows a system for processing a ready/busy signal in the memory card 50. The ready/busy terminals R/B of the partial products 1-L and 1-U are connected to an open drain circuit inside the card 50. The circuit structure used is, for example, the one shown in FIG. 4. A ready/busy signal MR/B1 is exclusively used for the memory pair M1, a ready/busy signal MR/B2 is exclusively used for the memory pair M2, a ready/busy signal MR/B3 is exclusively used for the memory pair M3, and a ready/busy signal MR/B4 is exclusively used for the memory pair 4. Moreover, these signals MR/B1 to MR/B4 are connected to corresponding bits of a status register 56 provided in the card controller 52. The ready/busy signals MR/B1 and MR/B2 are connected to the inputs of a two-input-type AND gate 59 and the ready/busy signals MR/B3 and MR/B4 are connected to the inputs of a two-input-type AND gate 58. The outputs of the AND gates 58 and 59 are connected to the inputs of a two-input-type AND gate 57, and the output of the AND gate 57 is supplied to an external unit as the busy signal SBSY and is also supplied to the corresponding bit of a card status register 55. The busy signal SBSY at high level reports to an external unit that the memory card 50 is in a ready state.

FIG. 10 shows a flash memory representing a second embodiment of the present invention. The flash memory 1A of FIG. 10 is formed on a semiconductor substrate made of single-crystal silicon using a semiconductor integrated circuit fabrication technique. The flash memory 1A of FIG. 10 is provided with two memory blocks 72 and 73 in which electrically erasable nonvolatile memory cells are arranged in the form of a matrix. In the case of this embodiment, data is written in or read from each of the memory blocks 72 and 73 every 4 bits. Data is input to or output from the memory blocks 72 and 73 by input/output circuits 74 and 75 every 4 bits. The input/output circuits 74 and 75 are connected to exclusive data input/output buffers 77L and 77U, respectively. The data input/output buffers 77L and 77U are connected to 4-bit exclusive external-data input/output terminals 78L and 78U, respectively, through which data is transferred to and from an external unit. Address signals A0 to A20 for selecting memory cells are supplied to the memory blocks 72 and 73 from external address input terminals 79 through an address input buffer 80. In the case of this embodiment, the memory blocks 72 and 73 each have a memory capacity of 1M bytes.

In FIG. 10, symbol 81 denotes first control means for controlling the rewrite and read of information into and from the memory blocks in accordance with the instruction from an external unit and for outputting a ready/busy signal MR/B representing the completion of a rewrite operation in response to an instruction for a rewrite operation to an external unit. The first control means 81 comprises a write erase control circuit 82 exclusively used for the memory block 72, a write erase control circuit 83 exclusively used for the memory block 73, and a timing controller 84 for controlling the whole of the flash memory. The timing controller 84 receives output enable signal MOE, write enable signal MWE, and chip enable signal MCE, typically shown as external access control signals. The timing controller 84 has a command register 85 to which a command supplied from an external unit through the data input/output buffer 77L or 77U and operation modes, such as erase, erase verify, write, and write verify, are set by decoding the command. Though the invention is not so restricted, the control signal MWE gives an instruction to write a command into the command register. The control signal MOE gives an instruction for a read operation. The control signal MCE gives an instruction for chip selection.

The erase operation can be performed every block or every 512 bytes. Designation of a block to be erased, though the invention is not so restricted, is performed by 11-bit address signals A10 to A20. That is, when an erase command is written in the command register 85, the address signals A10 to A20 are captured by an erase block designation register 86. The timing controller 84 generates an internal control signal for simultaneously erasing 512-byte memory blocks designated by the address signals A10 to A20 captured by the erase block designation register 86.

In the case of this embodiment, unless the memory block 72 or 73 has any irremediable defect, the timing controller 84 controls the operation of the memory blocks 72 and 73 in parallel. The reference numeral 90 denotes a control signal for the write erase control circuit 82, the reference numeral 91 denotes a control signal for the write erase control circuit 83, the reference numeral 92 denotes a control signal for the input/output circuit 74, the reference numeral 93 denotes a control signal for the input/output circuit 75, the reference numeral 94 denotes a control signal for the data input/output buffer 77L, and the reference numeral 95 denotes a control signal for the data input/output buffer 77U.

The flash memory of this embodiment is used as a partial product when either of the memory blocks 72 and 73 has an irremediable defect. This embodiment is provided with a fuse program circuit 100 to which information for designating a defective memory block out of the memory blocks 72 and 73 is set, a fuse program circuit 101 to which information representing a partial product is set, and an inhibition controller 102 which operates to make two partial products completely compatible with a complete composite conforming circuit. The inhibition controller 102 generates an inhibit control signal 33A for allowing the timing controller 84 to inhibit the write operation of a memory block designated by the fuse program circuit 100 and the data output operation of the data input/output buffer corresponding to the memory block only when the output of the fuse program circuit 101 represents a partial product. The timing controller 84 for receiving the inhibit control signal 33A, when inhibition of the operation of the memory block 72 is ordered by the signal 33A, keeps the erase control circuit 82 inactive, keeps the input/output circuit 74 inactive (for example, keeps a sense amplifier inactive), and keeps the data input/output buffer 78L in a high-impedance state with the control signals 90, 92, and 94. When inhibition of the operation of the memory block 73 is ordered for the timing controller 84 by the inhibit control signal 33A, the controller 84 keeps the write erase control circuit 83 inactive, keeps the input/output circuit 75 inactive (for example, keeps a sense amplifier inactive), and keeps the data input/output buffer 78U in a high-impedance state with the control signals 91, 93, and 95. The partial product of the flash memory of this embodiment also can be used for a memory device, like the memory device in FIG. 3(A).

Figure 11A:
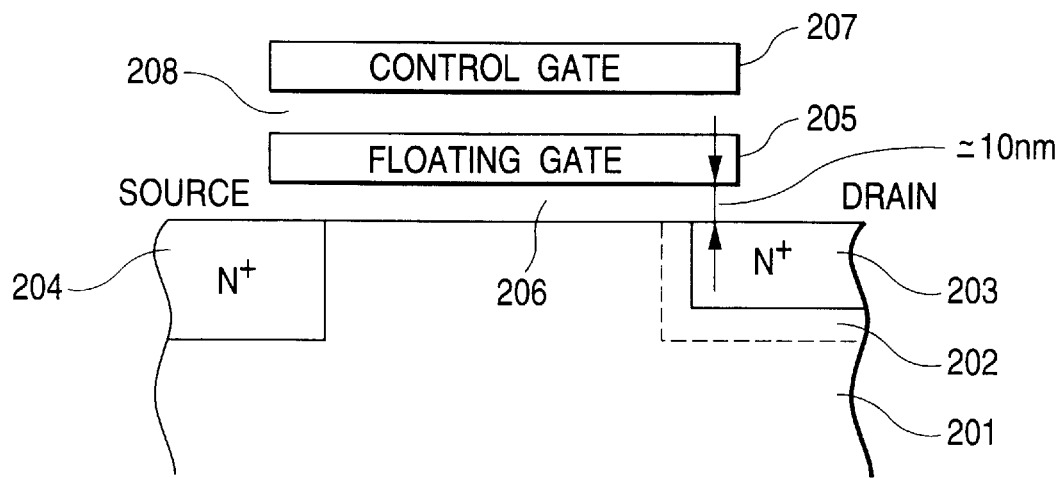
FIG. 11(A) is a circuit diagram of a memory cell used for a flash memory.

FIG. 11(A) shows a memory cell structure of a flash memory. The memory cell typically shown in FIG. 11(A) comprises an insulating-gate-type field effect transistor having a two-layer gate structure. In FIG. 11(A), reference numeral 201 denotes a P-type silicon substrate, reference numeral 202 denotes a P-type semiconductor region formed on the silicon substrate 1, and reference numeral 203 and 204 denote N-type semiconductor regions. Reference numeral 205 denotes the floating gate formed on the P-type silicon substrate 201 through a thin oxide film 206 (the thickness is, e.g., 10 nm) serving as a tunnel insulting film, and reference numeral 207 denotes the control gate formed on the floating gate 205 through an oxide film 208. The source comprises an N-type semiconductor region 204 and the drain comprises an N-type semiconductor region 203 and a P-type semiconductor region 202. The information stored in the memory cell is substantially held by the transistor as the change of a threshold voltage. A case in which a transistor for storing information (hereafter also referred to as memory cell transistor) is of the N-channel type, unless otherwise indicated, will be described below.

The operation for writing information into a memory cell is realized by applying a high voltage to the control gate 207 and the drain and injecting electrons into the floating gate 205 from the drain side by avalanche injection. As a result of such a write operation, the threshold voltage of a memory transistor viewed from the control gate 207 of the transistor rises compared to the memory transistor in an erase state when the write operation is not performed.

Figure 11B:
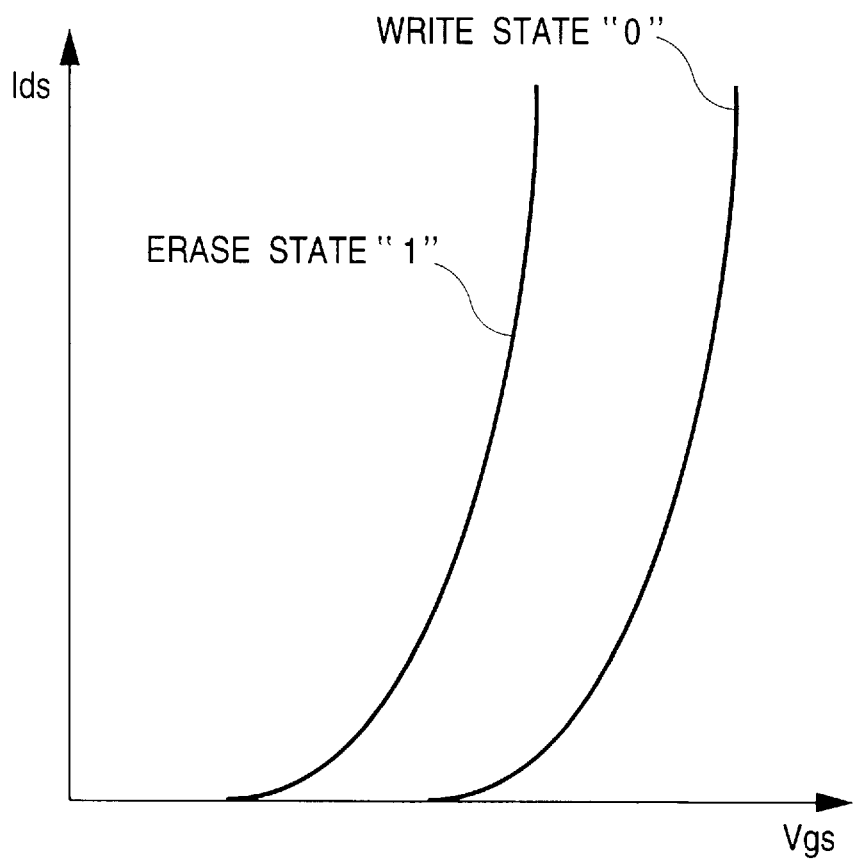
FIG. 11(B) is a characteristic diagram relating thereto.

The erase operation is realized by extracting electrons from the floating gate 205 to the source side by exploiting the tunnel phenomenon. As shown in FIG. 11(B), the threshold voltage of the memory transistor viewed from the control gate 207 of the transistor is lowered through the erase operation. In FIG. 11(B), the threshold of the memory cell transistor is set at a positive voltage level in both the write state and the erase state. That is, the threshold voltage in the write state is raised and the threshold voltage in the erase state is lowered for the word-line selection level supplied from a word line to the control gate 207. When both threshold voltages and the word-line selection level are in the above relation, it is possible to constitute a memory cell with a transistor without using a selection transistor. When electrically erasing stored information, the stored information is erased by extracting electrons accumulated in the floating gate 205 to the source electrode. Therefore, when the erase operation is continued for a relatively long time, electrons in an amount more than the electrons injected into the floating gate 205 are extracted when the write operation is performed. Therefore, when excessive erasing, in which electrical erasing is continued for a relatively long time, is performed, the threshold voltage of the memory cell transistor is set at a negative level and a failure occurs in that a word line is selected even at a non-selection level. Moreover, the write operation can be performed by using a tunnel current similar to the case of the erase operation.

In the case of a read operation, the voltages to be applied to the drain and control gate 207 are limited to relatively low values so that a weak write may not be performed for the above memory cell, that is, undesired carrier injection into the floating gate 205 is not performed. For example, a low voltage of approx. 1 V is applied to the drain, and, moreover, a low voltage of approx. 5 V is applied to the control gate 207. By detecting the magnitude of a channel current flowing through the memory cell transistor with the above applied voltages, it is possible to judge whether the logical value "0" or "1" of the information is stored in the memory cells.

Figure 12:
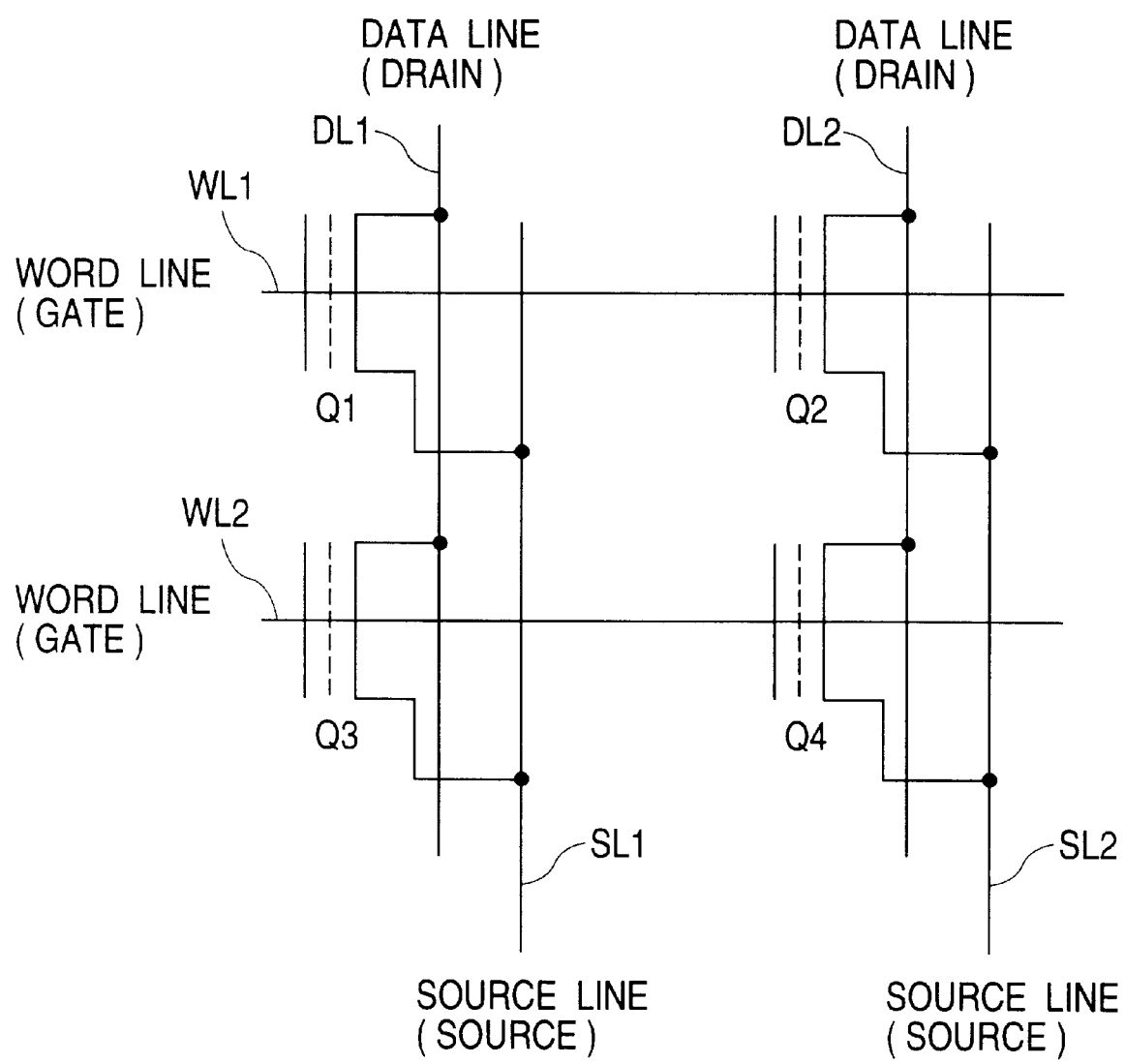
FIG. 12 is a circuit diagram showing a basic structure of a memory cell array of a flash memory.

FIG. 12 shows a schematic diagram of a memory cell array using the above memory cell transistor. FIG. 12 typically shows four memory cell transistors Q1 to Q4. In the case of memory cells arranged in X and Y directions, the control gates (memory cell selection gate) of the memory cell transistors Q1 and Q2 (Q3 and Q4) arranged in the same row are connected to a corresponding word line WL1 (WL2), and the drain regions (input/output nodes of memory cells) of the memory transistors Q1 and Q3 (Q2 and Q4) are connected to a corresponding data line DL1 (DL2). The source regions of the memory transistors Q1 and Q3 (Q2 and Q4) are connected to a source line SL1 (SL2).

Figure 14:
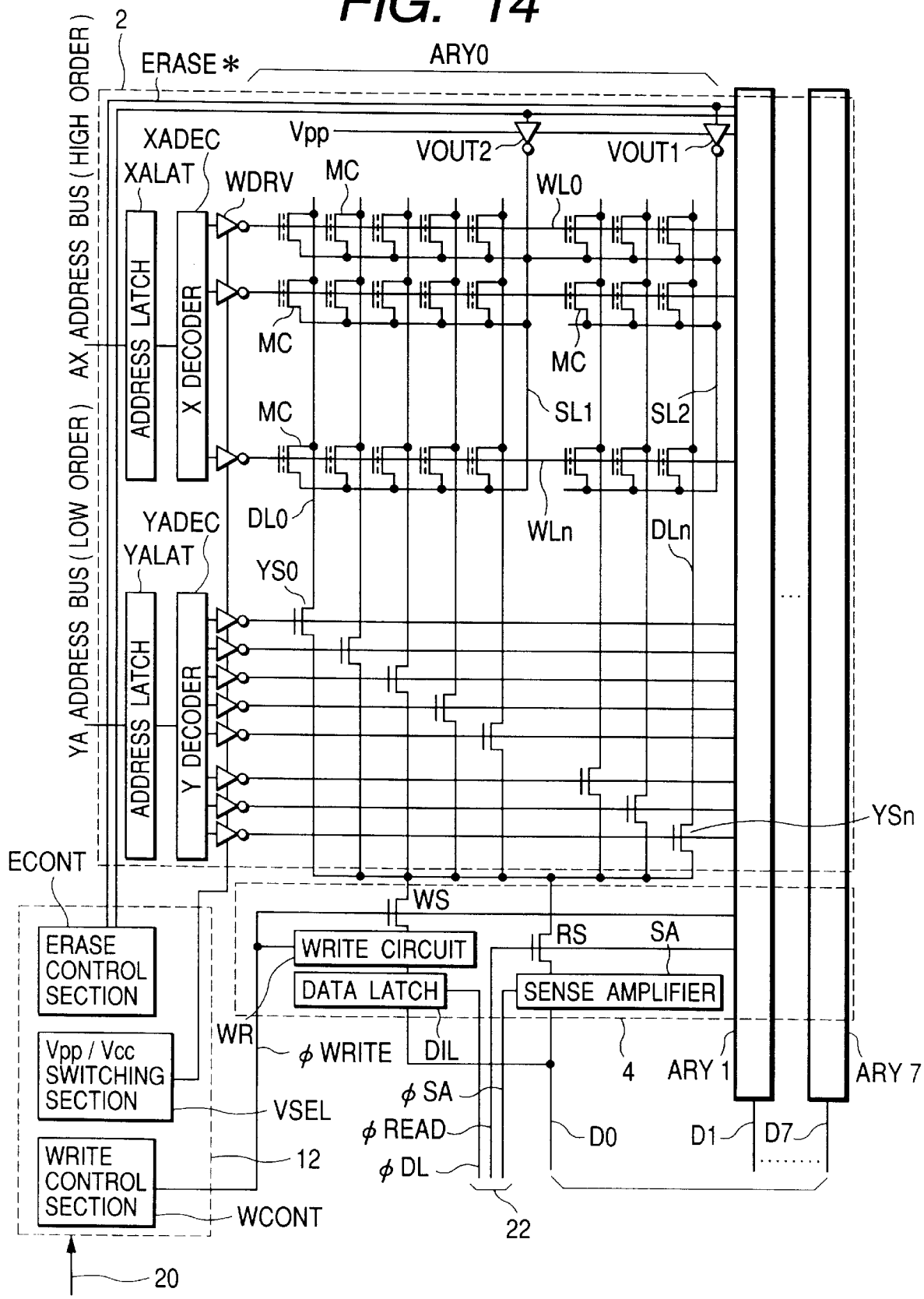
FIG. 14 is a circuit diagram of the write erase control circuit, memory block, and input/output circuit described referring to FIG. 1.

FIG. 13 shows a voltage condition for the erase operation and write operation of a memory cell. In FIG. 13, the memory cell is constituted by a memory cell transistor and the gate is a control gate serving as a gate for selecting the memory cell transistor. In FIG. 13, for negative-voltage-type erasing, a high electric field necessary for the erasing is generated by applying a negative voltage such as −10 V to a control gate. As understood from the voltage condition illustrated in FIG. 13, it is possible to simultaneously erase memory cells to which at least the source is connected in common in the case of positive-voltage-type erasing. Therefore, in the case of the structure in FIG. 12, when the source lines SL1 and SL2 are connected, four memory cells Q1 to Q4 can be simultaneously erased. In this case, by changing the number of memory cell transistors connected to the same source line, it is possible to optionally determine the size of a memory block. Source line dividing methods include a method of using a data line as a unit (common source line is extended in the data line direction), as illustrated in FIG. 14, and a method of using a word line as a unit common source line is extended in the word line direction). Moreover, in the case of negative-voltage-type erasing, it is possible to simultaneously erase the memory cells to which the control gate is connected in common.

FIG. 14 shows the write erase control circuit 12, memory block 2, and input/output circuit 4 described with reference to FIG. 1. The memory block 2 has 8-bit data terminals D0 to D7 and memory arrays ARY0 to ARY7 for every data terminal. Each of the memory arrays ARY0 to ARY7, though the invention is not so restricted, is divided into two parts for simultaneous erasing of blocks having the source lines SL1 connected in common. Though FIG. 14 typically shows details of only the memory array ARY0, other memory arrays ARY1 to ARY7 also have the same structure as the memory array ARY0.

Memory cells MC each comprising an insulating-gate-type field effect transistor having a two-layer gate structure described, as with reference to FIG. 11(A) are arranged on each of the memory arrays ARY0 to ARY7 like a matrix. In FIG. 14, WL0 to WLn denote word lines common to all memory arrays ARY0 to ARY7. Control gates of the memory cells arranged in the same row are connected to corresponding word lines. In each of the memory arrays ARY0 to ARY7, the drain regions of the memory cells MC arranged in the same column are connected to corresponding data lines DL0 to DLn. Moreover, the source regions of the memory cells MC constituting one simultaneous erasing block are connected to the source line SL1 in common and the source regions of the memory cells MC constituting the other simultaneous erasing block are connected to the source line SL2 in common.

A high voltage Vpp used for erasing is supplied to the source lines SL1 and SL2 from voltage output circuits VOUT1 and VOUT2. Output operations of the voltage output circuits VOUT1 and VOUT2 are selected by an erase control section ECONT.

The word lines WL0 to WLn are selected by decoding an X address signal AX captured through an X address latch XALAT by an X address decoder XADEC. A word driver WDRV drives a word line in accordance with the selection signal output of the X address decoder XADEC. For a data read operation, the word driver WDRV is operated by using a voltage Vcc, such as 5 V, supplied from a voltage selection circuit VSEL and a ground voltage, such as 0 V, as its power supply, to drive a word line to be selected at a selection level by the voltage Vcc and to keep a word line not to be selected at a non-selection level, such as the ground voltage. For a data write operation, the word driver WDRV is operated by using a voltage Vpp, such as 12 V, supplied from the voltage selection circuit VSEL and a ground voltage, such as 0 V, as its power supply, to drive a word line to be selected at a writing high voltage level such as 12 V. For a data erase operation, the output of the word driver WDRV is set at a low voltage level, such as 0 V.

In the case of each of the memory arrays ARY0 to ARY7, the data lines DL0 to DLn are connected in common through Y selection switches YS0 to YSn. Switching control by the Y selection switches YS0 to YSn is performed by decoding a Y address signal AY captured through a Y address latch YALAT by a Y address decoder YADEC. The output selection signals of the Y address decoder YADEC are supplied to all the memory arrays ARY0 to ARY7 in common. Therefore, because one of the output selection signals of the Y address decoder YADEC is brought to a selected level, one data line is connected to a common data line CD in each of the memory arrays ARY0 to ARY7.

The data read out of the memory cells MC through the Y selection switches is supplied to the sense amplifier SA through a selection switch RS and is amplified by the sense amplifier SA and output. The selection switch RS is set at a selection level synchronously with the read operation. The write data supplied from an external unit is held in a data input latch DIL. When the data held in the data input latch DIL is "0", a write circuit WR supplies a writing high voltage through a selection switch WS. The writing high voltage is supplied through a data line selected by the Y address signal AY to the drain of a memory cell to whose control gate a high voltage is applied, and, thereby, data is written in the memory cell. The selection switch WS is set at a selection level synchronously with the write operation. Various timings for writing and erasing and voltage selection control are generated by a write erase control circuit WECONT. Symbol φREAD denotes the switch control signal of the switch RS, φDIL denotes the latch control signal of the data latch DL, and φSA denotes the activation control signal of the sense amplifier SA, and these signals are included in the control signal 22. Symbol φWRITE denotes the switch control signal of the switch WS.

Figure 15:
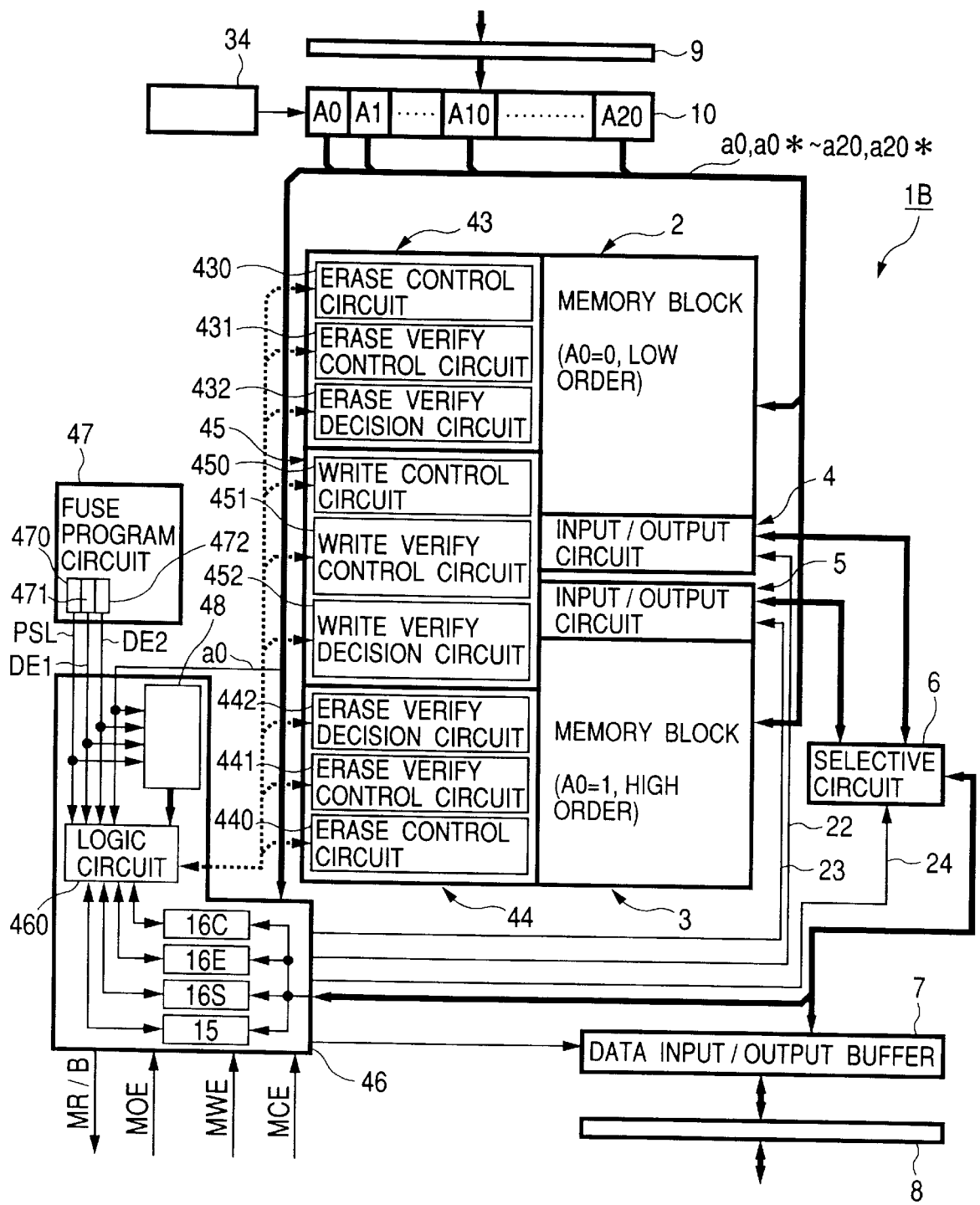
FIG. 15 is a block diagram of a flash memory representing a third embodiment of the present invention.

FIG. 15 is a block diagram of a flash memory 1B representing a third embodiment of the present invention. The flash memory shown in FIG. 15 is for a semiconductor substrate made of, for example, single-crystal silicon using a semiconductor integrated circuit fabrication technique. The flash memory 1B of this embodiment is provided with two memory blocks 2 and 3 in each of which electrically erasable nonvolatile memory cells are arranged in the form of a matrix. The memory blocks 2 and 3 each have a memory cell array in which flash memory cells each comprising a two-layer insulating-gate field effect transistor are arranged in a matrix configuration, an address decoder for selecting a flash memory cell, and a selection switch circuit. Data is written into or read from the memory blocks 2 and 3 in units of 8 bits (1 byte) in the case of this embodiment. Data is input to or output from the memory blocks 2 and 3 by input/output circuits 4 and 5 in units of one byte. Either of the input/output circuits 4 and 5 may be connected to a data input/output buffer 7 through the selector 6. The data input/output buffer 7 is connected to an external data input/output terminal 8 to transfer data to and from an external unit. The address signals A0 to A20 for selecting memory cells are supplied to the memory blocks 2 and 3 from an external address input terminal 9 through an address input buffer 10. The address input buffer 10 functions as an address latch circuit and holds a write address as it is so that the write address can be used as a write verify address. In this case, the address signals A0 to A20 are used for byte addresses. The least significant bit A0 is regarded as information representing which of the memory blocks 2 or 3 is designated. In the case of this embodiment, the memory blocks 2 and 3 each have a memory capacity of 1M bytes.

In FIG. 15, symbols 43, 44, 45, and 46 denote circuit blocks for controlling rewrite or read of information for memory cells of the memory blocks 2 and 3 in accordance with an instruction from an external unit. Symbol 43 denotes an erase circuit exclusively used for the memory block 2. Symbol 44 denotes an erase circuit exclusively used for the memory block 3. Symbol 45 denotes a write circuit used for the memory blocks 2 and 3 in common. Symbol 46 denotes a timing controller for controlling the whole flash memory. The timing controller 46 is connected to the erase circuits 43 and 44 and the write circuit 45 through a signal line group 47.

The erase circuit 43 comprises an erase control circuit 430, an erase verify control circuit 431 and an erase verify decision circuit 432. Moreover, the erase circuit 44 comprises an erase control circuit 440, an erase verify control circuit 441 and an erase verify decision circuit 442. The write circuit 45 comprises a write control circuit 450, a write verify control circuit 451 and a write verify decision circuit 452.

The timing controller 46 receives output enable signal MOE, write enable signal MWE and chip enable signal MCE, typically shown as external access control signals. The timing controller 46 has a command register 15 to which a command supplied from an external unit through the data input/output buffer 7 is set to generate internal control signals corresponding to an operation mode, such as erase, erase verify, write, write verify, or data read, by decoding the command. Symbol 460 denotes a logic circuit for generating the internal control signals by decoding the command. The signals MOE, MCE, and MWE are supplied to the logic circuit 460. Though the invention is not so restricted, the control signal MWE is provided for ordering the writing of a command into the command register. The control signal MOE is provided for ordering a read operation. The control signal MCE is provided for ordering chip selection.

The erase operation can be performed for every block, for example, every 512 bytes. Designation of a block to be erased, though the invention is not so restricted, is performed in accordance with 12-bit address signals A9 to A20. That is, when an erase command is written in the command register 15, the address information of an erase start block specified by the address signals A9 to A20 (actually, one of internal complementary address signals having the same logical value) is set in an erase start block designation register 16S and the address information of an erase end block specified by the address signals A9 to A20 is set in an erase end block designation register 16E. Symbol 16C denotes a counter in which the address signals A9 to A20 set in the erase start block designation register 16S is preset. Until the value of the counter coincides with the address signal set in the erase block end register, the counter is incremented at each erase operation. The timing controller 46 successively supplies control signals for designating the-erase and verify operations to the erase circuits 43 and 44, starting with the erase start block set in the register 16S to the erase end block set in the register 16E. Particularly, in the case of this embodiment, A0 is used as the least significant bit of an address signal for defining a memory space and the least significant bit is used as a signal for separating the memory blocks 2 and 3 from each other. Therefore, the storage region of 512 bytes erased at a time extends over both the memory blocks 2 and 3. In this case, the erase circuits 43 and 44 are exclusively used for the memory blocks 2 and 3. Therefore, in the case of this embodiment, the erase operation for each block is performed in both of the memory blocks 2 and 3 in parallel. However, this erase operation is performed only in the case of a complete composite conforming circuit.

When a write command is set in the command register 15, the timing controller 46 supplies a control signal for writing the write data supplied through the data input/output buffer 7 into memory cells designated by, for example, the address signals A0 to A20 to the write circuit 45. The write operation, though the invention is not so restricted, is performed in units of one byte and the writing of byte data is performed in either of the memory blocks designated by the address signals A0 to A20.

In the case of this embodiment, the least significant address signal A0, as described above, is regarded as a signal representing which is selected, the memory block 2 or 3, in accordance with the logical value of the signal A0. For example, if A0=0, the memory block 2 is selected; if A0=1, the memory block 3 is selected. In the case of this embodiment, selection of a memory block by A0 means the selection of a memory cell by an address decoder included in the memory block 2 or 3. Therefore, when A0 included in an address signal is 0, memory cells included in the memory block 2 are regarded as access objects. When A0 is 1, memory cells included in the memory block 3 are regarded as access objects.

Symbols a0, a0* to a20, and a20* denote the internal complementary address signals of the address signals A0 to A20. Reference numeral 22 denotes a control signal for the input/output circuit 4, reference numeral 23 denotes a control signal for the input/output circuit 5, and reference numeral 24 denotes a control signal for the selection circuit 6.

The flash memory of this embodiment is used as a partial product when either of the memory blocks 2 and 3 has an irremediable defect. The flash memory of this embodiment is provided with a fuse program circuit 47 in order to make two partial products completely compatible with a complete composite conforming circuit, and, moreover, the timing controller 46 is provided with an inhibit condition decision circuit 48.

Though the invention is not so restricted, the fuse program circuit 47 has a fuse circuit 470 for outputting a signal PSL to be set at low level by the blowing of a fuse and representing that the flash memory is a partial product, a fuse circuit 471 for outputting a signal DE1 to be set at a low level by the blowing of a fuse and representing that the memory block 2 has an irremediable defect, and a fuse circuit 472 for outputting a signal DE2 to be set at a low level by the blowing of a fuse and representing that the memory block 3 has an irremediable defect. The signals PSL, DE1, and DE2 are supplied to the inhibit condition decision circuit 48 and the logic circuit 460. The inhibit condition decision circuit 48 and the logic circuit 460 inhibit the erase, write, and read operations for an irremediable memory block in accordance with the signals DE1 and DE2, only when the signal PSL indicates that the flash memory is a partial product. The inhibit condition decision circuit 48 is an example of the detection means for detecting access to a defective memory block designated by the fuse program circuit 47 in accordance with an address signal.

The logic circuit 460 brings a ready/busy signal $F_r/B$ to a ready state and outputs it to an external unit when inhibiting the erase or write operation of the memory block. The ready-state ready/busy signal MR/B is used as a status signal representing the completion of the rewrite operation.

Figure 16:
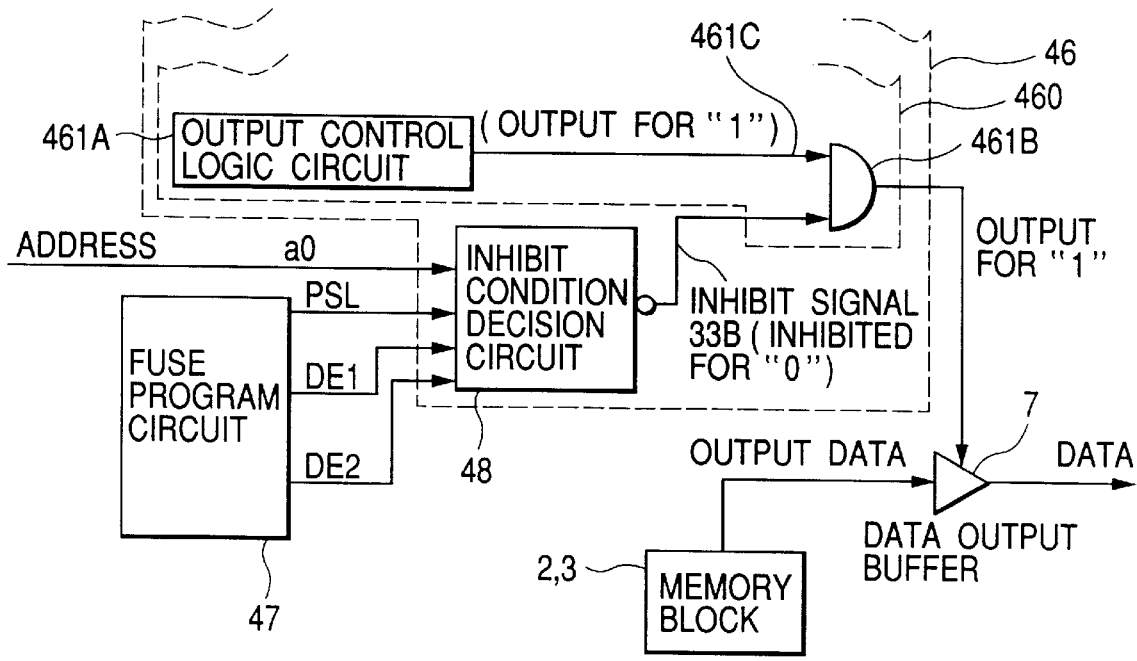
FIG. 16 is a circuit diagram showing a circuit for inhibiting the output operation of a data input/output buffer 7 in accordance with the set state of a fuse program circuit.

FIG. 16 shows a circuit for inhibiting the output operation of the data input/output buffer 47 in accordance with the set state of the fuse program circuit 47. In FIG. 16, reference numeral 461A denotes an output control logic circuit and reference numeral 461B denotes an AND gate which is included in the logic circuit 460. When the data read mode is set up in accordance with a command, the output control logic circuit 461A generates a timing signal 461C for outputting the read data supplied from a memory cell to an external unit. The AND gate 461B receives two signals, the timing signal 461C and an inhibit signal 33B, supplied from the inhibit condition decision circuit 48 to control the output operation of the data input/output buffer 7 by means of its output.

Figure 21:
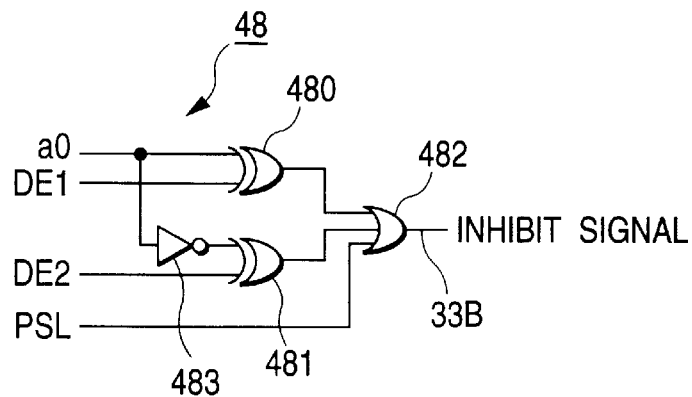
FIG. 21 is a circuit diagram showing an inhibit condition decision circuit.

The inhibit condition decision circuit 48, as shown in FIG. 21, comprises exclusive OR circuits 480 and 481, an OR circuit 482, and an inverter 483. When the flash memory is not a partial product (PSL=1), the inhibit signal 33B is normally set at an inactivation level (high level). Therefore, the output operation of the data input/output buffer 7 is not inhibited at all. When the flash memory is a partial product (PSL=0), if the fuse of the fuse circuit 471 is blown and the signal DE1 is set at 0 (in this case, it is a matter of course that DE2 is set at 1), and when the memory block 2 is irremediable, the inhibit signal 33B is set at an activation level (low level) when a0=0 (access to the memory block 2), while the signal 33B is set at an inactivating level (low level) when a0=1 (access to the memory block 3). Moreover, when the flash memory is a partial product (PSL=0) and the memory block 3 is irremediable, and when the fuse of the fuse circuit •472 is blown and the signal DE2 is set at 0 (in this case, it is a matter of course that DE1 is set at 1), the inhibit signal 33B is set at an activation level (low level) when a0=1 (access to the memory block 3), while the signal 33B is set at an inactivating level (low level) when a0=0 (access to the memory block 2).

Therefore, even if the read operation access to the memory block 2 is ordered (a0=0) when the flash memory is a partial product (PSL=0) in which the memory block 2 is defective (DE1=0), the output operation of the data input/output buffer 7 is inhibited. Similarly, even if the read operation access to the memory block 3 is ordered (a0=1) when the flash memory is a partial product (PSL=0) in which the memory block 3 is a defective (DE2=0), the output operation of the data input/output buffer 7 is inhibited.

Figure 17:
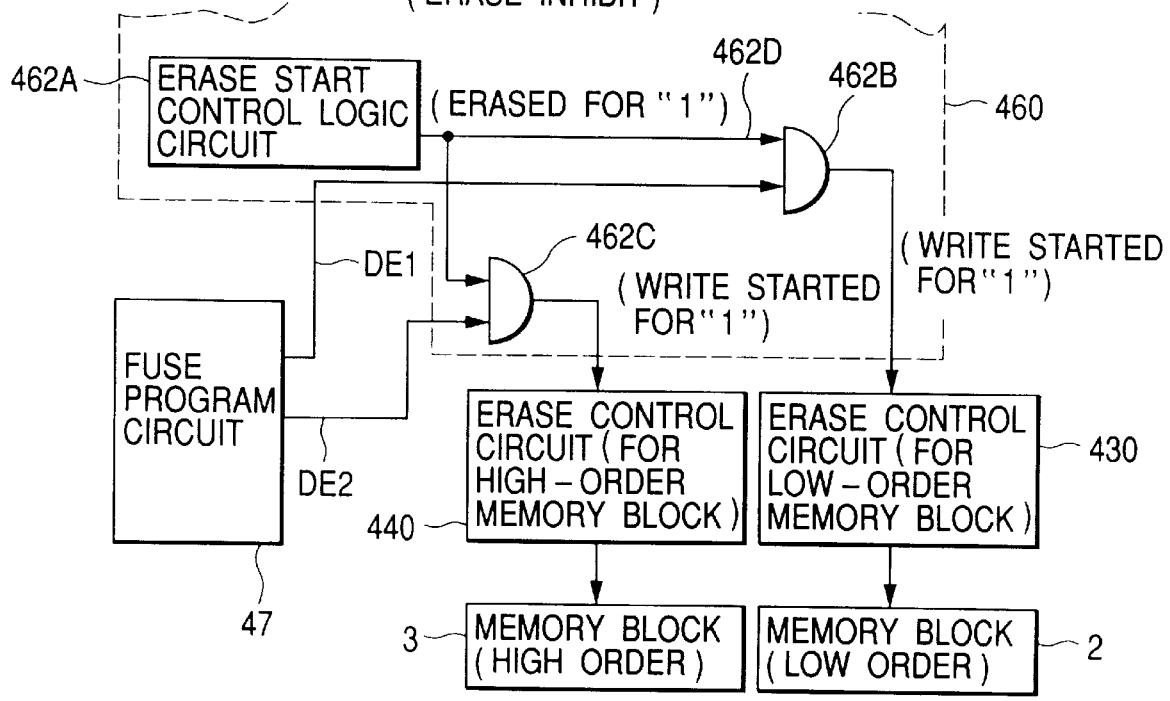
FIG. 17 is a circuit diagram showing a circuit for inhibiting the operation of an erase control circuit in accordance with the set state of a fuse program circuit.

FIG. 17 shows a circuit for inhibiting operation of the erase control circuits 430 and 440 in accordance with the set state of the fuse program circuit 47. In FIG. 17, reference numeral 462A denotes an erase start control logic circuit, and reference numerals 462B and 462C denote AND gates which are included in the logic circuit 460. When the erase mode is set up by a command, the erase start control logic circuit 462A generates an erase-operation start timing signal 462D. The AND gate 462B receives two signals, the timing signal 462D and the signal DE1, to inhibit the start of the erase control circuit 430 assigned to the memory block 2 when the memory block 2 is defective (DE1=0). The AND gate 462C receives two signals, the timing signal 462D and the signal DE2, to inhibit the start of the erase control circuit 440 assigned to the memory block 3 when the memory block 3 is defective.

Figure 18:
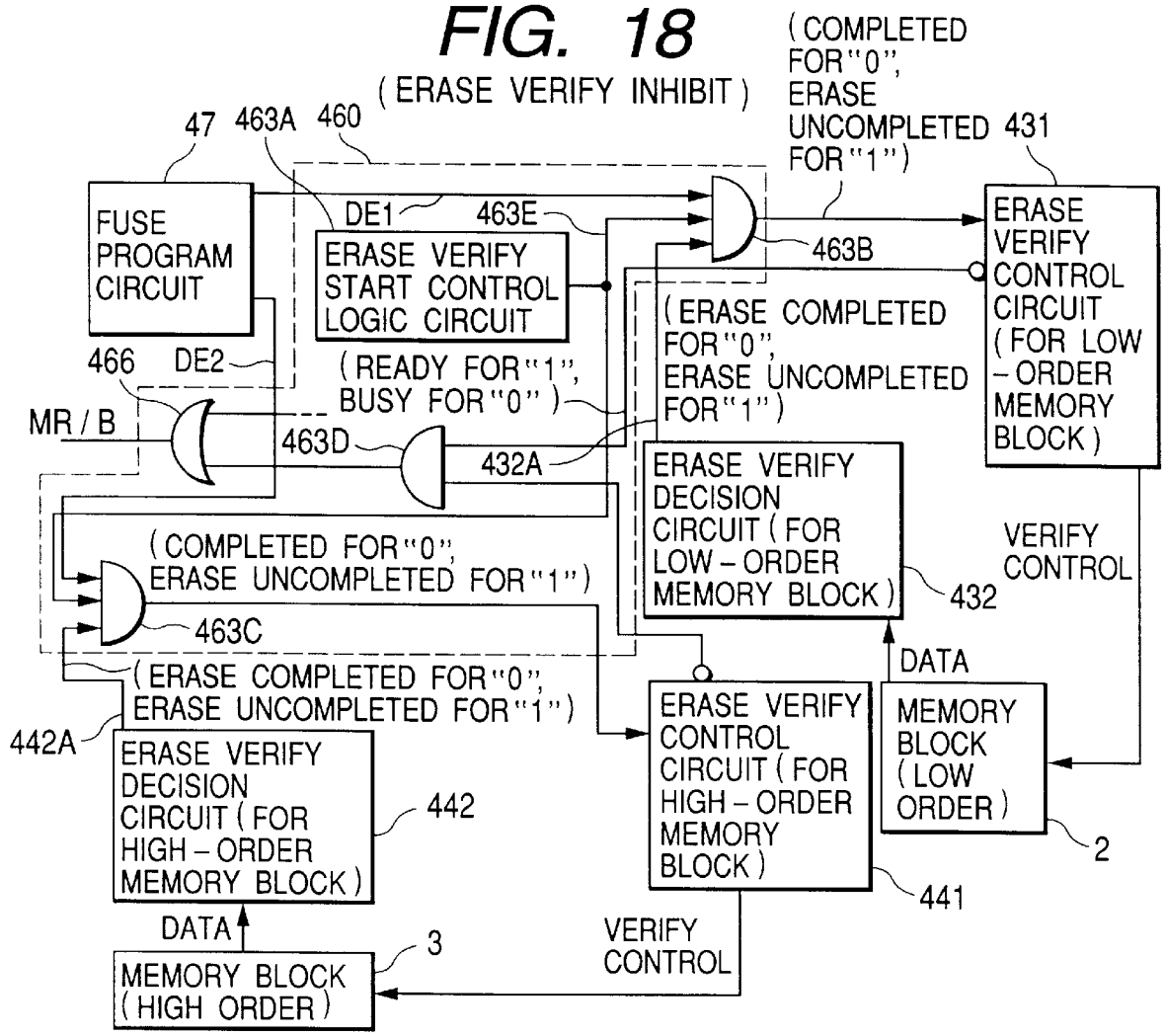
FIG. 18 is a circuit diagram showing a circuit for inhibiting the operation of an erase verify control circuit in accordance with the set state of a fuse program circuit.
Figure 22:
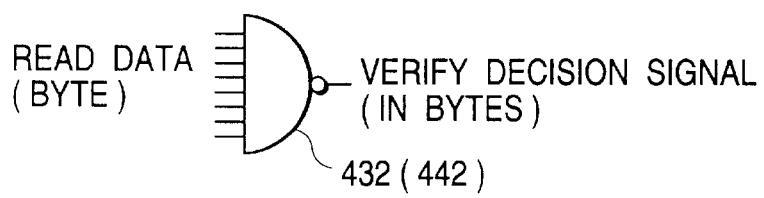
FIG. 22 is a circuit diagram showing an erase verify decision circuit.

FIG. 18 shows a circuit for inhibiting the operation of the erase verify control circuits 431 and 441 in accordance with the set state of the fuse program circuit 47. In FIG. 18, reference numeral 463A denotes an erase verify start control circuit and reference numerals 463B, 463C and 463D denote AND gates which are included in the logic circuit 460. When the erase mode is set up in accordance with a command, the erase verify start control logic circuit 462A generates a start timing signal 463E for the erase verify operation. When the erase verify operation is started, the erase verify control circuit 431 (441) instructs the erase block of the corresponding memory block 2 (3) to read data in units of one byte. The read data is supplied to the erase verify decision circuit 432 (442) and it is judged whether the data is used as the logical value in an erase state. As shown in FIG. 22, it is possible to constitute the erase verify decision circuit 432 (442) with a logic circuit equivalent to an eight-input NAND gate. The erase verify decision circuit 432 (442) inverts the logical value of an output signal 432A (442A) from "1" to "0" by detecting that all memory cells of a block to be erased are brought into an erase state.

The AND gate 463B receives three signals 463E, DE1, and 432A to inhibit the start of operation of the erase verify control circuit 431 assigned to the memory block 2 when the memory block 2 is defective (DE1=0). That is, the output state of the AND gate 463B is kept in the completed erase state (logical value "0" is output). The AND gate 463C receives three signals 463E, DE2, and 442A to inhibit the start of the erase verify control circuit 431 assigned to the memory block 3 when the memory block 3 is defective (DE1=0). That is, the output state of the AND gate 463C is kept in the completed erase state (logical value "0" is output). The AND gate 463D receives two signals output from the erase verify control circuits 431 and 441 when the erasing of the data in all blocks to be erased is completed. The output of the AND gate 463D is supplied to an OR gate 466. The OR gate 466 is a circuit equivalent to a circuit comprising the busy status generator 140, transistor 36, and resistor 35 described with reference to FIG. 4. The OR gate 466 outputs the ready/busy signal MR/B.

Figure 19:
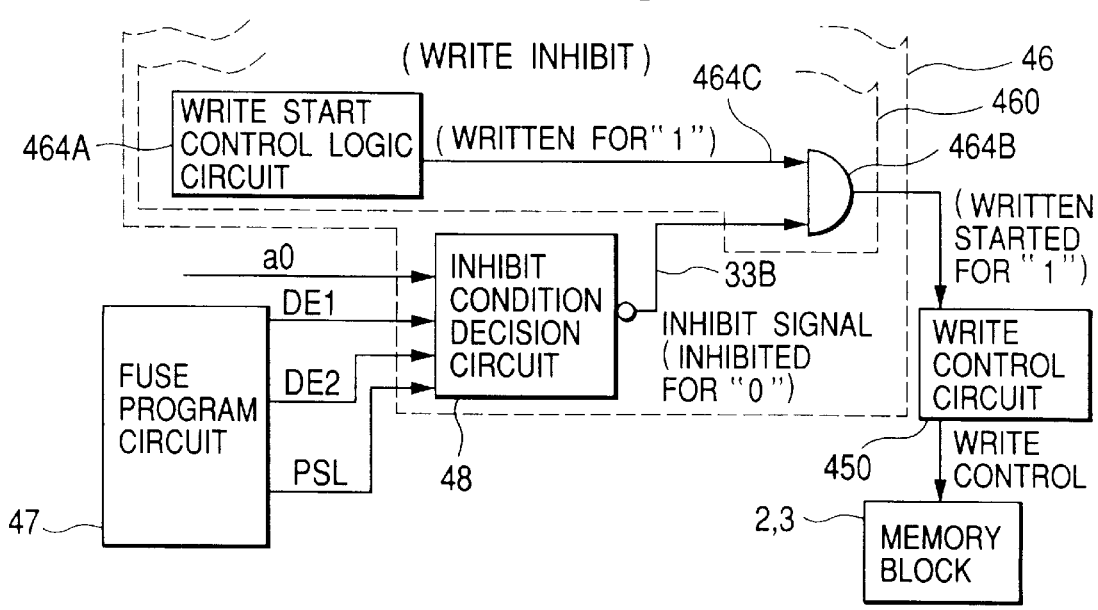
FIG. 19 is a circuit diagram showing a circuit for inhibiting the operation of a write control circuit in accordance with the set state of a fuse program circuit.

FIG. 19 shows a circuit for inhibiting the operation of the write control circuit 450 in accordance with the set state of the fuse program circuit 47. In FIG. 19, reference numeral 464A denotes a write start control circuit and reference numeral 464B denotes an AND gate, and these circuits are included in the logic circuit 460. When the write mode is set up in accordance with a command, the write start control circuit 464A generates a timing signal 464C for starting the write operation of a memory cell. The AND gate 464B receives two signals, the timing signal 464C and the inhibit signal 33B, sent from the inhibit condition decision circuit 48 to control the start of the write operation of the write control circuit 450 by means of its output.

The inhibit condition decision circuit 48 is constituted as described above. Therefore, when a partial product is used (PSL=0) in which the memory block 2 is defective (DE=0), even if memory cells of the memory block 2 are designated as a write object when a0=0, the start of the write control circuit 450 is inhibited. Similarly, when a partial product is used (PSL=0) in which the memory block 3 is defective (DE=1), even if memory cells of the memory block 3 are designated as a write object when a0=1, the start of the write control circuit 450 is inhibited.

Figure 20:
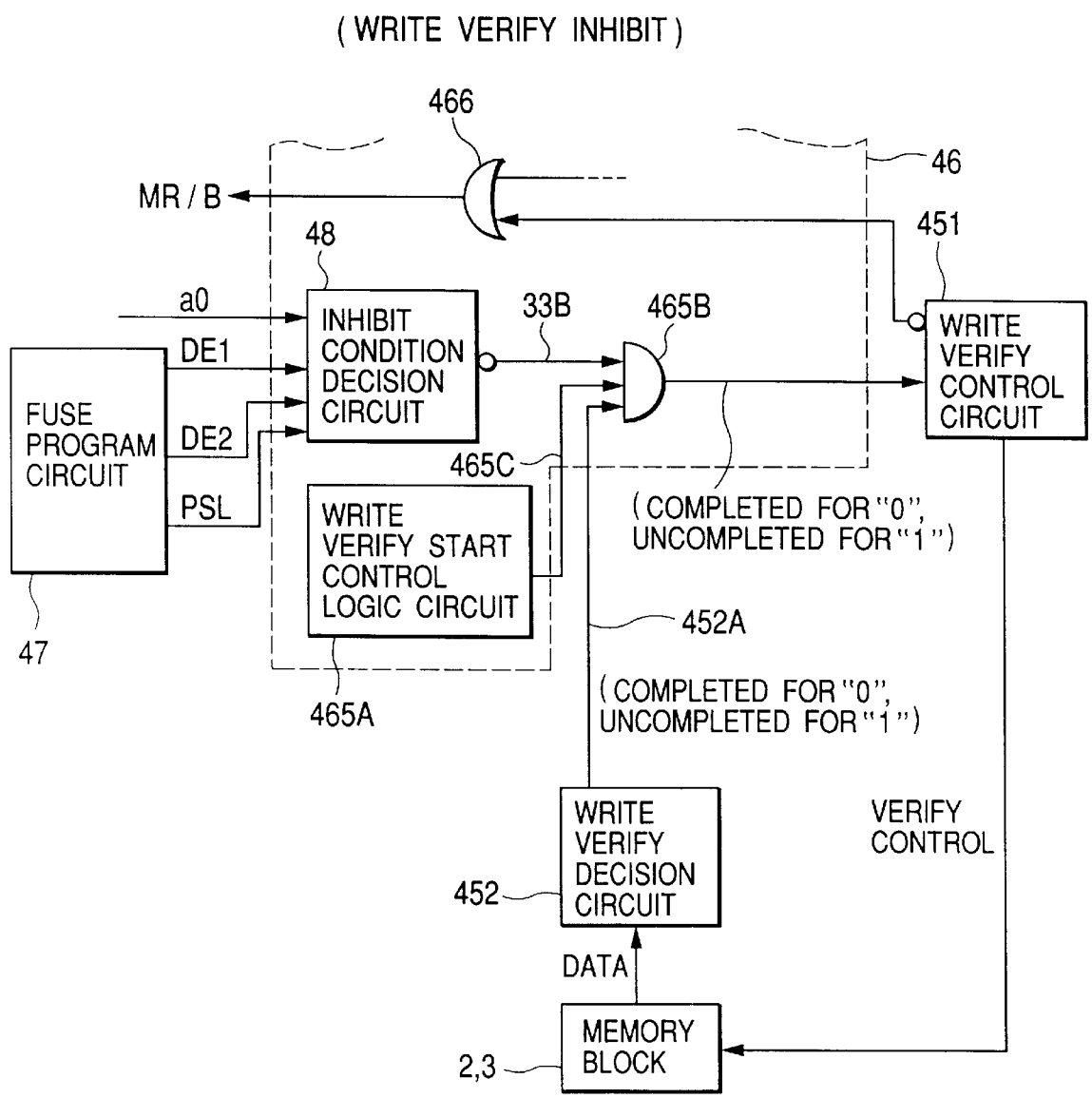
FIG. 20 is a circuit diagram showing a circuit for selectively inhibiting the operation of a write verify circuit in accordance with the set state of a fuse program circuit.
Figure 23:
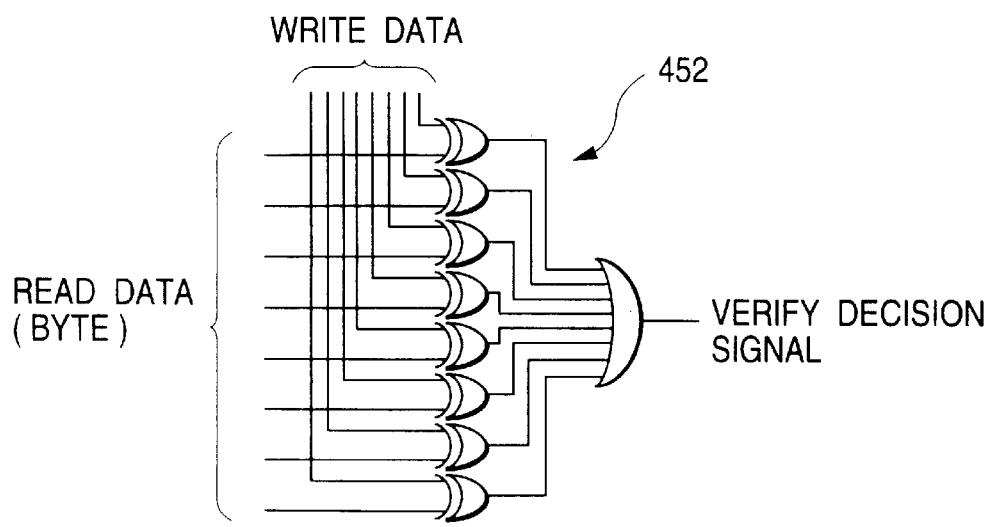
FIG. 23 is a circuit diagram showing a write verify decision circuit.

FIG. 20 shows a circuit for selectively inhibiting the operation of the write verify control circuit 451 in accordance with the set state of the fuse program circuit 450. In FIG. 20, symbol 465A denotes a write verify start control logic circuit and 465B denotes an AND gate, and these circuits are included in the timing controller 46. When the data write mode is set up in accordance with a command, the write verify start control logic circuit 465A generates a timing signal 465C for starting the write verify operation. When the write verify operation is started, the write verify control circuit 451 reads data from a write operated address. The read data is supplied to the write verify decision circuit 452 and tit is judged whether or not the data coincides with the logical value of write data. As shown in FIG. 23, it is possible to constitute the write verify decision circuit 452 with an exclusive OR circuit and an OR gate which compare the write data supplied from an external unit with the data read out of memory cells after being written in a bit-correspondence way.

The write verify decision circuit 452 inverts the logical value of a verify decision signal 452A from "1" to "0" by detecting the coincident state of write data with read data (completed write state).

The AND gate 465B receives three signals, the verify decision signal 452A, the inhibit signal 33B and the start signal 465C, to inhibit the start of operation of the write verify control circuit 451, similar to the case of the write control circuit 450, even if memory cells of the memory block 2 are designated as a write object when a0=0, when the flash memory is a partial product (PSL=0) in which the memory block 2 is defective (DE=0). That is, the output state of the AND gate 465B is kept in the completed write state (logical value "0" is output) by the low-level inhibit signal 33B. Moreover, the AND gate 465B inhibits the start of operation of the write verify control circuit 451, similar to the case of the write control circuit 450, even if memory cells of the memory block 3 are designated as a write object when a0=1, when the flash memory is a partial product (PLS=0) in which the memory block 3 is defective (DE=1). That is, the output state of the AND gate 465B is kept in the completed write state (logical value "0" is output) by the low-level inhibit signal 33B.

This embodiment is also provided with the fuse program circuit 34 capable of inverting the logical value of the address signal A0 similarly to the case of FIG. 1.

Figure 24:
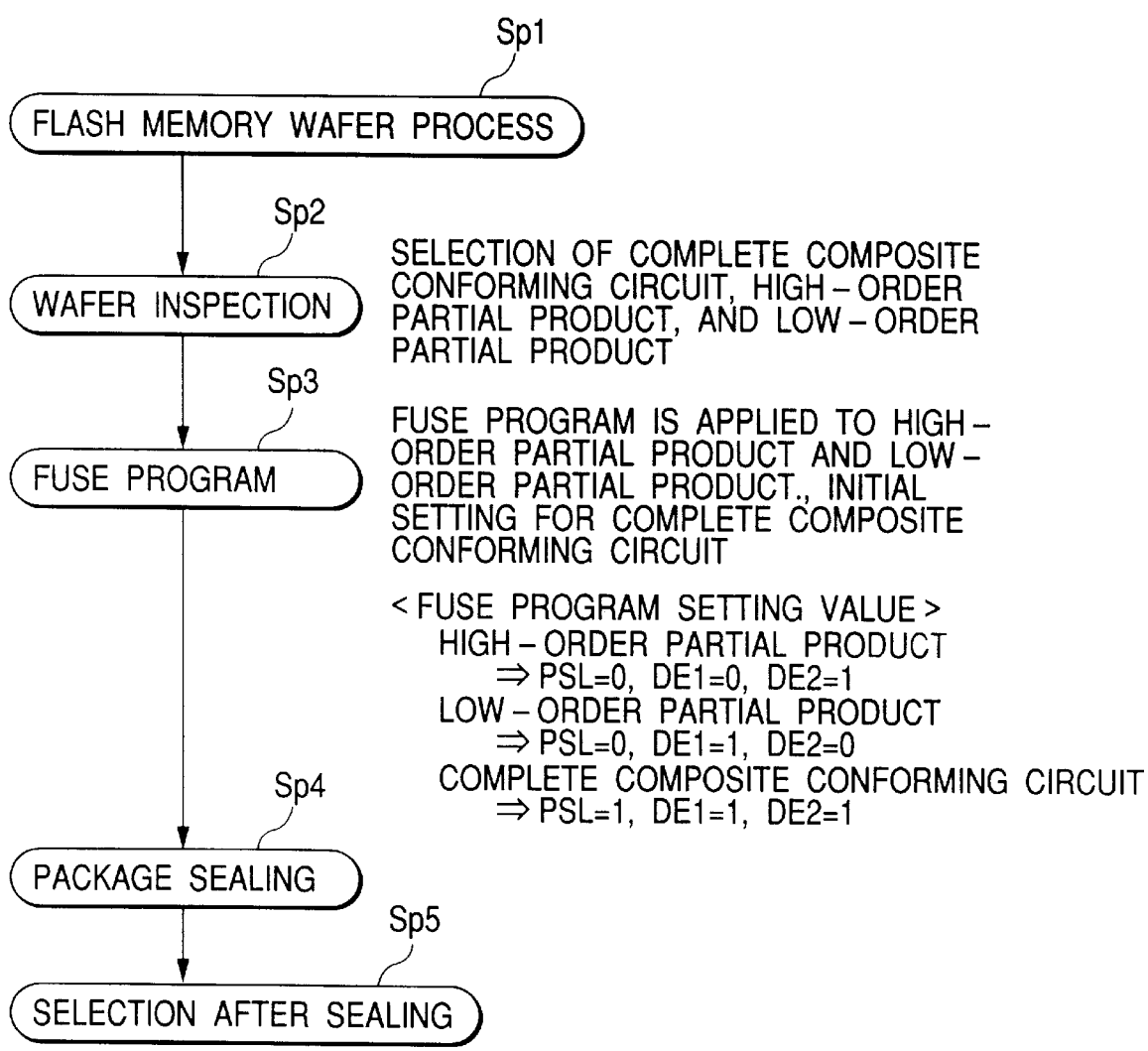
FIG. 24 is a flowchart schematically showing the fabrication process of a flash memory.

FIG. 24 schematically shows the fabrication process of the flash memory shown in FIG. 15. The flash memory is passed through the wafer process (Sp1) for forming various circuits described with reference to FIG. 15 on a wafer, such as a single-crystal silicon substrate, and, thereafter, undergoes device tests including a function test (Sp2). Thereby, flash memory chips are sorted into complete composite conforming circuits, high-order partial products (only the memory block 3 has an irremediable defect), low-order partial products (only the memory block 2 has an irremediable defect), and defective products. Moreover, the fuse program circuit is provided depending on the sort result (Sp3). In the embodiment in FIG. 15, PSL is set at 1, DE1 is set at 1, and DE2 is set at 1 in the case of a complete composite conforming circuit; PSL is set at 0, DE1 is set at 1, and DE2 is set at 0 in the case of a low-order partial product; and PSL is set at 0, DE1 is set at 0, and DE2 is set at 1 in the case of a high-order partial product. The set state of a complete composite conforming circuit corresponds to the initial state of a fuse program circuit. Thereafter, each flash memory chip is sealed in a package depending on the sorted state (Sp4) and undergoes a sorting test after being sealed (Sp5), and thus it is completed. Chips of complete composite conforming circuits are sealed one by one. In the case of partial product chips, a high-order partial product and a low-order partial product are paired and sealed as, for example, the memory device described with reference to FIGS. 3(A) and 4. When there is a difference between the number of high-order partial products and the number of low-order partial products, it is possible to cope with the fact in a way similar to the above by changing the state of the fuse program circuit 34 for part of the larger number of chips.

FIGS. 25(A) to 25(C) relates to a procedure for effecting the erase operation of a complete composite conforming circuit of the flash memory 1B shown in FIG. 15. In the address map of the flash memory shown in FIG. 25(A), symbols #0, #1, . . . denote byte addresses. In the case of the flash memory 1B in FIG. 15, the least significant address bit A0 is regarded as memory block selecting information. Therefore, an erase block of 512 bytes extends over both the memory blocks 2 and 3. The set state of the fuse program circuit 47 of a complete composite conforming circuit is as described above.

As shown in FIG. 25(C), the flash memory is brought into a command waiting state after the power supply is turned on (Se1). Commands, as shown in Se2 to Se4, are set by dividing them into a first command, a second command, and a third command. The first command is a command for designating an erase start block, and the erase start block is set in the register 16S as address information A9 to A20. For example, the erase block 1 shown in FIG. 25(A) is designated as the erase start block. The second command is a command for designating an erase end block, and the erase end block is set in the register 16E as address information A9 to A20. For example, the erase block 3 shown in FIG. 25(A) is designated as the erase end block. The third command is a command for ordering the erase operation and set in the register 15. When the setting of the above commands is completed, the erase operation of the erase block 1 is started (Se5). The erase operation of the memory blocks 2 and 3 is performed in parallel. That is, the simultaneous erase operation (Se6) for 256 bytes constituting the erase block 1 in the memory block 2 (also referred to as low-order memory block 2) and the simultaneous erase operation (Se7) for 256 bytes constituting the erase block 1 in the memory block 3 (also referred to as high-order memory block 3) are performed in parallel and the erase verify operation is performed for each erase operation (Se8 and Se9). By confirming that all memory cells of a block to be erased are brought into an erased state through an erase verify operation, the erase operation of one erase block is ended. When there is a memory cell which cannot be finally brought into an erased state, the erase operation is regarded as abnormally ended (Se10). When the erase operation for one erase block is normally ended, the counter 16C is incremented to increment the block number to be erased (erase block No.) to the next block number (Se11) and judges whether or not the erase block number is smaller than the block number of the erase end block (Se12). When the former is smaller than the latter, the processing of the next erase block is carried out from the above step Se5. Then the former is not smaller than the latter, the internal processing for erasing is ended (Se13).

FIGS. 26(A) to 26(C) relate to a procedure for effecting the erase operation of the low-order partial product of the flash memory 1B shown in FIG. 15. The set state of the fuse program circuit 47 of the low-order partial product is as described above. In this case, because the high-order memory block 3 is defective, as shown in FIG. 26(B), the byte addresses of the defective portions are alternately arranged as shown by the address map of FIG. 26(A). This is because the least significant address bit A0 of the flash memory of FIG. 15 is regarded as memory block selecting information.

In the case of the erase operation procedure shown in FIG. 26(C), the processings at steps Se7 and Se9 are different from those of FIG. 25(C), in which the erase operation and verify operation of the high-order memory block 3 are inhibited. That is, as described with reference to FIGS. 17 and 18, the signal DE2 output from the fuse program circuit 47 is set at a low level with the result that these processings are inhibited.

FIGS. 27(A) to 27(C) relate to a procedure for implementing the erase operation for the high-order partial product of the flash memory 1B shown in FIG. 15. The set state of the fuse program circuit 47 of the high-order partial product is as described above. In this case, because the low-order memory block 2 is defective, as shown in FIG. 27(B), the byte addresses of the defective portions are alternately arranged as shown by the address map of FIG. 27(A).

In the case of the erase operation procedure shown in FIG. 27(C), the processings at steps Se6 and Se8 are different from those of FIG. 25(C), in which the erase operation and erase verify operation for the low-order memory block 2 are inhibited. That is, as described with reference to FIGS. 17 and 18, the signal DE1 output from the fuse program circuit 47 is set at a low level with the result that these processings are inhibited.

Figure 28A:
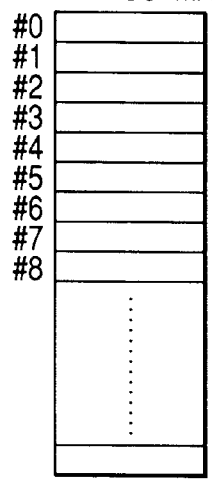
FIG. 28(A) is a diagram of an address map.
Figure 28B:
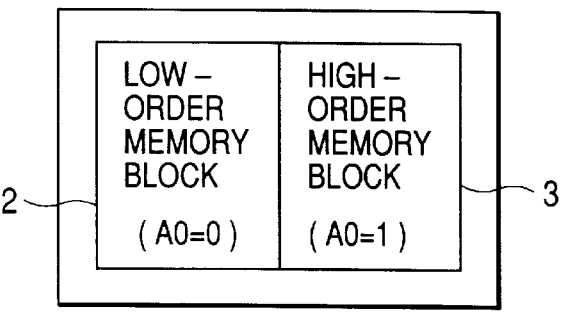
FIG. 28(B) is a diagram of a flash memory.
Figure 28C:
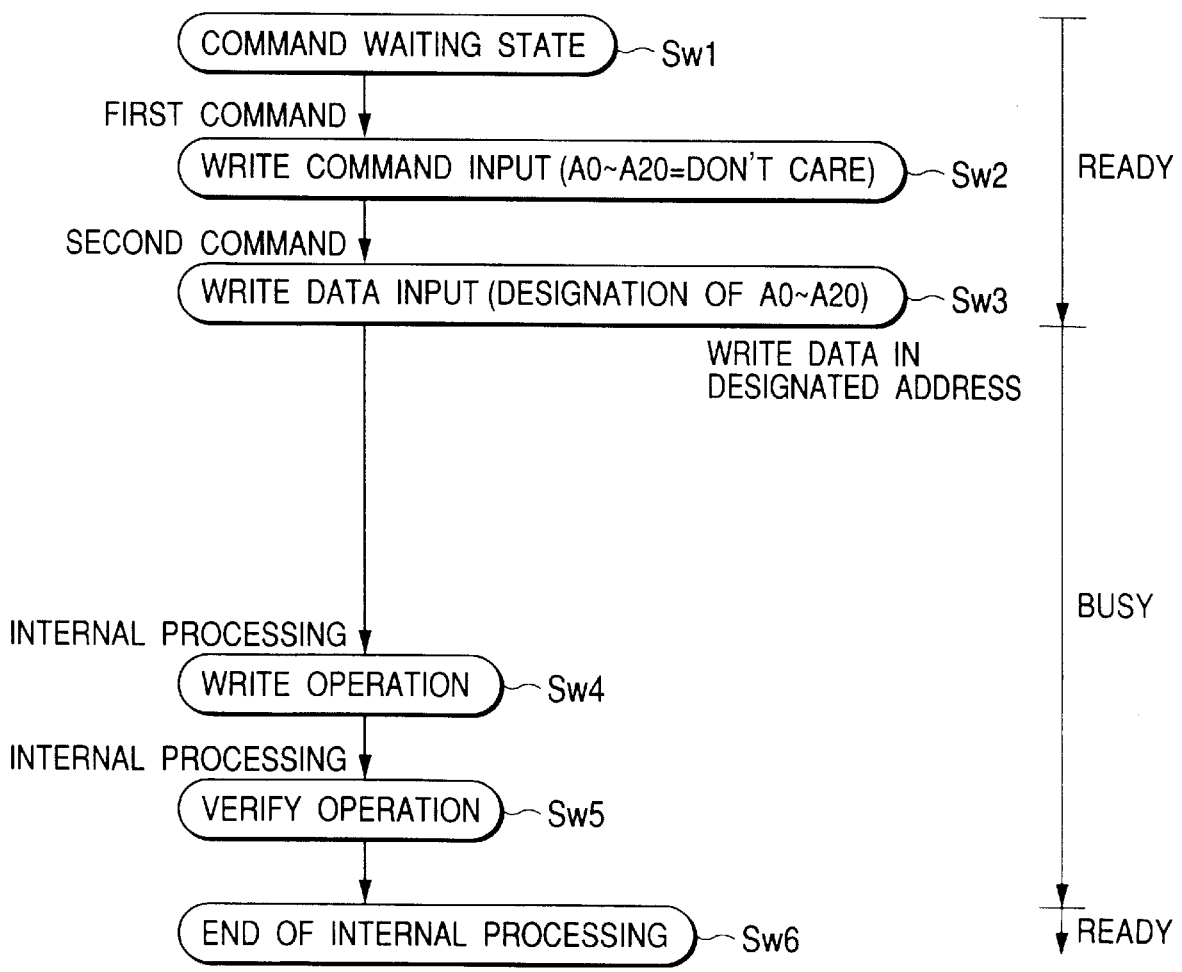
FIG. 28(C) is a flowchart showing the write operation of a complete composite conforming circuit of the flash memory shown in FIG. 15.

FIGS. 28(A) to 28(C) relate to a procedure for effecting a write operation for the complete composite conforming circuit of the flash memory 1B shown in FIG. 15. In the address map of the flash memory shown in FIG. 28(A), symbols #0, #1, . . . denote byte addresses.

As shown in FIG. 28(C), the flash memory is brought into a command waiting state (Sw1) after the power supply is turned on. Commands, as shown by Sw2 and Sw3, are commands for ordering the write operation land write data. The write command is set in the register 15 (Sw2) and the write data is supplied together with write addresses (Sw3). The write data is supplied to the data input/output buffer 7 and the write addresses (A0 to A20) are supplied to the address buffer 10. Moreover, the operation of writing the write data in designated write addresses is started (Sw4) and the verify operation is performed (Sw5) after the write operation is completed. The write operation is ended by confirming that the data is normally written through a write verify operation (Sw6).

Figure 29A:
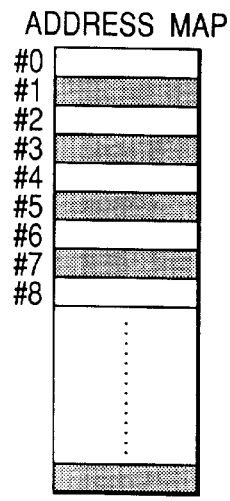
FIG. 29(A) is a diagram of an address map.
Figure 29B:
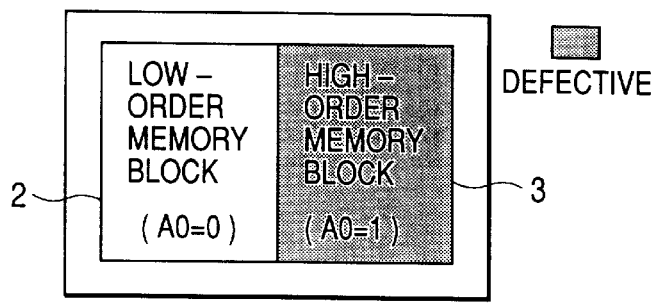
FIG. 29(B) is a diagram of a flash memory.
Figure 29C:
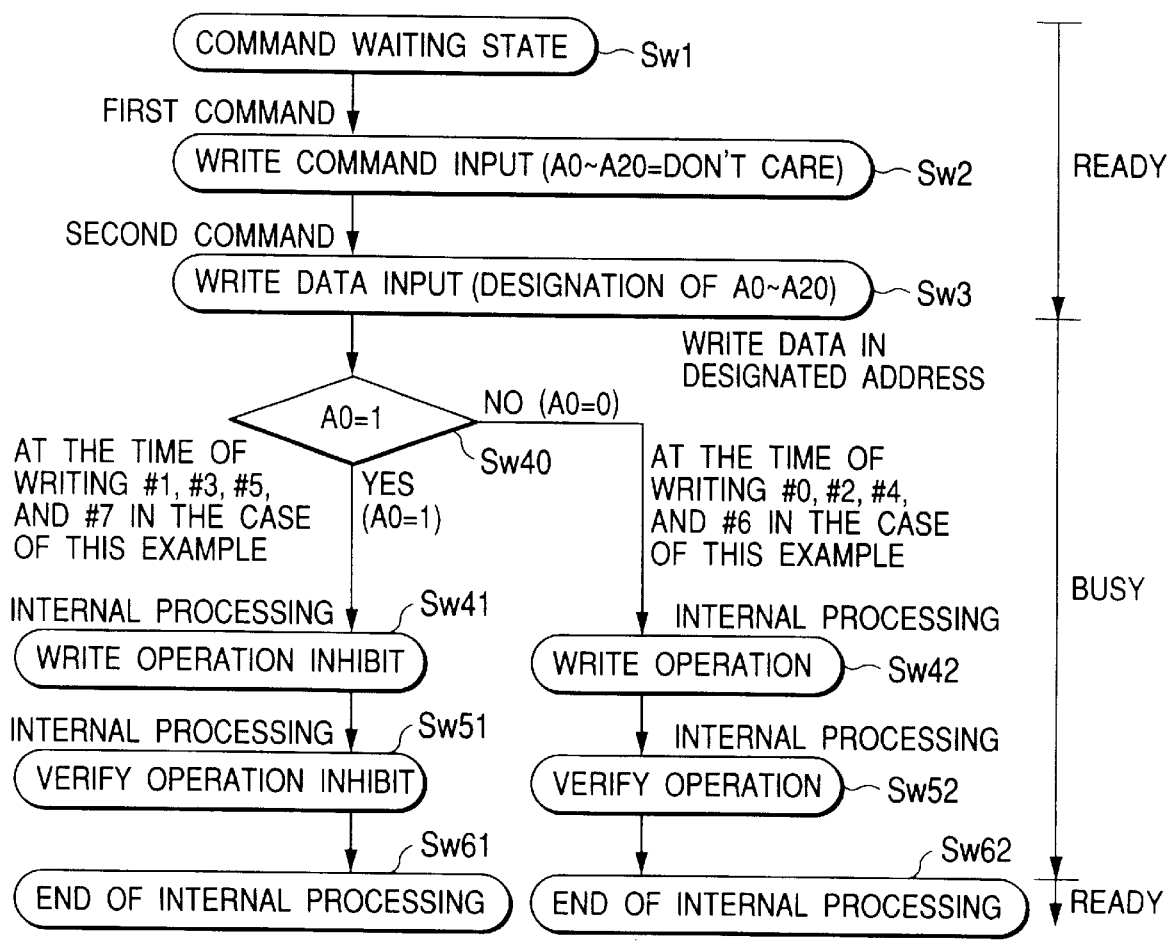
FIG. 29(C) is a flowchart showing the write operation of a low-order partial product of the flash memory shown in FIG. 15.

FIGS. 29(A) to 29(C) relate to a procedure for effecting a write operation for the low-order partial product of the flash memory 1B shown in FIG. 15. The set state of the fuse program circuit 47 of the low-order partial product is as described above. In this case, because the high-order memory block 3 is defective as shown in FIG. 29(B), the byte addresses of the defective portions are alternately arranged as shown on the address map of FIG. 29(A).

In the case of the write operation shown in FIG. 29(C), processings at and after step Sw3 are different from those of FIG. 28(C), in which the write operation e,nd the write verify operation for the high-order memory block 3 are inhibited (Sw41 and Sw51). That is, as described with reference to FIGS. 19 and 20, the signals SPL and DE2 output from the fuse program circuit 47 are set at low levels and the inhibit signal 33B is set at low level when A0=1 (a0=1). Therefore, these processings are inhibited. The write operation and the write verify operation are performed for the low-order memory block 3 (Sw42 and Sw52).

Figure 30A:
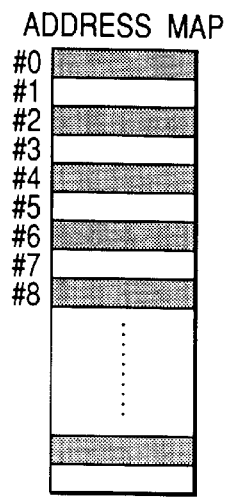
FIG. 30(A) is a diagram of an address map.
Figure 30B:
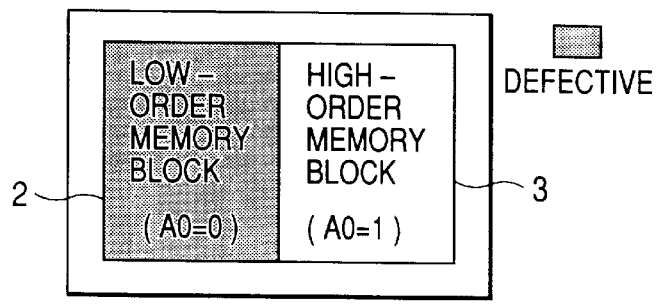
FIG. 30(B) is a diagram of a flash memory.
Figure 30C:
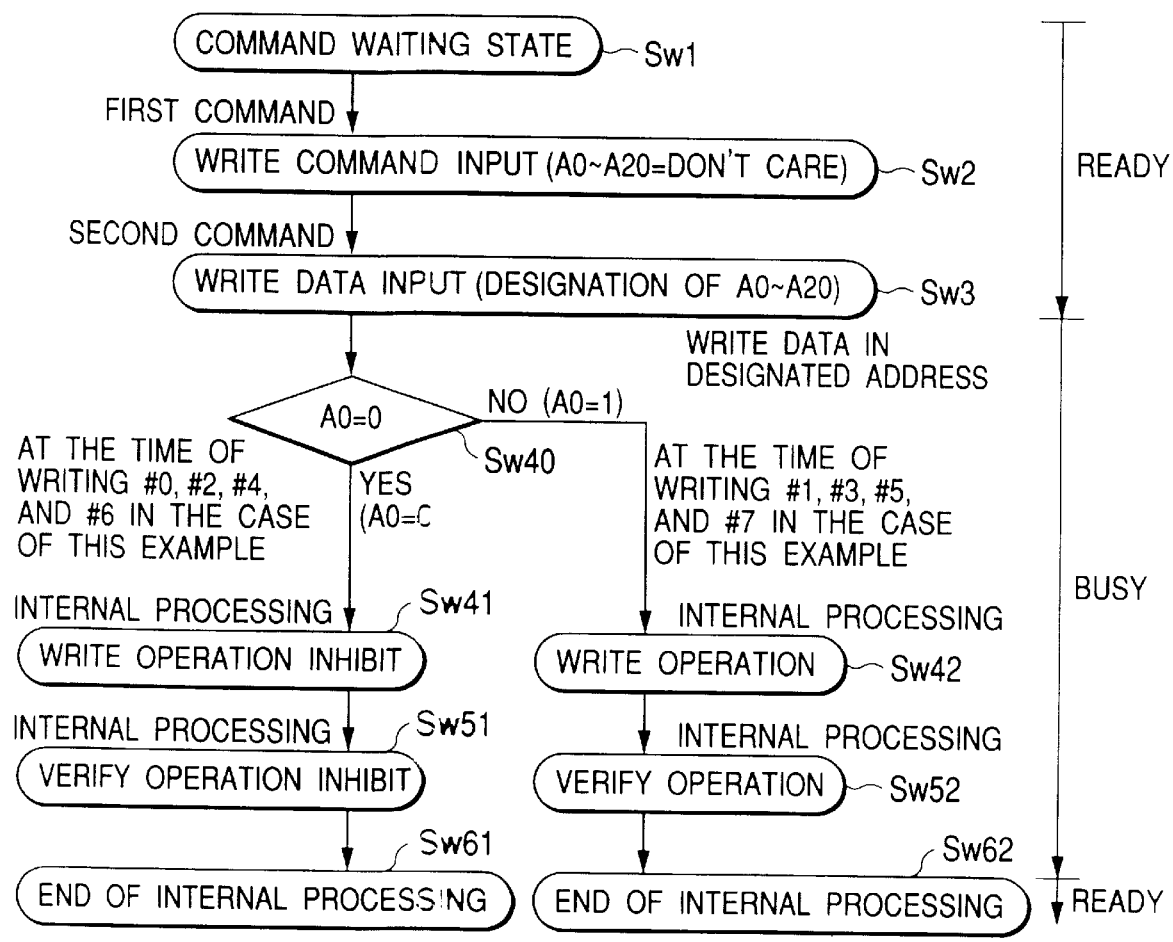
FIG. 30(C) is a flowchart showing the write operation of a high-order partial product of the flash memory shown in FIG. 15.

FIGS. 30(A) to 30(C) relate to a procedure for effecting a write operation for the high-order partial product of the flash memory 1B shown in FIG. 15. The set state of the fuse program circuit 47 of the high-order partial product is as described above. In this case, because the high-order memory block 2 is defective, as shown in FIG. 30(B), the byte addresses of the defective portions are alternately arranged as shown on the address map of FIG. 30(A).

In the case of the write operation procedure shown in FIG. 30(C), because the low-order memory block 2 is a defective memory block, the write operation and the write verify operation for the low-order memory block 2 are inhibited (Sw41 and Sw51). That is, as described with reference to FIGS. 19 and 20, the signals SPL and DE1 output from the fuse program circuit 47 are set at low levels and the inhibit signal 33B is set at low level when A0=0 (a0=0). Therefore, these processings are inhibited. The write operation and the write verify operation are performed for the high-order memory block 3 (Sw42 and Sw52).

Figure 31:
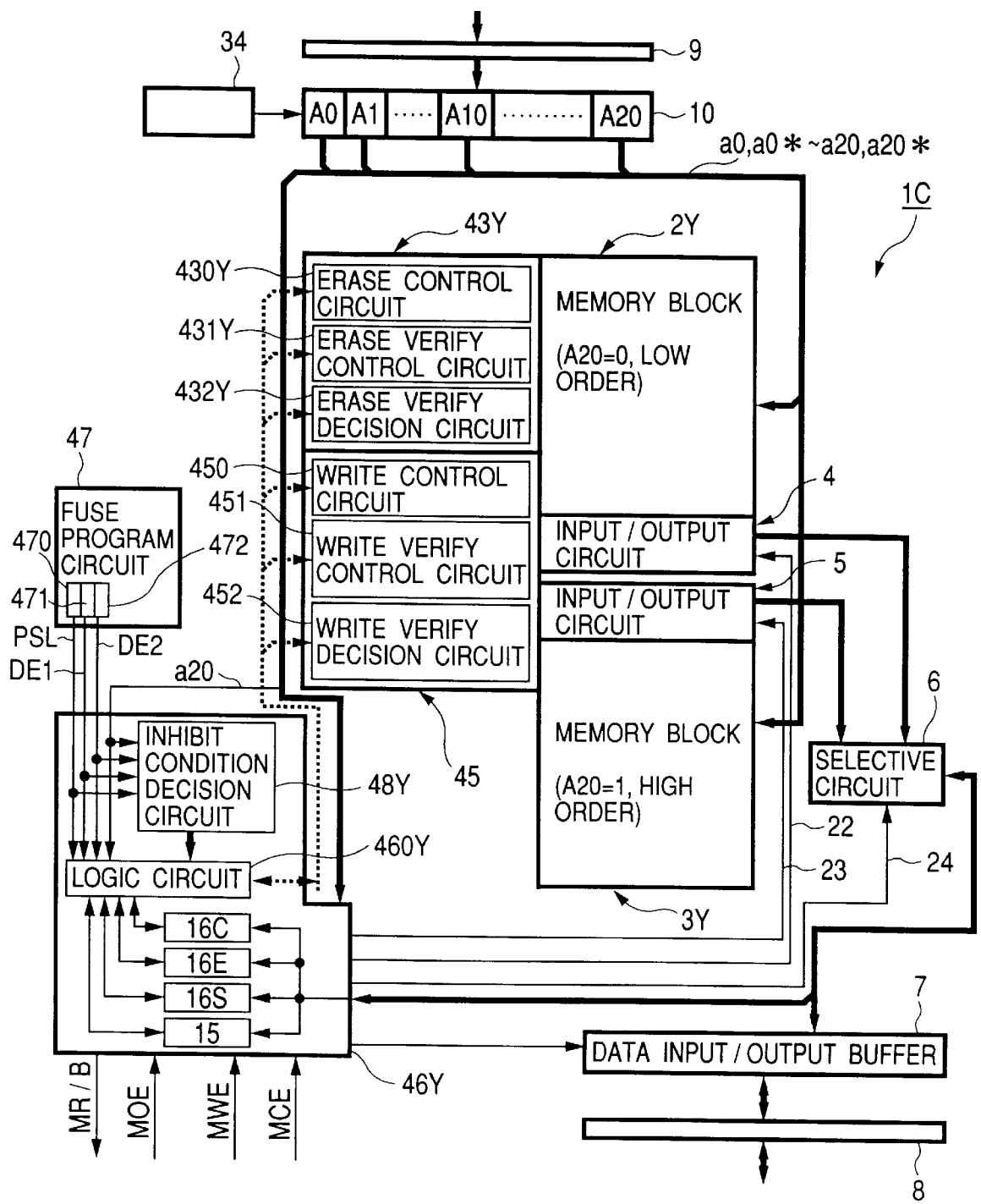
FIG. 31 is a block diagram of a flash memory representing a fourth embodiment of the present invention.

FIG. 31 shows a block diagram of a flash memory 1C representing a fourth embodiment of the present invention. The flash memory shown in FIG. 31 is formed on a semiconductor substrate made of, for example, single-crystal silicon using a semiconductor integrated circuit fabrication technique. The flash memory 1C of this embodiment is provided with two memory blocks 2Y and 3Y in each of which electrically erasable nonvolatile memory cells are arranged in the form of a matrix. The memory blocks 2Y and 3Y each have a memory cell array in which flash memory cells constituting the two-layer insulating-gate field effect transistor are arranged in a matrix configuration, an address decoder for selecting a flash memory cell, and a selection switch circuit. In the case of this embodiment, data is written in or read from the memory blocks 2Y and 3Y in units of 8 bits (one byte). Data is input to or output from the memory blocks 2Y and 3Y by input/output circuits 4 and 5 in units of one byte. Either of the input/output circuits 4 and 5 is connected to a data input/output buffer 7 through a selector 6. The data input/output buffer 7 is connected to an 8-bit external data input/output terminal 8 to transfer data to and from an external unit. Address signals A0 to A20 for selecting memory cells are supplied to the memory blocks 2Y and 3Y from external address input terminals 9 through an address input buffer 10. The address input buffer 10 functions as an address latch circuit and holds, for example, a write address as it is so that the write address can be used as a write verify address. In this case, the address signals A0 to A20 are byte addresses, and, particularly, the most significant bit A20 is regarded as information representing which memory block is designated, 2Y or 3Y. In the case of this embodiment, the memory blocks 2Y and 3Y each have a memory capacity of 1M bytes.

In FIG. 31, symbols 43Y, 45, and 46Y denote circuit blocks for controlling the rewrite and read of information for the memory cells of the memory blocks 2 and 3 in accordance with an instruction from an external unit. Symbol 43Y denotes a circuit shared by the memory blocks 2Y and 3Y. Symbol 45 denotes a write circuit, which is the same as that of the third embodiment. Symbol 46Y denotes a timing controller for controlling the whole of the flash memory. The timing controller 46Y is connected to the erase circuit 43Y and the write circuit 45 through a signal line group.

The erase circuit 43Y comprises an erase control circuit 430Y, an erase verify control circuit 431Y and an erase verify decision circuit 432Y.

The timing controller 46Y receives an output enable signal MOE, a write enable signal MWE, and a chip enable signal MCE, typically shown as external access control signals. The timing controller 46Y has a command register 15 in which a command supplied from an external unit through the data input/output buffer 7 is set and generates an internal control signal corresponding to an operation mode, such as erase, erase verify, write, write verify, or data read, by decoding the command. Symbol 460Y denotes a logic circuit for generating the internal control signal by decoding the command. The signals MOE, MCE, and MWE are supplied to the logic circuit 460Y. Though the invention is not so restricted, the control signal MWE orders the write of a command into the command register. The control signal MOE orders a read operation. The control signal MCE gives an instruction for chip selection.

The erase operation can be performed for every block, for example, every 512 bytes. Designation of a block to be erased, though the invention is not so restricted, is performed in accordance with 11-bit address signals A10 to A20. That is, when an erase command is written into the command register 15, the address information of an erase start block specified by the address signals A10 to A20 is set in an erase start block designation register 16S and the address information of an erase end block specified by the address signals A10 to A20 is set in an erase end block designation register 16E. Symbol 16C denotes a counter in which the address signals A10 to A20 set in the erase start block designation register 16S are preset, and the counter is incremented at each erase operation until the value of the counter coincides with an address signal set in the erase block end register. The timing controller 46Y successively supplies control signals for designating the erase operation and the verify operation to the erase circuit 43Y, starting with the erase start block set in the register 16S to the erase end block set in the register 16E. Particularly, in the case of this embodiment, A20 is regarded as the most significant bit of an address signal for defining a memory space and the most significant bit serves as a signal for separating the memory blocks 2Y and 3Y from each other. Therefore, the memory region of 512 bytes, i.e., a simultaneous erase unit, does not extend over both the memory blocks 2Y and 3Y. In this case, the erase circuit 43 is shared by the memory blocks 2Y and 3Y. Therefore, in the case of this embodiment, the erase operation of a designated block is performed by either of the memory blocks 2Y and 3Y.

When a write command is set in the command register 15, the timing controller 46Y supplies a control signal for writing the write data supplied through the data input/output buffer 7 into memory cells designated by the address signals A0 to A20. The write operation, though the invention is not so restricted, is performed in units of one byte and the writing of byte data is performed by either of the memory blocks, designated by the address signals A0 to A20.

In the case of this embodiment, the most significant address signal A20, as described above, is regarded as a signal representing which memory block is selected, 2Y or 3Y, in accordance with the logical value of the signal 20A. For example, the memory block 2Y is selected when A20=0 and the memory block 3Y is selected when A20=1. In the case of this embodiment, the selection of a memory block in accordance with A20 refers to the selection of a memory cell by the address decoder included in the memory block 2Y or 3Y. Therefore, when A20 included tin an address signal is 0, a memory cell included in the memory block 2Y is an object to be accessed. When A20 is 1, a memory cell included in the memory block 3Y is an object to be accessed.

Symbols a0, a0* to a20, and a20* denote the internal complementary address signals of the address signals A0 to A20. Reference numeral 22 denotes a control signal for an input/output circuit 4, reference numeral 23 denotes a control signal for an input/output circuit 5, and reference numeral 24 denotes a control signal for a selection circuit 6.

The flash memory 1C of this embodiment is a partial product when either of the memory blocks 2Y and 3Y has an irremediable defect. The flash memory 1C of this embodiment is provided with a fuse program circuit 47 in order to make two partial products completely compatible with a complete composite conforming circuit and moreover, the timing controller 46Y is provided with an inhibit condition decision circuit 48Y.

The fuse program circuit 47 has a fuse circuit 470 for outputting a signal PSL, a fuse circuit 471 for outputting a signal DE1, and a fuse circuit 472 for outputting a signal DE2. The signals PSL, DE1, and DE2 are supplied to the inhibit condition decision circuit 48Y and the logic circuit 460Y. The inhibit condition decision circuit 48Y and the logic circuit 160Y inhibit operations, such as erase, write, or read, for an irremediable memory block in accordance with the signals DE1 and DE2, only when the signal PSL represents that the flash memory is a partial product. The inhibit condition decision circuit 48Y realizes substantially the same function as that of the inhibit condition decision circuit 48 of the third embodiment. When the logic circuit 460Y inhibits the erase or write operation of the memory block, it brings a ready/busy signal MR/B into a ready state and outputs the signal to an external unit. In FIG. 31, the same circuit blocks and signals as those described in the third embodiment are denoted by the same symbols.

Figure 32:
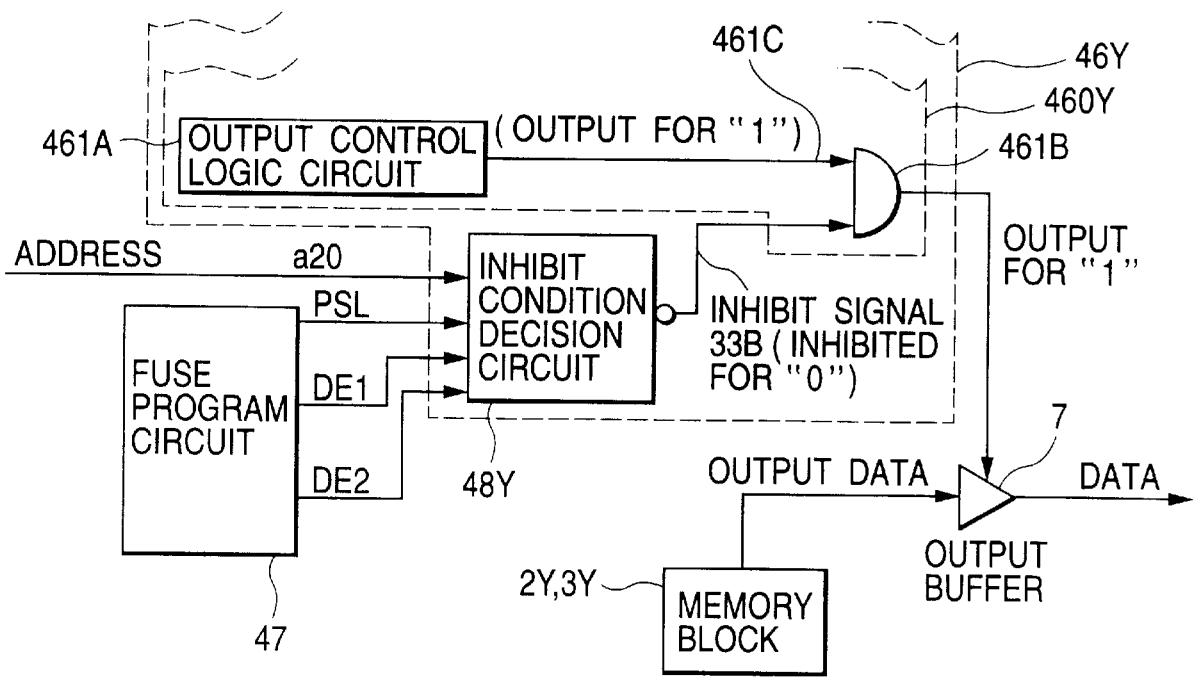
FIG. 32 is a circuit diagram showing another example of a circuit for inhibiting the output operation of a data input/output buffer in accordance with the set state of a fuse program circuit.

FIG. 32 shows a circuit for inhibiting the output operation of the data input/output buffer 7 in accordance with the set state of the fuse program circuit 47. In FIG. 32, reference numeral 461A denotes an output control circuit and reference numeral 461B denotes an AND gate, which are included in the logic circuit 460Y. When the data read mode is set up in accordance with a command, the output control circuit 461A generates a timing signal 461C for outputting the data read from a memory cell to an external unit. The AND gate 461B receives two signals, the timing signal 461C and the inhibit signal 33B, supplied from the inhibit condition decision circuit 48Y, to control the output operation of the data input/output buffer 7 by means of the output of the gate 461B.

The inhibit condition decision circuit 48Y can have the same logical structure as that of the circuit illustrated in FIG. 21. However, a20 is supplied instead of a0. When the flash memory is a partial product (PSL=1), the inhibit signal 33B is normally set at an inactivation level (high level). Therefore, the output operation of the data input/output buffer 7 is not inhibited at all. When the flash memory is a partial product (PSL=0), if the memory block 2Y is irremediable, the fuse of the fuse circuit 471 is blown, and the signal DE1 is set at 0 (in this case, it is a matter of course that the DE2 is set at 1), the inhibit signal 33B is set at an activation level (low level) when a20=0, while the signal 3B is set at an inactivation level (low level) when a20=1 (access to the memory block 3Y). Similarly, when the flash memory is a partial product (PSL=0), if the memory block 3Y is irremediable and the signal DE2 is set at 0 (in this case, it is a matter of course that DE1 is set at 1), the inhibit signal 33B is set at an activation level (low level) when a20=1 (access to the memory block 3Y) while the signal 33B is set at an inactivation level (low level) when a20=0 (access to the memory block 2Y).

Therefore, in the case of a partial product (PSL=0) in which the memory block 2Y is defective (DE1=0), even if a read operation access to the memory block 2Y is designated (a20=0), the output operation of the data input/output buffer 7 is inhibited. Similarly, in the case of a partial product (PSL=0) in which the memory block 3Y is defective (DE2=0), even if a read operation access to the memory block 3Y is designated (a20=1), the output operation of the data input/output buffer 7 is inhibited.

Figure 33:
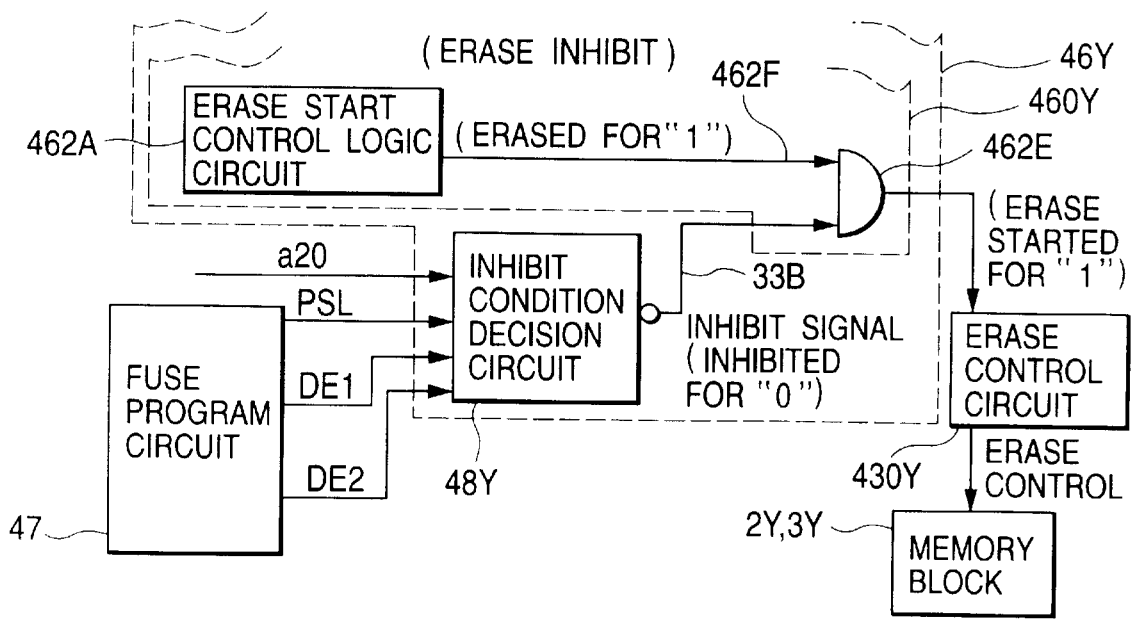
FIG. 33 is a circuit diagram showing still another example of a circuit for inhibiting the operation of an erase control circuit in accordance with the set state of a fuse program circuit.

FIG. 33 shows a circuit for inhibiting operation of the erase control circuit 430Y in accordance with the set state of the fuse program circuit 47. In FIG. 33, symbol 462A denotes an erase start control logic circuit and 462E denotes an AND gate, and they are included in the logic circuit 460Y. When the erase mode is set up in accordance with a command, the erase start control logic circuit 462A generates an erase operation start timing signal 462F. The AND gate 462E receives the timing signal 462F and the inhibit signal 33B.

Thereby, for a partial product (PSL=0) in which the memory block 2Y is defective (DE1=0), even if the erase operation start signal 462F is activated, the start of the erase control circuit 430Y is inhibited by the inhibit signal 33B in the case of the erase operation for the memory block 2Y (a20=0). Similarly, for a partial product (PSL=0) in which the memory block 3Y is defective (DE2=1), even if the erase operation start signal 462F is activated, the start of the erase control circuit 430Y is inhibited by the inhibit signal 33B in the case of the erase operation for the memory block 3Y (a20=1).

Figure 34:
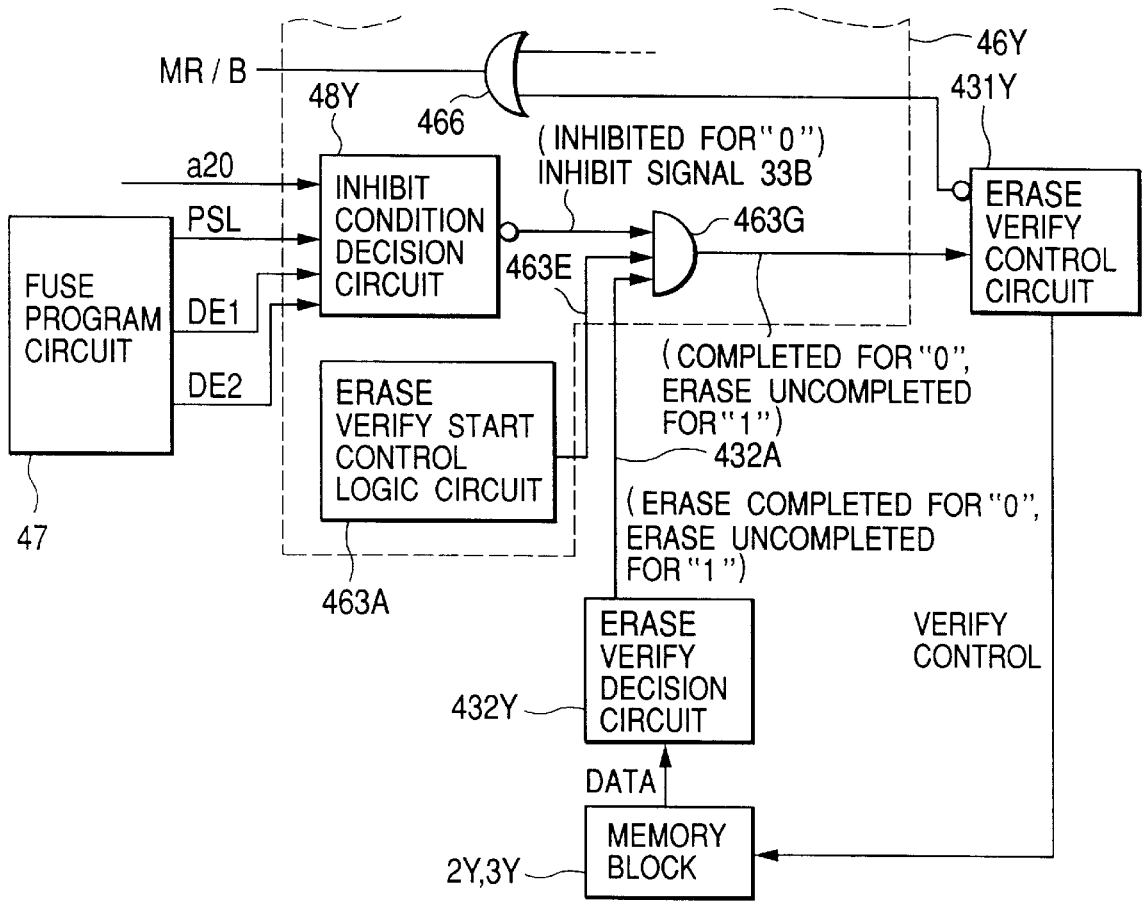
FIG. 34 is a circuit diagram showing yet another example of a circuit for inhibiting the operation of an erase verify control circuit in accordance with the set state of a fuse program circuit.

FIG. 34 shows a circuit for inhibiting the operation of the erase verify control circuit 431Y in accordance with the set state of the fuse program circuit 47. In FIG. 34, reference numeral 463A denotes an erase verify start control logic circuit and reference numeral 463G denotes an AND gate, and they are included in a timing controller 46M. When the erase mode is set up in accordance with a command, the erase verify start control logic circuit 462A generates a start timing signal 463E. When the erase verify operation is started, the erase verify control circuit 431Y reads data from a block to be erased from the memory block 2Y or 3Y in units of one byte. The read data is supplied to the erase verify decision circuit 432Y and it is judged whether or not the data is set at a logical value in an erased state. As shown in FIG. 22, it is possible to constitute the erase verify decision circuit 432Y with a logic circuit equivalent to an 8-input NAND gate. When the erase verify decision circuit 432Y detects that all memory cells of a block to be erased are brought into an erased state, it converts the logical value of the output signal 432A from The AND gate 463G receives three signals 463E, 33B and 432A, to inhibit the start of the erase verify control circuit 431Y because a20=0, which is regarded as the designation of the memory block 2Y when the memory block 2Y is defective (PSL=0 and ED1=0). That is, the output state of the AND gate 463B is kept in the completed erase state (logical value "0" is output). When the memory block 3Y is defective (PSL=0 and DE2=0), the gate 463G inhibits the start of the erase verify control circuit 431Y because a20=0, which is regarded as the designation of the memory block 2Y. That is, the output state of the AND gate 463G is kept in the completed erase state (logical value "0" is output). In FIG. 34, components having the same functions as those of FIG. 18 are denoted by the same symbols.

Figure 35:
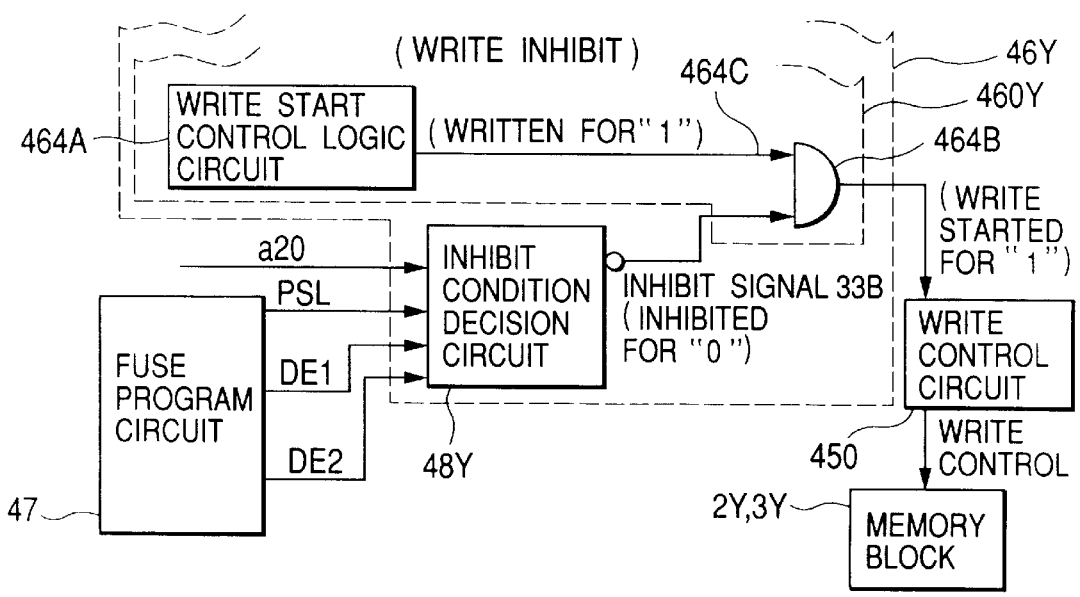
FIG. 35 is a circuit diagram showing still another example of a circuit for inhibiting the operation of a write control circuit in accordance with the set state of a fuse program circuit.

FIG. 35 shows a circuit for inhibiting the operation of the write control circuit 450 in accordance with the set state of the fuse program circuit 47. The circuit has substantially the same circuit structure as that of FIG. 19 except that the address input of the inhibit condition decision circuit 48Y is a20. By using this circuit, even if a memory cell of the memory block 2Y is designated as a write object in the case of a partial product (PSL=0) in which the memory block 2Y is defective (DE1=0) in accordance with a20=0, the start of the write control circuit 450 is inhibited. Similarly, even if a memory cell of the memory block 3Y is designated as a write object in accordance with a20=1 in the case of a partial product (PSL=0) in which the memory block 3Y is defective (DE2=0), the start of the write control circuit 450 is inhibited. In FIG. 35, components having the same functions as those of FIG. 19 are denoted by the same symbols.

Figure 36:
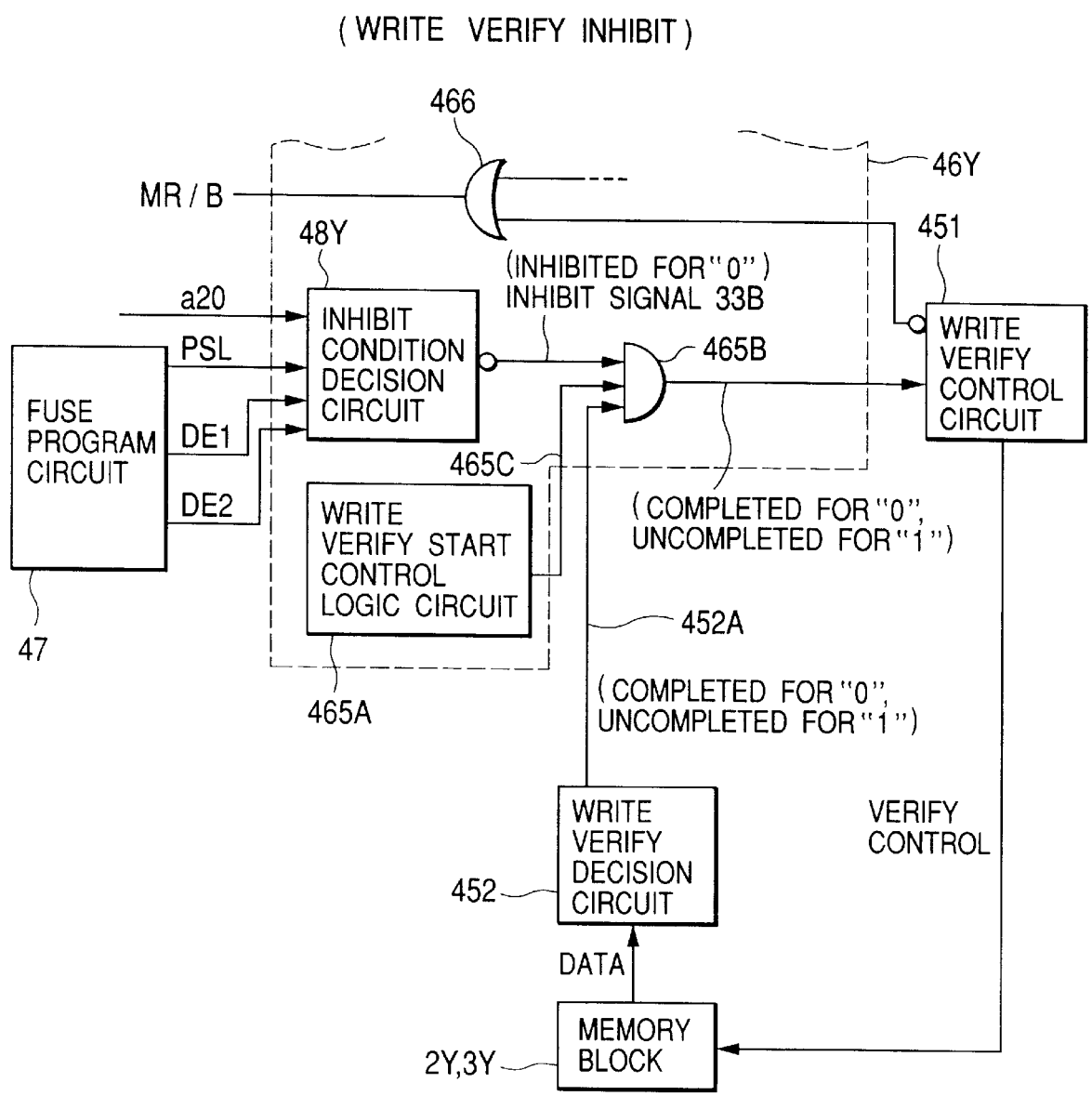
FIG. 36 is a circuit diagram showing a further example of a circuit for selectively inhibiting the operation of a write verify control circuit in accordance with the set state of a fuse program circuit.

FIG. 36 shows a circuit for selectively inhibiting the operation of the write verify control circuit 451 in accordance with the set state of the fuse program circuit 47. The circuit has substantially the same structure as that of FIG. 20 except that the address input of the inhibit condition decision circuit 48Y is a20. By using this circuit, the AND gate 465B inhibits the start of the write verify control circuit 451 similar to the case of the write control circuit 450 even if a memory cell of the memory block 2Y is designated as a write object, according to a20=0 in the case of a partial product (PSL=0) in which the memory block 2Y is defective (DE1=0). That is, the output state of the AND gate 465B is kept in the completed write state (logical value "0" is output) in accordance with the low-level inhibit signal 33B. Moreover, the AND gate 465B inhibits the start of the write verify control circuit 451 similar to the case of the write control circuit 450 even if a memory cell of the memory block 3Y is designated as a write object in accordance with a20=1 in the case of a partial product (PLS=0) in which the memory block 3Y is defective (DE2=0). That is, the output state of the AND gate 465B is kept in the completed write state (logical value "0" is output) in accordance with the low-level inhibit signal 33B.

The flash memories 1C of the fourth embodiment a,re also sorted into complete composite conforming circuits, high-order partial products, low-order partial products and defective products through the same process as that described with reference to FIG. 24, and the fuse program circuit 47 is set in accordance with the sort results. The set contents of the fuse program are the same as those described with reference to FIG. 24. A partial product chip is constituted by pairing a high-order partial product and a low-order partial product and is sealed as a memory device as described with reference to FIGS. 3 and 4. It is possible to constitute a memory card described with reference to FIG. 5 by using the memory device.

FIGS. 37(A) to 37(C) relates to a procedure for effecting an erase operation for the complete composite conforming circuit of the flash memory 1C shown in FIG. 31. On the address map of the flash memory shown in FIG. 37(A), symbols #0, . . . , and #1048575 denote byte addresses. In the case of the flash memory 1C of FIG. 31, the most significant address bit A20 is regarded as information for selecting a memory block. Though the invention is not so restricted, the last byte address of the low-order memory block 2Y is designated as #1048575 and the first byte address of the high-order memory block 3Y is designated as #1048576. The set state of the fuse program circuit 47 of the complete composite conforming circuit is as described above.

FIG. 37(C) showing the erase procedure for a complete composite confirming circuit is different from FIG. 25(C) with respect to steps Se14, Se15, and Se16. That is, a simultaneous erase unit block is included in either of the memory blocks in accordance with the logical value of A20 regarded as the information for selecting a memory block. Other points are the same as described with reference to FIG. 25.

Figure 38A:
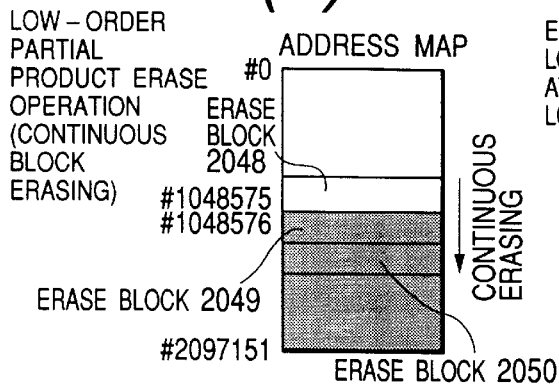
FIG. 38(A) is a diagram of an address map.
Figure 38B:
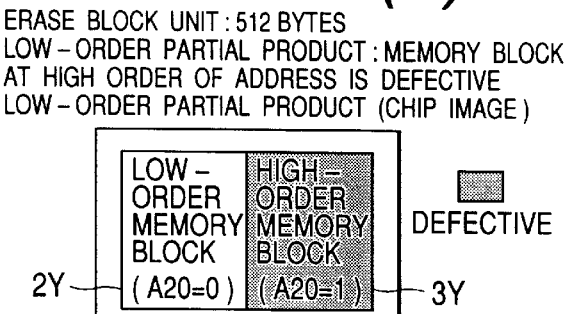
FIG. 38(B) is a diagram of a flash memory.
Figure 38C:
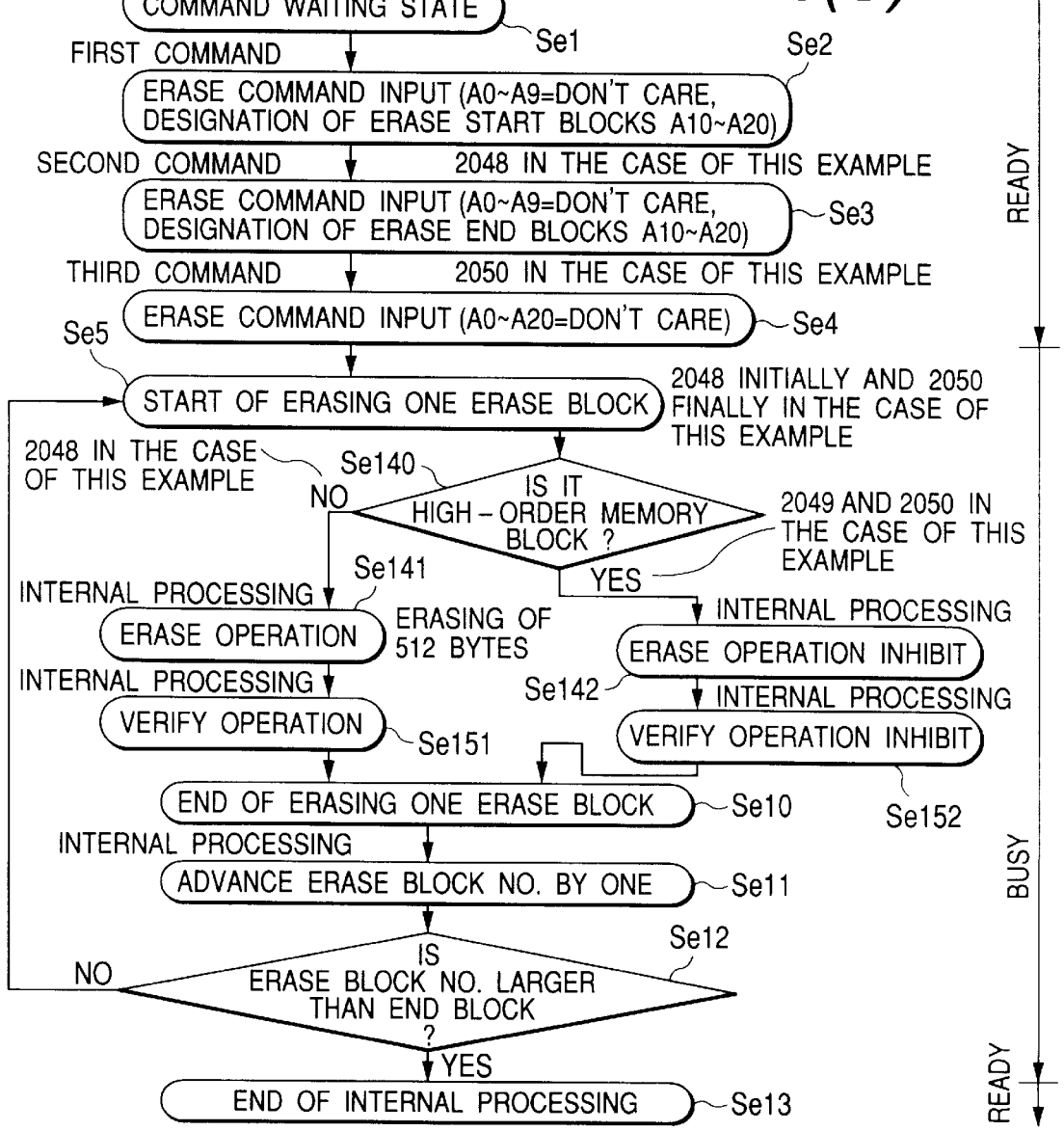
FIG. 38(C) is a flowchart showing the erase operation for a low-order partial product of the flash memory shown in FIG. 31.

FIGS. 38(A) to 38(C) relate to a procedure for effecting an erase operation for the low-order partial product of the flash memory shown in FIG. 31. The set state of the fuse program circuit 47 of the low-order partial product is as described above. In this case, the high-order memory block 3Y is defective as shown in FIG. 38(B). In the case of this example, the erase block 2048 included in the low-order memory block 2Y and the erase blocks 2049 and 2050 included in the high-order memory block 3Y are objects to be continuously erased, as shown on the address map of FIG. 38(A).

In the erase operation procedure shown in FIG. 38(C), the blocks to be erased are designated at steps Se2 and Se3. When the erase processing is started at step Se5, the erase operation and the erase verify operation for the erase blocks included in the high-order memory block 3Y are inhibited (Se140, Se141, Se142, Se151, and Se152). That is, as described with reference to FIGS. 33 and 34, the signal DE2 output from the fuse program circuit 47 is set at a low level and resultingly, these processings are inhibited.

Figure 39C:
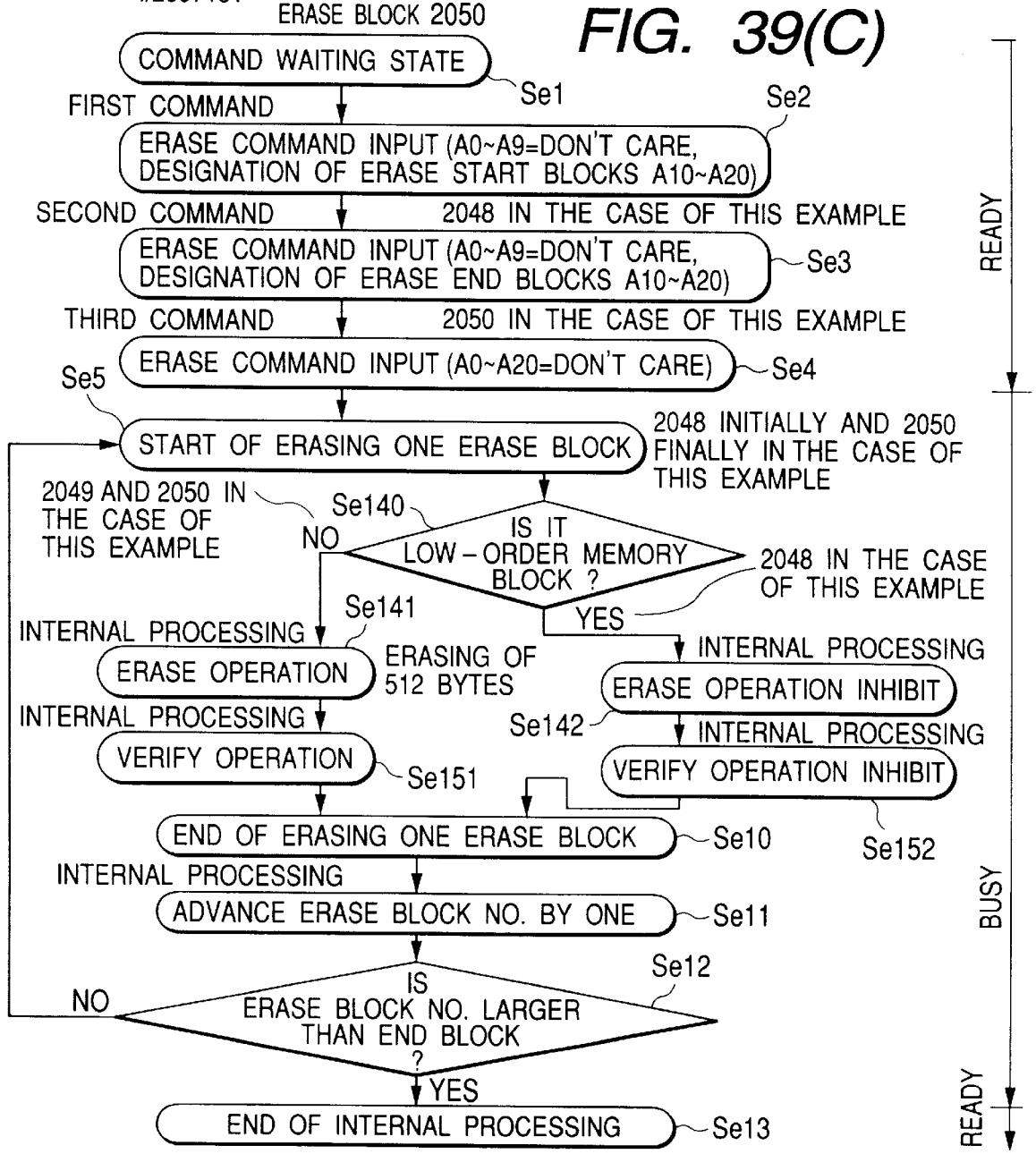
FIG. 39(C) is a flowchart showing the erase operation of a high-order partial product of the flash memory shown in FIG. 31.

FIGS. 39(A) to 39(C) relate to a procedure for effecting an erase operation for the high-order partial product of the flash memory shown in FIG. 31. The set state of the fuse program circuit 47 of the high-order partial product is as described above. In this case, the low-order memory block 2Y is defective as shown in FIG. 39(B). In the case of this example, the erase block 2048 included in the low-order memory block 2Y and the erase blocks 2049 and 2050 included in the high-order memory block 3Y are objects to be continuously erased.

In the erase operation procedure shown in FIG. 39(C), the blocks to be erased are designated at steps Se2 and Se3. When the erase processing is started at step Se5, the erase operation and the erase verify operation for the erase blocks included in the low-order memory block 2Y are inhibited (Se140, Se141, Se142, Se151, and Se152). That is, as described with reference to FIGS. 33 and 34, the signal DE1 output from the fuse program circuit 47 is set at a low level with the result that these processings are inhibited.

Figure 40A:
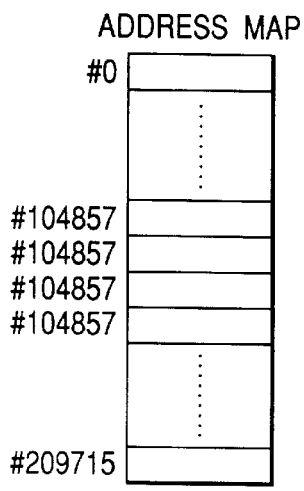
FIG. 40(A) is a diagram of an address map.
Figure 40B:
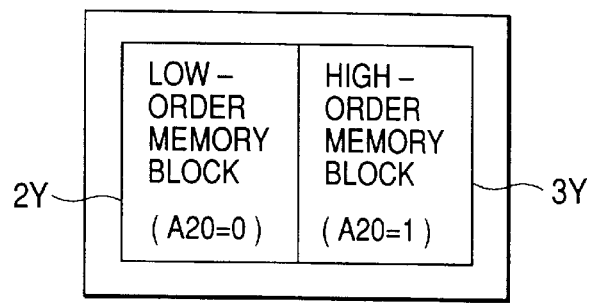
FIG. 40(B) is a diagram of a flash memory.
Figure 40C:
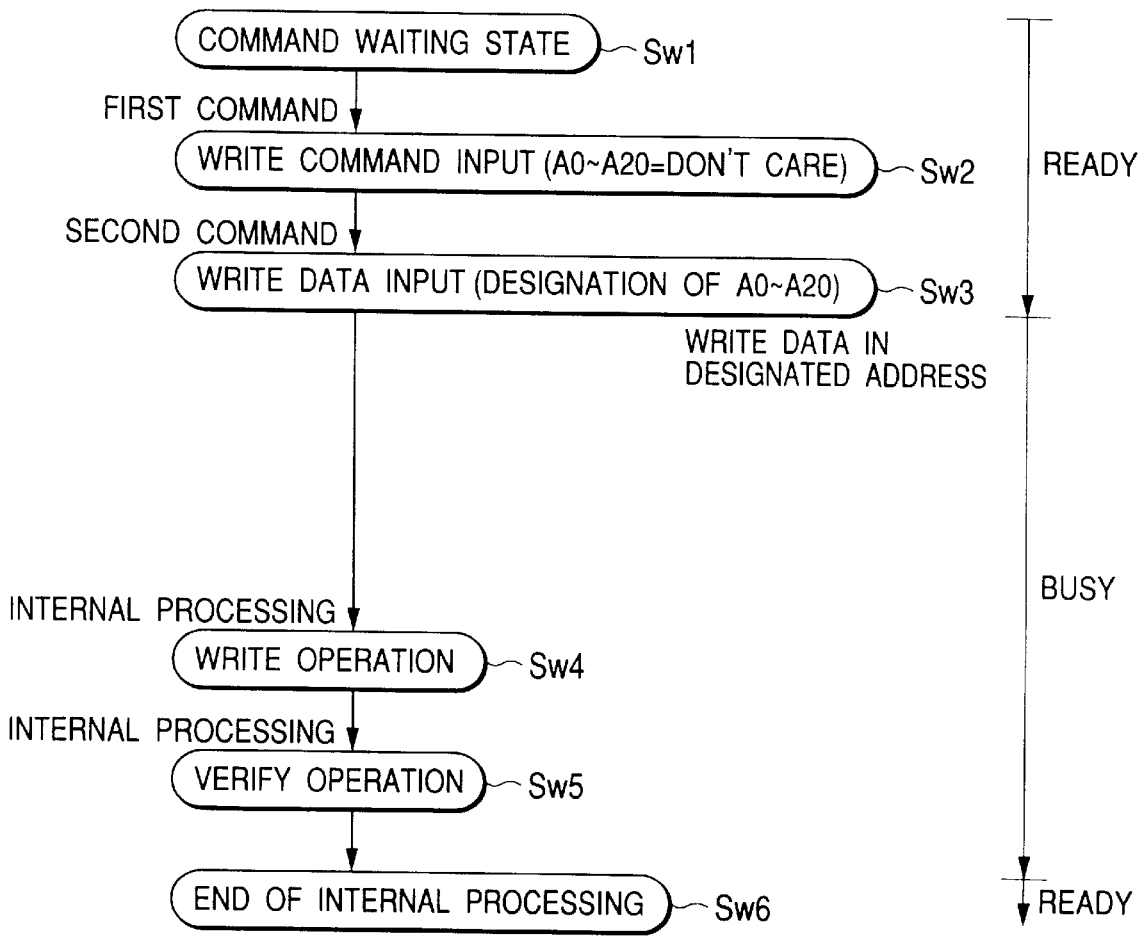
FIG. 40(C) is a flowchart showing the write operation of a complete composite conforming circuit of the flash memory shown in FIG. 31.

FIGS. 40(A) to 40(C) relate to a procedure for effecting a write operation for the complete composite conforming circuit of the flash memory shown in FIG. 31. The write procedure is basically the same as the procedure of FIG. 18.

Figure 41A:
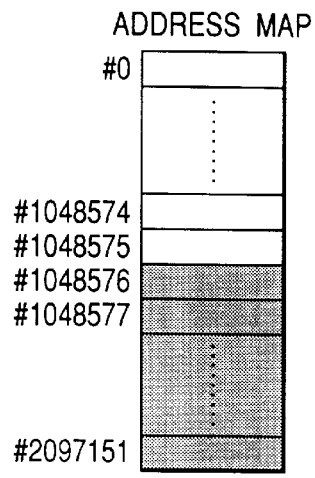
FIG. 41(A) is a diagram of an address map.
Figure 40B:
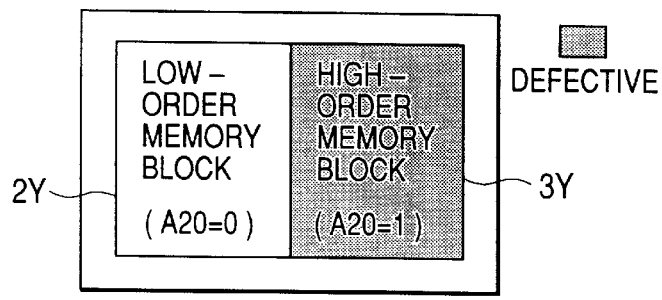
Figure 41C:
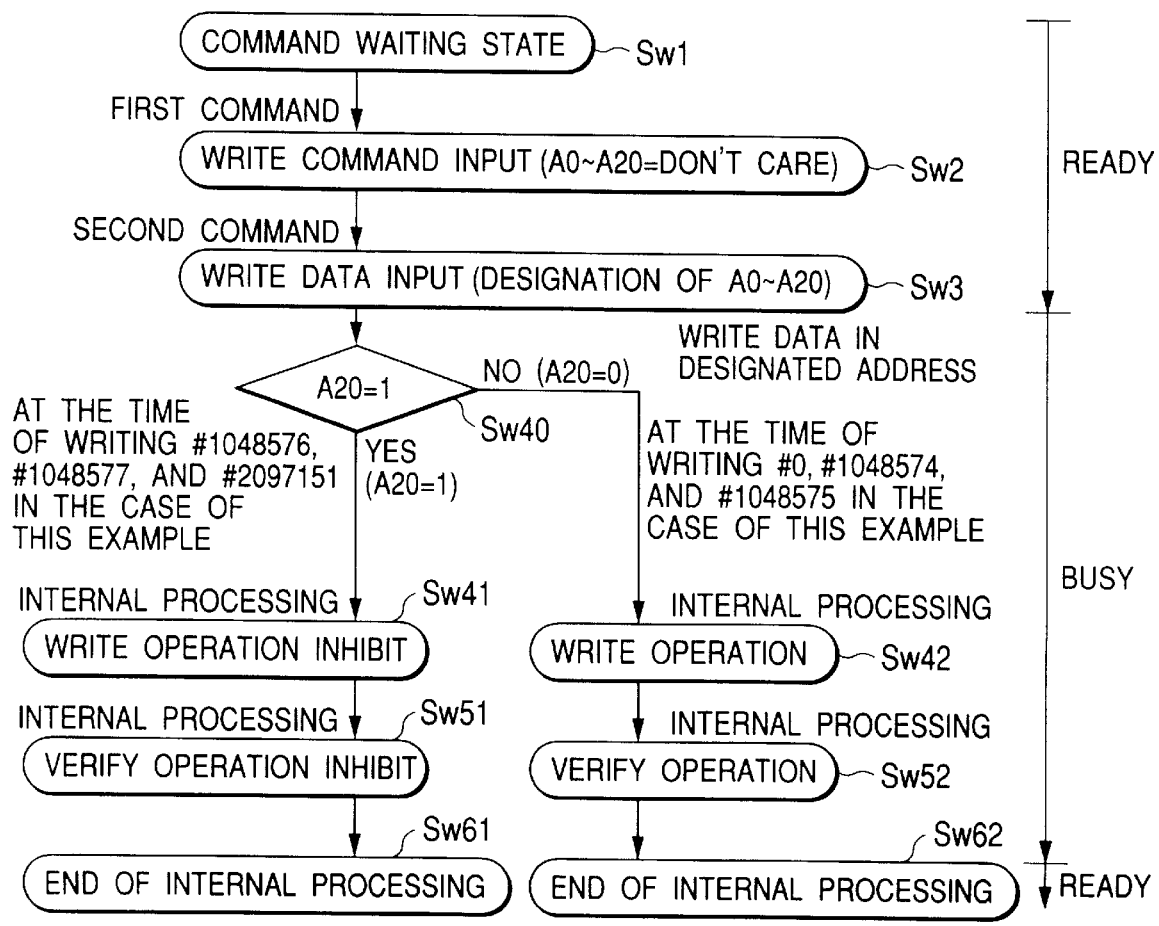
FIG. 41(C) is a flowchart showing the write operation of a low-order partial product of the flash memory shown in FIG. 31.

FIGS. 41(A) to 41(C) relate to a procedure for effecting a write operation for the low-order partial product of the flash memory shown in FIG. 31. The procedure is different from that of FIG. 29(C) in that a memory block is designated by the most significant bit A20 of an address signal, and the write operation and the write verify operation for the high-order memory block 3Y are inhibited when A20=1 (Sw41 and Sw51). That is, as described with reference to FIGS. 19 and 20, the signals SPL and DE2 output from the fuse program circuit 47 are set at low levels, and the inhibit signal 33B is set at a low level when A20=1 (a20=1). As a result, these processings are inhibited. The write operation and the write verify operation are performed for the low-order memory block 2Y (Sw42 and Sw52).

Figure 42A:
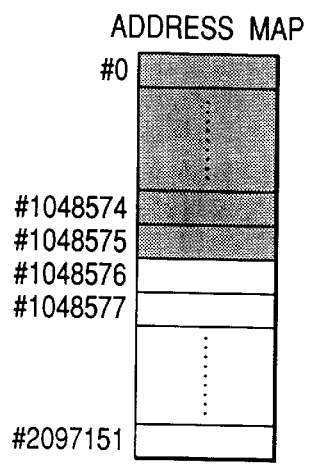
FIG. 42(A) is a diagram of an address map.
Figure 42B:
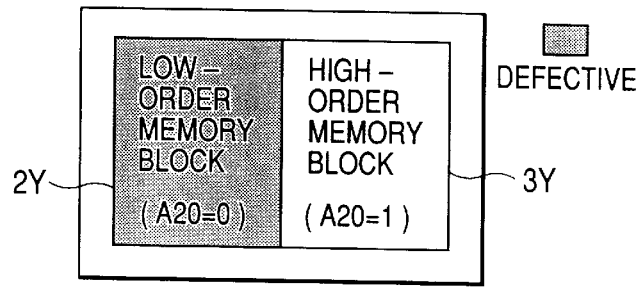
FIG. 42(B) is a diagram of a flash memory.
Figure 42C:
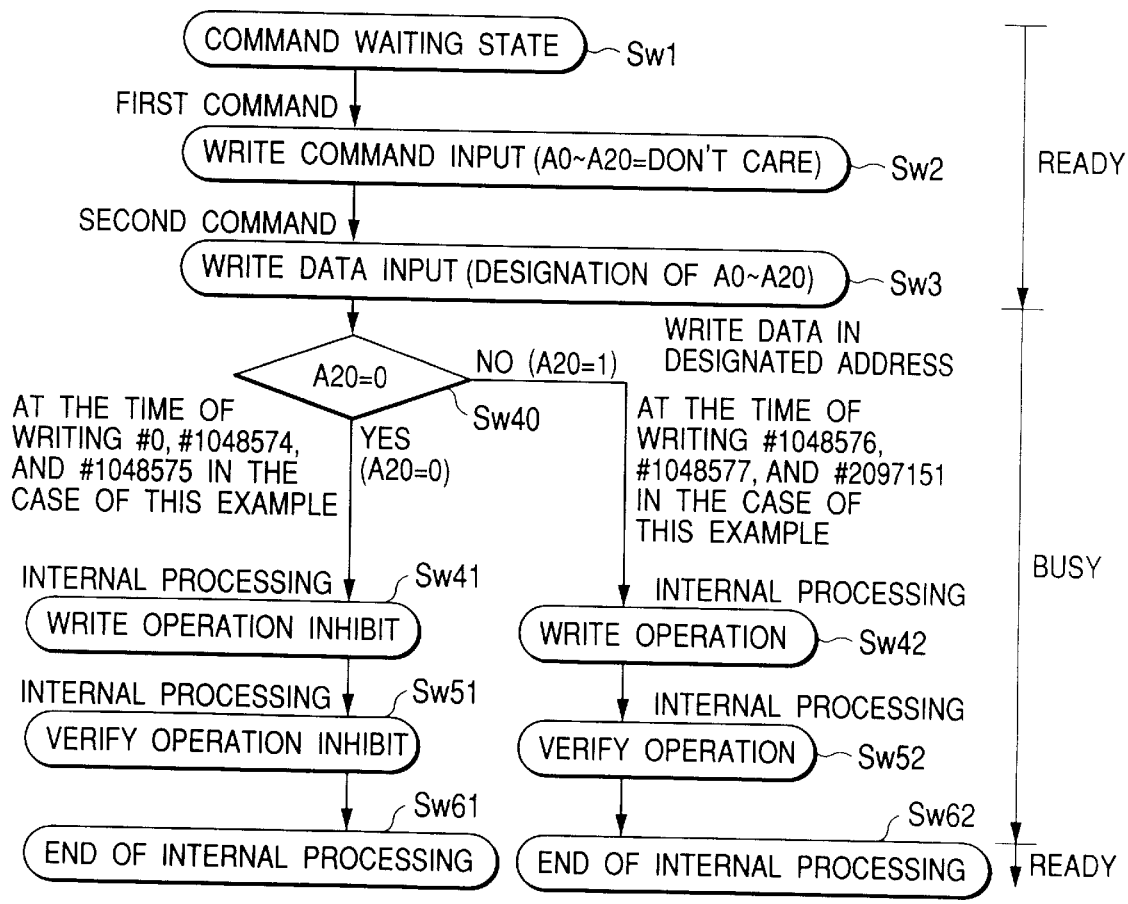
FIG. 42(C) is a flowchart showing the write operation of a high-order partial product of the flash memory shown in FIG. 31.

FIGS. 42(A) to 42(C) relate to a procedure for effecting a write operation for the high-order partial product of the flash memory shown in FIG. 31. The procedure is different from that of FIG. 30(C) in that a memory block is designated by the most significant bit A20 of an address signal, and the write operation and the write verify operation for the low-order memory block 2Y are inhibited when A20=0 (Sw41 and Sw51). That is, as described with reference to FIGS. 19 and 20, the signals SPL and DE1 output from the fuse program circuit 47 are set at low levels, and the inhibit signal 33B is set at a low level when A20=0 (a20=0) with the result that these processings are inhibited. The write operation and the write verify operation are performed for the high-order memory block 3Y (Sw42 and Sw52).

From the above embodiments, the following functions and advantages can be obtained.

For the first, second, and fourth embodiments, when a memory block to be selected in accordance with address information coincides with the memory block (defective memory block in a partial product) designated by the fuse program circuits 30, 100, and 47, it is possible to inhibit the data rewrite operation for an instruction for a data rewrite operation (erase and write) by the first control means 11 and 81 or the erase circuit 43, write circuit 45, and timing controller 46, and, moreover, it is possible to inhibit the output operation of the data input/output buffer 7 for an instruction for an information read operation.

For the first to fourth embodiments, when the access to a defective memory block is detected, it is possible to output a status MR/B signal representing the completion of the data rewrite operation for the instruction of the data rewrite operation irrespective of the completion of the operation, and, moreover, inhibit the output operation of a data input/output buffer for an instruction for a data read operation.

It is possible to use a partial product without fixing a specific address specifying a memory block outside a semiconductor memory on a system by the inhibit function of the semiconductor memory itself serving as the partial product.

Therefore, it is possible to easily constitute a memory device by connecting the external terminals of the high-order partial product 1-U with those of the low-order partial product 1-L in common. Thereby, it is possible to achieve compatibility of the memory crevice 40 with the semiconductor memory of a complete composite conforming circuit from the viewpoint of external terminal specifications or utilization mode.

Moreover, even if the information rewrite operation for a defective memory block in a partial product is ordered from an external unit, the information rewrite operation for the memory block is inhibited or, as described above, a status signal representing the completion of the data rewrite operation can be output to an external unit irrespective the completion of the operation. Therefore, when the operation of the defective portion of a partial product is ordered in accordance with an access from an external unit, it is possible to prevent a contradiction from occurring in the internal state between the partial product and another partial product substituted for the defective portion of the former partial product.

Defective portions of a plurality of partial products typically are maldistributed depending on the fabrication process. By using logic means for selectively inverting the address information designated to select a memory block in accordance with the value set in the fuse program circuit 34, it is possible to optionally change the arrangement of apparently operable memory blocks for an address signal supplied from an external unit depending on the way the information is set in the fuse program circuit 34 even if partial products whose defective portions differ are biased in quantity. Thereby, when substituting a non-defective product by combining partial products whose operational regions are complementary, it is possible to prevent excess of defective partial products of one type, the number of which is larger than the other type.

It is possible to constitute the memory card 50 comprising a partial product of a flash memory by using a high-order partial product 1-U and a low-order partial product 1-L, instead of a flash memory which is a complete composite conforming circuit and mounting the partial products on a wiring board and connecting the external terminals of the partial products in common on the wiring board. Because the processing for a defective portion of a flash memory used as a partial product can be realized in the flash memory by programming a fuse program circuit as described above, it is unnecessary to fix the input level of a specific address terminal of the flash memory. Moreover, it is possible to provide the wiring of a mounting substrate and the chip selection logic of a card controller in common even if the flash memory used for a memory card is a partial product or complete composite conforming circuit.

Therefore, it is possible to realize a favorable compatibility of a memory device or memory card using a partial product with a product using a complete composite conforming circuit. It is possible to use the partial product of a semiconductor memory directly in a memory device or memory card, instead of a complete composite conforming circuit.

The invention made by the present inventor has been specifically described above, taking various embodiments as examples. However, the present invention is not restricted to the specific embodiments. It is needless to say that various modifications of the present invention are allowed as long as they do not depart from the gist of the present invention. For example, the number of memory blocks is not restricted to two. It is possible to use four or eight memory blocks. Moreover, the semiconductor memory can be used not only in a flash memory, but also in other nonvolatile semiconductor memories and random access memories, such as an EPROM, EEPROM, and mask ROM.

As described above, the present invention can be applied to a semiconductor memory, such as a flash memory, a memory device achieving compatibility with a non-defective semiconductor memory by combining semiconductor memories, such as flash memories, with semiconductor memories having irremediable local defects, and a memory card using the memory device, and they can be applied to memory circuits of computer systems of various sizes.

What is claimed is:

1. A semiconductor memory comprising:
   a plurality of memory blocks having a plurality of memory cells;
   a data input/output buffer for receiving data written in the memory blocks from an external unit and for outputting data read out of the memory blocks to an external unit;

control means for controlling the rewriting and reading of data for the memory cells;

storage means for designating defective memory blocks included in said plurality memory blocks; and detection means for detecting the defective memory blocks designated by said storage means in accordance with a received address signal; wherein said control means inhibits a data rewrite operation for an instruction for a data rewrite operation when said detection means detects an access to a defective memory block and inhibits a data output operation of said data input/output buffer for an instruction for a data read operation.

2. A memory device comprising a plurality of semiconductor memories as defined in claim 1, wherein the semiconductor memories are provided in a relation in which one memory is substituted for a defective memory block of another, and external terminals having the same function are connected in common in each semiconductor memory.

3. A semiconductor memory comprising:

a plurality of memory blocks having a plurality of electrically erasable memory cells;

a data input/output buffer for receiving data written in the memory blocks from an external unit and for outputting data read out of the memory blocks to an external unit;

first control means for controlling the rewriting and reading of data for the memory cells;

first storage means for designating defective memory blocks included in said plurality of memory blocks; and detection means for detecting the defective memory blocks designated by the first storage means in accordance with a received address signal; wherein the first control means generates a status signal representing the completion of a data rewrite operation for an instruction for a data rewrite operation in such a way that the status can be output to an external unit irrespective of the completion of the data rewrite operation when the detection means detects an access to a defective memory block and inhibits a data output operation of said data input/output buffer for an instruction for a data read operation.

4. The semiconductor memory according to claim 2, further including logic means for selectively inverting inputs to be output to a path for supplying address information to said detection means in order to detect an access to a defective memory block designated by the first storage means, and second storage means for holding control information for determining the propriety of the input inverting operation by said logic means.

5. A memory device comprising a plurality of semiconductor memories as defined in claim 3, wherein the semiconductor memories are provided in a relation in which one memory is substituted for a defective memory block of another, and external terminals having the same function are connected in common in each semiconductor memory.

6. A memory card constituted by mounting a plurality of memory devices as defined in claim 5 on a card substrate, wherein each memory device is provided with an external data input/output terminal, a chip selection terminal, and an address input terminal as external terminals, and the chip selection terminal is connected to chip selection signal wirings different from each other on a card substrate in each memory device in which the external data input/output terminals are connected to the data wiring of the card substrate in common and external address input terminals of each memory device are connected to the address signal wiring of the card substrate in common.

7. The memory card according to claim 6, further comprising a card controller having one end which is interfaced with the outside of the card substrate and another end which is connected to the data wiring, chip selection wiring, and address signal wiring, and the card controller includes decoding means for decoding part of address information supplied from an external unit to generate the chip selection signal.

8. A semiconductor memory comprising:

a plurality of memory blocks having a plurality of electrically erasable memory cells;

a data input/output buffer for receiving data written in the memory blocks from an external unit and for outputting data read out of the memory blocks to an external unit;

control means for controlling the rewriting and reading of data for the memory cells;

storage means for designating some defective memory blocks included in said plurality of memory blocks; and detection means for detecting the defective memory blocks designated by said storage means in accordance with an address signal; wherein said control means inhibits a data rewrite operation for an instruction for a data rewrite operation when said detection means detects an access to a defective memory block, generates a status signal representing the completion of a data rewrite operation in such a way that the status can be output to an external unit, and inhibits a data output operation of said data input/output buffer for an instruction for a data read operation.

9. A semiconductor memory comprising:

a plurality of memory blocks having a plurality of memory cells;

a data input/output buffer for receiving data written in the memory blocks from an external unit and for outputting data read out of the memory blocks to an external unit;

control means for controlling the rewriting and reading of data for the memory cells; and storage means which designates defective memory blocks included in said plurality of memory blocks; wherein said control means inhibits a data rewrite operation for an instruction for a data rewrite operation for defective memory blocks designated by said storage means and inhibits a data output operation of said data input/output buffer for an instruction for a data read operation.

10. A semiconductor memory comprising:

a plurality of electrically erasable memory cells forming two memory blocks, one of which is designated by the least significant bit of an address signal;

a data input/output buffer for receiving data written in the memory blocks from an external unit and for outputting data read out of the memory blocks to an external unit;

control means for controlling the rewriting and reading of data for the memory cells;

storage means for designating one of the two memory blocks; and detection means for detecting an access to a defective memory block designated by said storage means in accordance with the least significant bit of an address signal; wherein said control means generates a status signal representing the completion of a data rewrite operation for an instruction for a data rewrite operation in such a way that the status can be output to an external unit irrespective of the completion of the data rewrite operation when said detection means detects an access to a defective memory block and inhibits a data output operation of said data input/output buffer for an instruction for a data read operation.

11. A semiconductor memory comprising:

a plurality of electrically erasable memory cells forming two memory blocks, one of which is designated by the most significant bit of an address signal;

a data input/output buffer for receiving data written in the memory blocks from an external unit and for outputting data read out of the memory blocks to an external unit;

control means for controlling the rewriting and reading of data for the memory cells;

storage means for designating one of the two memory blocks; and detection means for detecting an access to a defective memory block designated by said storage means in accordance with the most significant bit of an address signal; wherein said control means inhibits a data rewrite operation for an instruction for a data rewrite operation and generates a status signal representing the completion of the data rewrite operation when said detection means detects an access to a defective memory block and inhibits a data output operation of said data input/output buffer for an instruction for a data read operation.

* * * * *